(12) United States Patent
Watanabe et al.

(10) Patent No.: US 11,744,144 B2
(45) Date of Patent: Aug. 29, 2023

(54) ORGANIC ELECTROLUMINESCENT ELEMENT, LIGHT-EMITTING MATERIAL THEREFOR, LIGHT EMITTING DEVICE, DISPLAY DEVICE, AND ILLUMINATION DEVICE

(71) Applicant: UDC IRELAND LIMITED, Dublin (IE)

(72) Inventors: Toru Watanabe, Kanagawa (JP); Yuki Hirai, Kanagawa (JP); Tianhua Ouyang, Kanagawa (JP); Koji Takaku, Kanagawa (JP); Wataru Sotoyama, Kanagawa (JP); Tetsu Kitamura, Kanagawa (JP); Yasunori Yonekuta, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 446 days.

(21) Appl. No.: 16/403,800

(22) Filed: May 6, 2019

(65) Prior Publication Data

US 2019/0259955 A1   Aug. 22, 2019

Related U.S. Application Data

(63) Continuation of application No. 14/349,938, filed as application No. PCT/IB2012/001973 on Oct. 5, 2012, now abandoned.

(30) Foreign Application Priority Data

Oct. 7, 2011 (JP) ................................ 2011-223097

(51) Int. Cl.
*H10K 85/60* (2023.01)
*C09B 3/78* (2006.01)
(Continued)

(52) U.S. Cl.
CPC ............ *H10K 85/624* (2023.02); *C09B 3/78* (2013.01); *C09B 57/001* (2013.01);
(Continued)

(58) Field of Classification Search
CPC ....... C09B 57/001; C09B 3/78; C09B 57/008; C09K 11/06; C09K 2211/1007;
(Continued)

(56) References Cited

U.S. PATENT DOCUMENTS

2003/0118866 A1  6/2003 Oh
2004/0076853 A1  4/2004 Jarikov
(Continued)

FOREIGN PATENT DOCUMENTS

EP       1816114        8/2007
JP    2005082702 A      3/2005
(Continued)

OTHER PUBLICATIONS

Figueira-Duarte et al., Chemical Reviews, (2011), vol. 111, pp. 7260-7314. (Year: 2011).*
(Continued)

*Primary Examiner* — Dawn L Garrett
(74) *Attorney, Agent, or Firm* — Riverside Law LLP

(57) ABSTRACT

An organic electroluminescent element including a luminescent compound represented by the following formula (in which $R^1$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and 8 to 13 groups out of $R^1$ to $R^{14}$ each represent a hydrogen atom or a deuterium atom) in a light emitting layer has high durability and excellent chromaticity.

(Continued)

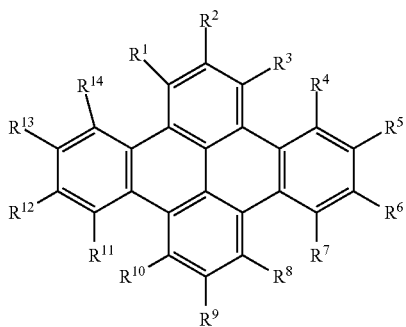

16 Claims, 1 Drawing Sheet

(51) Int. Cl.
- C09B 57/00 (2006.01)
- C09K 11/06 (2006.01)
- H05B 33/10 (2006.01)
- H10K 59/00 (2023.01)
- H10K 50/11 (2023.01)
- H10K 101/10 (2023.01)

(52) U.S. Cl.
CPC ............ *C09B 57/008* (2013.01); *C09K 11/06* (2013.01); *H05B 33/10* (2013.01); *H10K 59/00* (2023.02); *H10K 85/60* (2023.02); *H10K 85/633* (2023.02); *H10K 85/653* (2023.02); *H10K 85/654* (2023.02); *H10K 85/6572* (2023.02); *H10K 85/6574* (2023.02); *H10K 85/6576* (2023.02); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *C09K 2211/1088* (2013.01); *C09K 2211/1092* (2013.01); *H10K 50/11* (2023.02); *H10K 2101/10* (2023.02)

(58) Field of Classification Search
CPC .... C09K 2211/1011; C09K 2211/1014; C09K 2211/1029; C09K 2211/1044; C09K 2211/1059; C09K 2211/1088; C09K 2211/1092; H01L 27/32; H01L 51/005; H01L 51/0056; H01L 51/006; H01L 51/0065; H01L 51/0067; H01L 51/0072; H01L 51/0073; H01L 51/0074; H01L 51/5012; H01L 51/5016; H10K 85/624; H10K 59/00; H10K 85/60; H10K 85/633; H10K 85/653; H10K 85/654; H10K 85/6572; H10K 85/6574; H10K 85/6576; H10K 50/11; H10K 2101/10; H05B 33/10
See application file for complete search history.

(56) References Cited

U.S. PATENT DOCUMENTS

2006/0269781 A1* 11/2006 Lai ................. C07C 211/61
                                                    428/690
2009/0326150 A1    12/2009 Kang

FOREIGN PATENT DOCUMENTS

JP  2008124094 A   5/2008
WO  2012107163 A1  8/2012

OTHER PUBLICATIONS

Lee et al., Thin Solid Films, 520, (2011), pp. 95-100. (Year: 2011).*
Sato et al., Bulletin of the Chemical Society of Japan, vol. 44, (1971), pp. 2484-2490. (Year: 1971).*
Sivamurugan, V., & Valiyaveettil, S. (2007). Synthesis and Characterisation of Carbazole Containing Unsymmetrical Benzoperylenes. Polymer Preprints, 48(2), 64-65. (Year: 2007).*
Sivamurugan, V., Balaji, G., & Suresh, V. (2008). Interaction of Carbazole Substituted Unsymmetrical Coronene Oligomers With Perylene Bisimide Molecules. Polymer Preprints, 49(2), 628. (Year: 2008).*
Angewandte Chem. Int. Ed. (2004), vol. 43(40), p. 5331-5335.
Machine translation for JP 2008-124094 A (publication date May 2008).

* cited by examiner

ORGANIC ELECTROLUMINESCENT ELEMENT, LIGHT-EMITTING MATERIAL THEREFOR, LIGHT EMITTING DEVICE, DISPLAY DEVICE, AND ILLUMINATION DEVICE

CROSS-REFERENCE TO RELATED APPLICATIONS

This application is a continuation of, and claims priority to, U.S. patent application Ser. No. 14/349,938, filed on Aug. 1, 2014, which is a U.S. National Phase Application of International Patent Application No. PCT/IB2012/001973, filed Oct. 5, 2012, which claims the benefit of Japanese Patent Application No. 2011-223097, filed Oct. 7, 2011, the contents of all of which are incorporated herein by reference in their entireties.

TECHNICAL FIELD

The present invention relates to an organic electroluminescent element and a light emitting material for an organic electroluminescent element for use in the element. The present invention further relates to a light emitting device, a display device, or an illumination device each using the organic electroluminescent element.

BACKGROUND ART

Since organic electroluminescent elements (which may hereinafter also be referred to as "elements" or "organic EL elements") are capable of high-luminance light emitting with driving at a low voltage, they have been actively researched and developed. The organic electroluminescent elements have organic layers between a pair of electrodes, and utilize, for light emitting, energy of the exciton generated as a result of recombination of electrons injected from a cathode and holes injected from an anode in the organic layer. Since the organic electroluminescent elements are capable of being provided as an element having various light emitting wavelengths, have a high response speed, and are relatively thin and light-weight, it is expected that the element can be employed in a wide range of applications. Above all, it is important to develop an organic electroluminescent element having high blue color purity and luminous efficiency in applications with full-color displays, and the like, and the outcomes of various research and development studies up to now have been reported.

For example, PTL 1 describes a blue fluorescent light emitting material having a diaminopyrene skeleton containing two substituted or unsubstituted amino groups, and also describes that an organic electroluminescent device having excellent blue color purity and luminous efficiency can be provided. However, a compound having an extended π conjugation system of a pyrene skeleton has substantially not been investigated in the prior art and PTL 1 has neither disclosure nor suggestion of extension of the π conjugation system of a pyrene skeleton.

Meanwhile, PTL 2 discloses an organic electro luminescent element having a strong luminous intensity and high durability, using a material having two fused rings formed in a tetracene skeleton, and the literature describes a dibenzopyrene skeleton as an example of the skeleton. However, the same literature does not substantially mention a dibenzopyrene skeleton, and has neither disclosure nor suggestion of specific exemplary compounds having dibenzopyrene skeletons.

PTL 3 describes the use of a compound of a dibenzopyrene skeleton (liquid crystal material) as a host material in a light emitting layer of a phosphorescent organic electroluminescent element, and further describes that an organic electroluminescent element having high luminance and high efficiency is obtained. However, the same literature only describes the use of the compound as a host material of a light emitting layer, and has neither disclosure nor suggestion of the use of a compound having a dibenzopyrene skeleton as a light emitting material in a light emitting layer.

On the other hand, in some instances, compounds having dibenzopyrene skeletons are used in other fields, and for example, PTL 4 describes an organic transistor including a compound having a dibenzopyrene skeleton (dibenzotetracene skeleton). However, the same literature does not mention the presence or absence of luminous function, the luminous intensity, or the chromaticity when a compound having a dibenzopyrene skeleton is used in an organic electroluminescent element.

CITATION LIST

Patent Literature

[PTL 1] JP-A-2004-204238
[PTL 2] JP-A-05-2143334
[PTL 3] JP-A-2005-82702
[PTL 4] JP-A-2008-124094

SUMMARY OF INVENTION

Technical Problem

However, according to the investigation conducted by the present inventors, it could be seen that the blue fluorescent light emitting material having a diaminopyrene skeleton described in PTL 1 has a peak wavelength for light emission on the long wave side and is not satisfactory in the blue color purity. Although an unsubstituted dibenzopyrene is described as an exemplary compound in PTL 2, it could also be seen that the compound has strong association, leading to associative light emission and thus poor chromaticity, and therefore, it is inappropriate as a light emitting material. It could be seen that the compound having a dibenzopyrene skeleton (liquid crystal material) described in PTL 3 has poor heat resistance as the compound, and when the compound is used as a light emitting material of an organic electroluminescent element, it has low luminous efficiency.

The present invention aims to solve the foregoing problems. It is an object of the present invention to provide a light emitting material for an organic electroluminescent element, having high heat resistance and excellent chromaticity, and an organic electroluminescent element having high luminous efficiency and excellent chromaticity, using the light emitting material.

Solution to Problem

Therefore, the present inventors have conducted intensive investigations for the purpose of providing a light emitting material for an organic electroluminescent element, having high heat resistance and excellent chromaticity, and an organic electroluminescent element having high luminous efficiency and excellent chromaticity, using the light emitting material. As a result, they have found that the above-described problems can be solved by using a compound having a specific structure, thereby providing the present invention as described below.

[1] An organic electroluminescent element including a substrate, a pair of electrodes including an anode and a cathode, disposed on the substrate, and at least one organic layer including a light emitting layer, disposed between the electrodes, in which the light emitting layer contains a luminescent compound represented by the following general formula (1).

[Chem. 1]

General Formula (1)

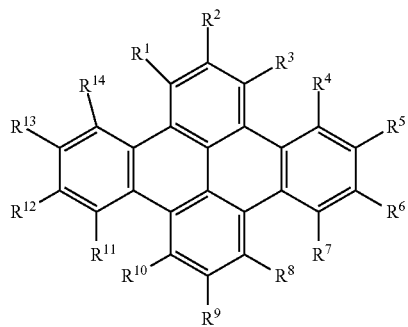

(In the formula, $R^1$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. However, 8 to 13 groups out of $R^1$ to $R^{14}$ each represent a hydrogen atom or a deuterium atom.)

[2] In the organic electroluminescent element as described in [1], at least one of $R^1$ to $R^{14}$ in the general formula (1) is preferably an electron donating substituent.

[3] In the organic electroluminescent element as described in [1] or [2], at least one of $R^1$ to $R^{14}$ in the general formula (1) is preferably an amino group.

[4] In the organic electroluminescent element as described in any one of [1] to [3], the luminescent compound represented by the general formula (1) is preferably a luminescent compound represented by the following general formula (2).

[Chem. 2]

General Formula (2)

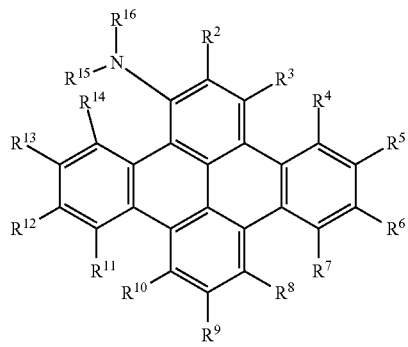

(In the formula, $R^2$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{15}$ and $R^{16}$ each independently represent an alkyl group, an aryl group, a heteroaryl group, or a hydrogen atom, and may be bonded to each other to form a ring or may be bonded to $R^2$ or $R^{14}$ to form a ring.)

[5] In the organic electroluminescent element as described in any one of [1] to [3], the luminescent compound represented by the general formula (1) is preferably a luminescent compound represented by the following general formula (3).

[Chem. 3]

General Formula (3)

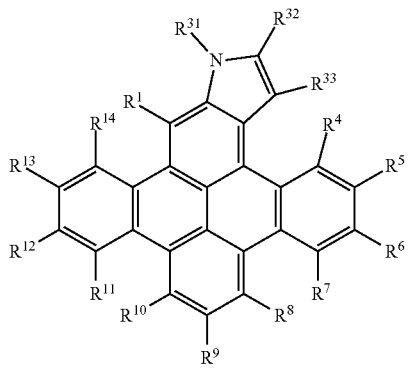

(In the formula, $R^1$ and $R^4$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{31}$ to $R^{33}$ each independently represent an alkyl group, an aryl group, a heteroaryl group, or a hydrogen atom, and $R^{32}$ and $R^{33}$ may be bonded to each other to form a ring.)

[6] In the organic electroluminescent element as described in any one of [1] to [3], the luminescent compound represented by the general formula (1) is preferably a luminescent compound represented by the following general formula (4).

[Chem. 4]

General Formula (4)

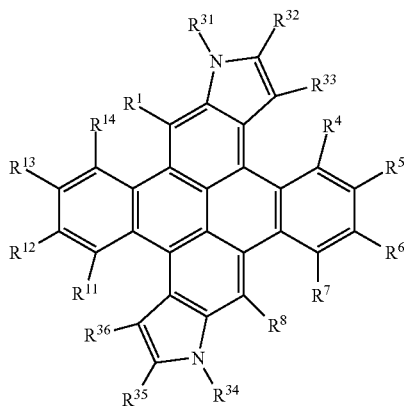

(In the formula, $R^1$, $R^4$ to $R^8$ and $R^{11}$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{31}$ to $R^{36}$ each independently represent an alkyl group, an aryl group, a heteroaryl group, or a hydrogen atom, $R^{32}$ and $R^{33}$ may be bonded to each other to form a ring, and $R^{35}$ and $R^{36}$ may be bonded to each other to form a ring.)

[7] In the organic electroluminescent element as described in any one of [1] to [3], the luminescent compound represented by the general formula (1) is preferably a luminescent compound represented by the following general formula (5).

[Chem. 5]

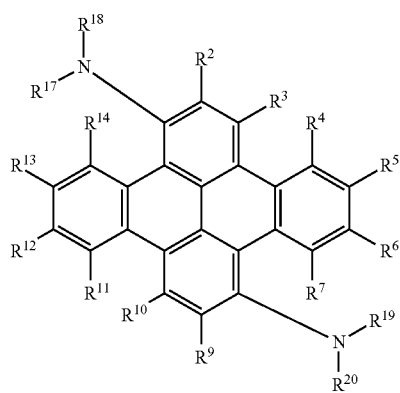

General Formula (5)

(In the formula, $R^2$ to $R^7$ and $R^9$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{17}$ to $R^{20}$ each independently represent an alkyl group, an aryl group, a heteroaryl group, or a hydrogen atom, and $R^{17}$ and $R^{19}$ may be bonded to any of $R^2$, $R^{14}$, or $R^{18}$ and any of $R^7$, $R^9$, or $R^{20}$, respectively, to form a ring.)

[8] In the organic electroluminescent element as described in any one of [1] to [3], the luminescent compound represented by the general formula (1) is preferably a luminescent compound represented by the following general formula (6).

[Chem. 6]

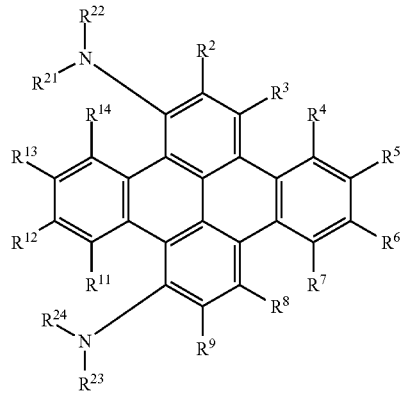

General Formula (6)

(In the formula, $R^2$ to $R^9$ and $R^{11}$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{21}$ to $R^{24}$ each independently represent alkyl group, an aryl group, a heteroaryl group, or a hydrogen atom, and $R^{21}$ and $R^{23}$ may be bonded to any of $R^2$, $R^{14}$, or $R^{22}$ and any of $R^9$, $R^{11}$, or $R^{24}$, respectively, to form a ring.)

[9] In the organic electroluminescent element as described in any one of [1] to [3], the luminescent compound represented by the general formula (1) is preferably a luminescent compound represented by the following general formula (7).

[Chem. 7]

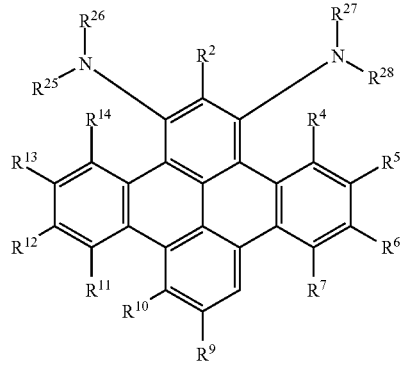

General Formula (7)

(In the formula, $R^2$ and $R^4$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{25}$ to $R^{28}$ each independently represent an alkyl group, an aryl group, a heteroaryl group, or a hydrogen atom, and $R^{25}$ and $R^{27}$ may be bonded to any of $R^2$, $R^{14}$, or $R^{26}$ and any of $R^2$, $R^4$, or $R^{28}$, respectively, to form a ring.)

[10] In the organic electroluminescent element as described in any one of [1] to [9], the light emitting layer preferably contains an anthracene-based host material.

[11] In the organic electroluminescent element as described in any one of [1] to [10], the light emitting layer is preferably formed by a vacuum deposition process.

[12] In the organic electroluminescent element as described in any one of [1] to [10], the light emitting layer is preferably formed by a wet process.

[13] A light emitting device using the organic electroluminescent element as described in any one of [1] to [12].

[14] A display device using the organic electroluminescent element as described in any one of [1] to [12].

[15] An illumination device using the organic electroluminescent element as described in any one of [1] to [12].

[16] A light emitting material for an organic electroluminescent element, represented by the following general formula (1).

[Chem. 8]

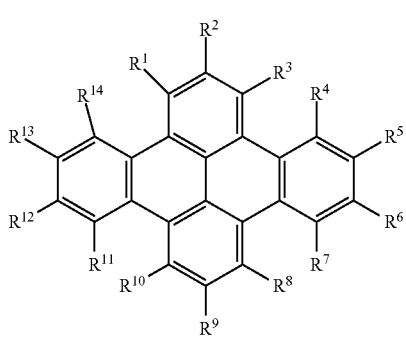

General Formula (1)

(In the formula, $R^1$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. However, 8 to 13 groups out of $R^1$ to $R^{14}$ each represent a hydrogen atom or a deuterium atom.)

Advantageous Effects of Invention

The organic electroluminescent element of the present invention has high luminous efficiency and excellent chromaticity. Further, the light emitting material for an organic electroluminescent element of the present invention has high heat resistance and excellent chromaticity, and accordingly, such an excellent organic electroluminescent element can be easily prepared. Further, the light emitting device, the display device, and the illumination device of the present invention have advantageous effects in that the power consumption is low and the blue color purity is excellent.

DESCRIPTION OF EMBODIMENTS

Figure 1:
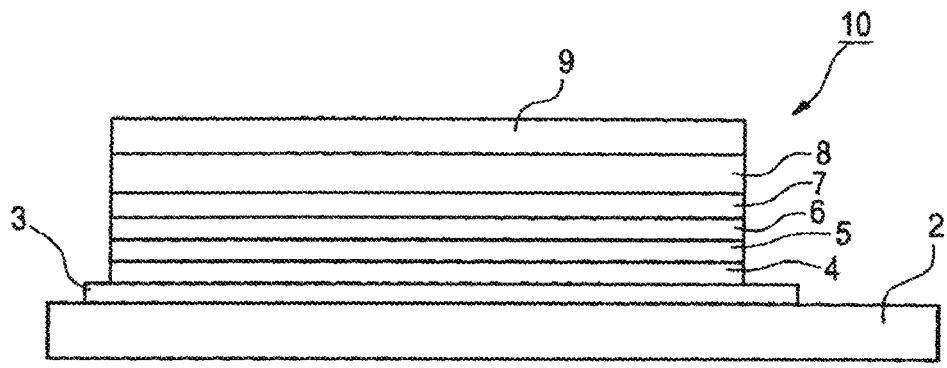
FIG. 1 is a schematic view showing one example of a configuration of an organic electroluminescent element according to the present invention.

Hereinafter, the disclosure of the present invention will be described in detail. The description of the requirements of the configuration as described below is based on representative embodiments and specific examples of the present invention, but the present invention is not limited to these embodiments and specific examples. Incidentally, in the present specification, the numerical value range expressed with "to" means a range including the numerical values before and after "to" as the lower limit and the upper limit, respectively.

[Organic Electroluminescent Element and Light Emitting Material for Organic Electroluminescent Element, Represented by General Formula (1)]

The light emitting material for an organic electroluminescent element of the present invention may be represented by the following general formula (1).

Furthermore, the organic electroluminescent element of the present invention includes a substrate, a pair of electrodes including an anode and a cathode, disposed on the substrate, and at least one organic layer including a light emitting layer, disposed between the electrodes, in which the light emitting layer contains a luminescent compound represented by the following general formula (1).

[Chem. 9]

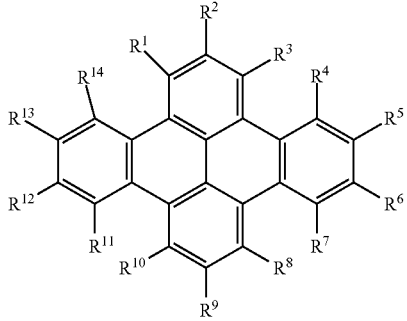

General Formula (1)

(In the formula, $R^1$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. However, 8 to 13 groups out of $R^1$ to $R^{14}$ each represent a hydrogen atom or a deuterium atom.)

That is, the organic electroluminescent element of the present invention may contain the light emitting material for an organic electroluminescent element of the present invention, which may be represented by the general formula (1), as a luminescent compound in the light emitting layer.

Hereinafter, other configurations of the luminescent compound represented by the general formula (1), which is the light emitting material for an organic electroluminescent element of the present invention, and the organic electroluminescent element of the present invention will be described in detail.

In the present invention, the hydrogen atom which is used without particular distinction at each occurrence in the description of the respective general formulae also includes isotopes (a deuterium atom and the like), and the atoms additionally constituting the substituent are also intended to include isotopes of the atoms.

In the present invention, the "substituent" at each occurrence may be further substituted with a substituent. For example, the "alkyl group" at each occurrence in the present invention includes an alkyl group substituted with a fluorine atom (for example, a trifluoromethyl group), an alkyl group substituted with an aryl group (for example, a triphenylmethyl group), and the like, but "an alkyl group having 1 to 6 carbon atoms" represents one having 1 to 6 carbon atoms, as any group also including substituted groups thereof.

The organic electroluminescent element of the present invention is excellent in terms of luminous efficiency and color purity when the light emitting layer contains the luminescent compound represented by the general formula (1). The organic electroluminescent element of the present invention can have good blue color purity, as compared with the diaminopyrene compound described in JP-A-2004-204238, by shortening the light emitting wavelength. Particularly, the luminescent compound represented by the general formula (1) has a skeleton having an extended benzo-fused ring with respect to a pyrene skeleton, and thus despite its extended conjugation π plane, it is an unexpected effect that the light emitting wavelength is shortened and the blue color purity is improved. In this regard, the present invention has the inventive step with respect to JP-A-2004-204238. The reason therefor is thought to be that the fused ring structure is extended in the direction perpendicular to a transition bipolar moment with respect to the pyrene skeleton and the donating property of an amino group is reduced by twisting a substituent on the amino group.

On the other hand, the reason why the luminous spectrum is sharpened and the blue color purity is thus improved in the luminescent compound represented by the general formula (1) is not clear, but it is presumed to be that the change in the structures is small in the case of transition from a ground state to an excited state in a central skeleton, and when an electron donating group is used as a substituent, the central skeleton serves as an electron receiving group, thereby forming a donor and acceptor structure, and accordingly, the change in the structures in the excited state becomes smaller.

In the general formula (1), 8 to 13 groups out of $R^1$ to $R^{14}$ each represent a hydrogen atom or a deuterium atom.

In the general formula (1), if the hydrogen atom in $R^1$ to $R^{14}$ is at least the lower limit of the range, the heat resistance of the luminescent compound represented by the general formula (1) is improved, and thus, the luminous efficiency of the element in the case of using the compound as a light emitting material in the light emitting layer of the organic electroluminescent element is increased. Not wishing to be restricted to any theory, the reason therefor is presumed that the compound 35 used in Examples of JP-A-2005-82702 (corresponding to a compound having 6 hydrogen atoms in $R^1$ to $R^{14}$ in the general formula (1)) exhibits a liquid crystal property, and accordingly, it has a lowered melting point and the molecular motion increases, and thus, the thermal decomposition temperature becomes lowered.

On the other hand, the number of hydrogen atoms in $R^1$ to $R^{14}$ in the general formula (1) is no more than the above range, the chromaticity of the luminescent compound represented by the general formula (1) is improved, and thus, when the compound is used as a light emitting material in the light emitting layer of the organic electroluminescent element, the chromaticity of the element is increased. Not wishing to be restricted to any theory, it is thought that as compared with an unsubstituted dibenzopyrene described in JP-A-05-214334, the association among the dibenzopyrene rings is inhibited by incorporating a specific substituent and the excimer light emission is thus inhibited, thereby obtaining these effects.

In the general formula (1), it is preferable that 10 to 12 groups of $R^1$ to $R^{14}$ each represent a hydrogen atom or a deuterium atom, and it is more preferable that 10 groups of $R^1$ to $R^{14}$ each represent a hydrogen atom or a deuterium atom. Further, in the case where $R^1$ to $R^{14}$ each represent a hydrogen atom or a deuterium atom, a hydrogen atom is preferable to a deuterium atom.

In the general formula (1), $R^1$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring.

It is preferable that each substituent other than the hydrogen atom and the deuterium atom represented by $R^1$ to $R^{14}$ be specifically the following Substituent Group a.

<<Substituent Group a>>

An alkyl group (preferably having 1 to 30 carbon atoms, more preferably having 1 to 20 carbon atoms, and particularly preferably having 1 to 10 carbon atoms; for example, methyl, ethyl, isopropyl, t-butyl, n-octyl, n-decyl, n-hexadecyl, cyclopropyl, cyclopentyl, and cyclohexyl), an aryl group (preferably having 6 to 30 carbon atoms, more preferably having 6 to 20 carbon atoms, and particularly preferably having 6 to 12 carbon atoms; for example, phenyl, p-methylphenyl, naphthyl, and anthranyl), an amino group (the amino group may have a substituent, and the total number of carbon atoms of the amino group including the substituent is preferably from 0 to 30, more preferably from 0 to 20, and particularly preferably from 0 to 10; the amino group is, for example, amino, methylamino, dimethylamino, diethylamino, dibenzylamino, diphenylamino, and ditolylamino), an alkoxy group (preferably having 1 to 30 carbon atoms, more preferably having 1 to 20 carbon atoms, and particularly preferably having 1 to 10 carbon atoms; for example, methoxy, ethoxy, butoxy, and 2-ethylhexyloxy), and aryloxy group (preferably having 6 to 30 carbon atoms, more preferably having 6 to 20 carbon atoms, and particularly preferably having 6 to 12 carbon atoms; for example, phenyloxy, 1-naphthyloxy, and 2-naphthyloxy), an alkylthio group (preferably having 1 to 30 carbon atoms, more preferably having 1 to 20 carbon atoms, and particularly preferably having 1 to 12 carbon atoms; for example, methylthio and ethylthio), an arylthio group (preferably having 6 to 30 carbon atoms, more preferably having 6 to 20 carbon atoms, and particularly preferably having 6 to 12 carbon atoms; for example, phenylthio), a heterocyclic thio group (preferably having 1 to 30 carbon atoms, more preferably having 1 to 20 carbon atoms, and particularly preferably having 1 to 12 carbon atoms; for example, pyridylthio, 2-benzoimizolylthio, 2-benzoxazolylthio, and 2-benzothiazolylthio), a heterocyclic group (inclusive of an aromatic heterocyclic group, which preferably has 1 to 30 carbon atoms, and more preferably 1 to 12 carbon atoms and in which examples of the hetero atom include a nitrogen atom, an oxygen atom, a sulfur atom, a phosphorus atom, a silicon atom, a selenium atom, and a tellurium atom; and specific examples thereof include pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzoimidazolyl, benzothiazolyl, a carbazolyl group, an azepinyl group, and a silolyl group), and a silyl group (the silyl group may have a substituent, and the total number of carbon atoms of the silyl group including the substituent is preferably from 3 to 40, more preferably from 3 to 30, and particularly preferably from 3 to 24; the silyl group is, for example, trimethylsilyl, triphenylsilyl, and phenyldimethylsilyl). These substituents may be further substituted, and examples of the additional substituent include the groups selected from the Substituent Group A as described below. Further, the substituent substituted with a substituent may be further substituted, and examples of the additional substituent include the groups selected from the Substituent Group A as described below. In addition, the substituent substituted with the substituent which has been substituted with a substituent may be further substituted, and examples of the additional substituent include the groups selected from the Substituent Group A as described below.

<<Substituent Group A>>

An alkyl group (preferably having 1 to 30 carbon atoms, more preferably having 1 to 20 carbon atoms, and particularly preferably having 1 to 10 carbon atoms; for example, methyl, ethyl, isopropyl, t-butyl, n-octyl, n-decyl, n-hexadecyl, cyclopropyl, cyclopentyl, and cyclohexyl), an alkenyl group (preferably having 2 to 30 carbon atoms, more preferably having 2 to 20 carbon atoms, and particularly preferably having 2 to 10 carbon atoms; for example, vinyl, allyl, 2-butenyl, and 3-pentenyl), an alkynyl group (preferably having 2 to 30 carbon atoms, more preferably having 2 to 20 carbon atoms, and particularly preferably having 2 to 10 carbon atoms; for example, propargyl and 3-pentynyl), an aryl group (preferably having 6 to 30 carbon atoms, more preferably having 6 to 20 carbon atoms, and particularly preferably having 6 to 12 carbon atoms; for example, phenyl, p-methylphenyl, naphthyl, and anthranyl), an amino group (the amino group may have a substituent, and the total number of carbon atoms of the amino group including the substituent is preferably from 0 to 30, more preferably from 0 to 20, and particularly preferably from 0 to 10; the amino group is, for example, amino, methylamino, dimethylamino, diethylamino, dibenzylamino, diphenylamino, and ditolylamino), an alkoxy group (preferably having 1 to 30 carbon atoms, more preferably having 1 to 20 carbon atoms, and particularly preferably having 1 to 10 carbon atoms; for example, methoxy, ethoxy, butoxy, and 2-ethylhexyloxy), and aryloxy group (preferably having 6 to 30 carbon atoms, more preferably having 6 to 20 carbon atoms, and particularly preferably having 6 to 12 carbon atoms; for example, phenyloxy, 1-naphthyloxy, and 2-naphthyloxy), a heterocyclic oxy group (preferably having 1 to 30 carbon atoms, more preferably having 1 to 20 carbon atoms, and particularly preferably having 1 to carbon atoms; for example, pyridyloxy, pyrazyloxy, pyrimidyloxy, and quinolyloxy), an acyl group (preferably having 2 to 30 carbon atoms, more preferably having 2 to 20 carbon atoms, and particularly preferably having 2 to 12 carbon atoms; for example, acetyl, benzoyl, formyl, and pivaloyl), an alkoxycarbonyl group (preferably having 2 to 30 carbon atoms, more preferably having 2 to 20 carbon atoms, and particularly preferably having 2 to 12 carbon atoms; for example, methoxycarbonyl and ethoxycarbonyl), an aryloxycarbonyl group (preferably having 7 to 30 carbon atoms, more preferably having 7 to 20 carbon atoms, and particularly preferably having 7 to 12 carbon atoms; for example, phenyloxycarbonyl), an acyloxy group (preferably having 2 to 30 carbon atoms, more preferably having 2 to 20 carbon atoms, and particularly preferably having 2 to 10 carbon atoms; for example, acetoxy and benzoyloxy), an acylamino group (preferably having 2 to 30 carbon atoms, more preferably having 2 to 20 carbon atoms, and particularly preferably having 2 to 10 carbon atoms; for example, acetylamino and benzoylamino), an alkoxycarbonylamino group (preferably having 2 to 30 carbon atoms, more preferably having 2 to 20 carbon atoms, and particularly preferably having 2 to carbon atoms; for example, methoxycarbonylamino), an aryloxycarbonylamino group (preferably having 7 to 30 carbon atoms, more preferably having 7 to 20 carbon atoms, and particularly preferably having 7 to 12 carbon atoms; for example, phenyloxycarbonylamino), a sulfonylamino group (preferably having 1 to 30 carbon atoms, more preferably having 1 to 20 carbon atoms, and particularly preferably having 1 to carbon atoms; for example, methanesulfonylamino and benzenesulfonylamino), a sulfamoyl group (preferably having 0 to 30 carbon atoms, more preferably having 0 to 20 carbon atoms, and particularly preferably having 0 to 12 carbon atoms; for example, sulfamoyl, methylsulfamoyl, dimethylsulfamoyl, and phenylsulfamoyl), a carbamoyl group (preferably having 1 to 30 carbon atoms, more preferably having 1 to 20 carbon atoms, and particularly preferably having 1 to 12 carbon atoms; for example, carbamoyl, methylcarbamoyl, diethylcarbamoyl, and phenylcarbamoyl), an alkylthio group (preferably having 1 to 30 carbon atoms, more preferably having 1 to 20 carbon atoms, and particularly preferably having 1 to 12 carbon atoms; for example, methylthio and ethylthio), an arylthio group (preferably having 6 to 30 carbon atoms, more preferably having 6 to 20 carbon atoms, and particularly preferably having 6 to 12 carbon atoms; for example, phenylthio), a heterocyclic thio group (preferably having 1 to 30 carbon atoms, more preferably having 1 to 20 carbon atoms, and particularly preferably having to 12 carbon atoms; for example, pyridylthio, 2-benzoimizolylthio, 2-benzoxazolylthio, and 2-benzothiazolylthio), a sulfonyl group (preferably having 1 to 30 carbon atoms, more preferably having 1 to 20 carbon atoms, and particularly preferably having 1 to 12 carbon atoms; for example, mesyl and tosyl), a sulfinyl group (preferably having 1 to 30 carbon atoms, more preferably having 1 to 20 carbon atoms, and particularly preferably having 1 to 12 carbon atoms; for example, methanesulfinyl and benzenesulfinyl), a ureido group (preferably having 1 to 30 carbon atoms, more preferably having 1 to 20 carbon atoms, and particularly preferably having 1 to 12 carbon atoms; for example, ureido, methylureido, and phenylureido), a phosphoramide group (preferably having 1 to 30 carbon atoms, more preferably having 1 to 20 carbon atoms, and particularly preferably having 1 to 12 carbon atoms; for example, diethyl phosphoramide and phenyl phosphoramide), a hydroxyl group, a mercapto group, a halogen atom (for example, a fluorine atom, a chlorine atom, a bromine atom, and an iodine atom), a cyano group, a sulfo group, a carboxyl group, a nitro group, a hydroxamic group, a sulfino group, a hydrazino group, an imino group, a heterocyclic group (inclusive of an aromatic heterocyclic group, which preferably has 1 to 30 carbon atoms, and more preferably 1 to 12 carbon atoms and in which examples of the hetero atom include a nitrogen atom, an oxygen atom, a sulfur atom, a phosphorus atom, a silicon atom, a selenium atom, and a tellurium atom; and specific examples thereof include pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzoimidazolyl, benzothiazolyl, a carbazolyl group, an azepinyl group, and a silolyl group), a silyl group (the silyl group may have a substituent, and the total number of carbon atoms of the silyl group including the substituent is preferably from 3 to 40, more preferably from 3 to 30, and particularly preferably from 3 to 24; the silyl group is, for example, trimethylsilyl, triphenylsilyl, and phenyldimethylsilyl), a silyloxy group (preferably having 3 to 40 carbon atoms, more preferably having 3 to 30 carbon atoms, and particularly preferably having 3 to 24 carbon atoms; for example, trimethylsilyloxy and triphenylsilyloxy), and a phosphoryl group (for example, a diphenylphosphoryl group and a dimethylphosphoryl group).

$R^1$ to $R^{14}$ are each independently preferably a hydrogen atom, a deuterium atom, an alkyl group, an aryl group, a heteroaryl group, a fluorine atom, a cyano group, an amino group, an alkoxy group, an aryloxy group, or a thio group, more preferably a hydrogen atom, an alkyl group, an aryl group, an amino group, or an alkoxy group, and particularly preferably a hydrogen atom, an alkyl group, an aryl group, or an amino group.

For $R^1$ to $R^{14}$, adjacent substituents may be bonded to each other to form a ring, and in the case of forming a ring, they preferably form an aliphatic ring or a non-aromatic hetero ring, and more preferably form a non-aromatic nitrogen atom-containing hetero ring.

For the organic electroluminescent element of the present invention, it is preferable that at least one of $R^1$ to $R^{14}$ in the general formula (1) be an electron donating substituent. Here, in the present specification, the electron donating substituent refers to a "substituent having $\sigma_p$ denoting a negative value in the Hammett's law".

Examples of the electron donating substituent include an amino group, an alkoxy group, an aryloxy group, an alkylthio group, and an arylthio group, and above all, an amino group, an alkoxy group, and an aryloxy group are preferable. For the organic electroluminescent element of the present invention, it is particularly preferable that at least one of $R^1$ to $R^{14}$ in the general formula (1) be an amino group.

The position of the electron donating substituent is preferably at least one of $R^1$ to $R^3$ and $R^8$ to $R^{10}$ in the general formula (1). Above all, in the case where the position of the electron donating substituent is at least one of $R^2$ and $R^9$ in the general formula (1), when $R^2$ has the electron donating substituent, $R^2$ is preferably fused with $R^1$ or $R^3$ to form a ring, and when $R^9$ has the electron donating substituent, $R^9$ is preferably fused with $R^8$ or $R^{10}$ to form a ring.

Further, the position of the electron donating substituent is more preferably at least one of $R^1$, $R^3$, $R^8$ and $R^{10}$ in the general formula (1).

By incorporating the electron donating substituent in such a position, the wavelength of the luminescent compound represented by the general formula (1) can be shortened, thereby increasing the blue color purity.

For the organic electroluminescent element of the present invention, the luminescent compound represented by the general formula (1) is preferably the luminescent compound represented by the general formula (2) or the luminescent compound represented by the general formula (3).

First, a case where the luminescent compound represented by the general formula (1) is the luminescent compound represented by the general formula (2) will be described.

[Chem. 10]

General Formula (2)

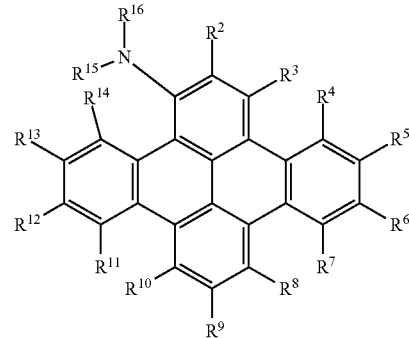

(In the formula, $R^2$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{15}$ and $R^{16}$ each independently represent an alkyl group, an aryl group, a heteroaryl group, or a hydrogen atom, and may be bonded to each other to form a ring or may be bonded to $R^2$ or $R^{14}$ to form a ring.)

In the general formula (2), $R^2$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. The preferred ranges of $R^2$ to $R^{14}$ in the general formula (2) are the same as the preferred ranges of $R^2$ to $R^{14}$ in the general formula (1).

In the general formula (2), $R^{15}$ and $R^{16}$ each independently represent an alkyl group, an aryl group, a heteroaryl group, or a hydrogen atom, and may be bonded to each other to form a ring or may be bonded to $R^2$ or $R^{14}$ to form a ring.

The preferred ranges of $R^{15}$ and $R^{16}$ are the same as in the description of the amino group in the Substituent a as described above.

In the case where $R^{15}$ and $R^{16}$ form a ring, they are preferably bonded to each other to form a ring or bonded to $R^2$ to form a ring, and they are more preferably bonded to $R^2$ to form a ring. Further, in the case where $R^{15}$ and $R^{16}$ are bonded to each other to form a ring, they preferably form a pyrrole skeleton or a carbazole skeleton.

$R^{15}$ and $R^{16}$ are more preferably a substituted or unsubstituted aryl group, and $R^{15}$ and $R^{16}$ are particularly preferably a substituted or unsubstituted phenyl group. More particularly preferred cases include a case where $R^{15}$ and $R^{16}$ are both phenyl groups having a substituent from the viewpoint of inhibition of association, or a case where any one of $R^{15}$ and $R^{16}$ are a phenyl group having a substituent and are combined with $R^2$ to be subjected to ring fusion, and further, the other is a phenyl group having a substituent.

The substituent which $R^{15}$ and $R^{16}$ further have is preferably an alkyl group or an aryl group, more preferably an alkyl group having 1 to 3 carbon atoms, or a phenyl group, particularly preferably a methyl group or an isopropyl group, and more particularly preferably a methyl group. Further, the $R^{15}$ and $R^{16}$ may have a plurality of substituents, and for example, in the case where $R^{15}$ and $R^{16}$ are phenyl groups, they are preferably ones having 1 or 2 substituents.

The luminescent compound represented by the general formula (2) is preferably one further having the electron donating substituent in at least one of $R^3$ and $R^8$ to $R^{10}$, and in more preferred aspect, the luminescent compound represented by the general formula (2) has an aryl group in $R^9$, or an amino group in at least one of $R^3$, $R^8$, and $R^{10}$.

In the case of an aspect in which the luminescent compound represented by the general formula (2) has an aryl in $R^9$, $R^9$ is preferably an aryl group having a substituent, and the substituent is more preferably an alkyl group, and particularly preferably a methyl group. Further, in this case, $R^9$ is preferably an aryl group having a plurality of the substituents, more preferably an aryl group having 1 to 3 substituents, and particularly preferably an aryl group having 2 substituents.

On the other hand, in the case of an aspect in which the luminescent compound represented by the general formula (2) has an amino group in at least one of $R^3$, $R^8$ and $R^{10}$, for the organic electroluminescent element of the present invention, the luminescent compound represented by the general formula (1) is preferably a luminescent compound represented by the following general formula (5), (6), or (7).

and $R^{18}$ are bonded to each other to form a ring, they preferably form a pyrrole skeleton or a carbazole skeleton. $R^{17}$ and $R^{18}$ are more preferably a substituted or unsubstituted aryl group, and particularly preferably a substituted or unsubstituted phenyl group. The ranges of the substituents which $R^{17}$ and $R^{18}$ further have are the same as the ranges of the substituents which $R^{15}$ and $R^{16}$ in the general formula (2) further have.

In the case where $R^{19}$ and $R^{20}$ form a ring, they are preferably bonded to each other to form a ring or bonded to $R^9$ to form a ring, and they are more preferably bonded to $R^9$ to form a ring. Further, in the case where $R^{19}$ and $R^{20}$ are bonded to each other to form a ring, they preferably form a pyrrole skeleton or a carbazole skeleton. $R^{19}$ and $R^{20}$ are more preferably a substituted or unsubstituted aryl group, and particularly preferably a substituted or unsubstituted phenyl group. The ranges of the substituents which $R^{19}$ and $R^{20}$ further have are the same as the ranges of the substituents which $R^{15}$ and $R^{16}$ in the general formula (2) further have.

[Chem. 11]

General Formula (5)

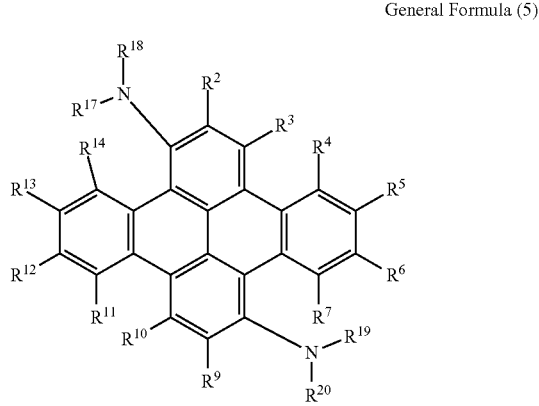

[Chem. 12]

General Formula (6)

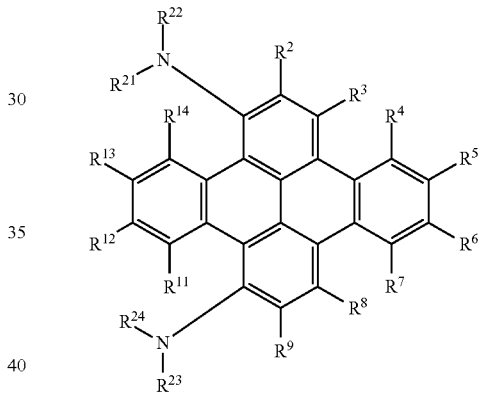

(In the formula, $R^2$ to $R^7$ and $R^9$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{17}$ to $R^{20}$ each independently represent alkyl group, an aryl group, a heteroaryl group, or a hydrogen atom, and $R^{17}$ and $R^{19}$ may be bonded to any of $R^2$, $R^{14}$, or $R^{19}$ and any of $R^7$, $R^9$, or $R^{20}$, respectively, to form a ring.)

$R^2$ to $R^7$ and $R^9$ to $R^{14}$ in the general formula (5) have the same definitions as $R^2$ to $R^7$ and $R^9$ to $R^{14}$ in the general formula (1). Above all, $R^2$ to $R^7$ and $R^9$ to $R^{14}$ in the general formula (5) are each independently preferably a hydrogen atom, a deuterium atom, an alkyl group, an aryl group, a fluorine atom, a cyano group, or an alkoxy group, more preferably a hydrogen atom, an alkyl group, or an aryl group, and particularly preferably a hydrogen atom.

$R^{17}$ to $R^{20}$ in the general formula (5) each independently represent an alkyl group, an aryl group, a heteroaryl group, or a hydrogen atom. In the case where $R^{17}$ and $R^{18}$ form a ring, they are preferably bonded to each other to form a ring or bonded to $R^2$ to form a ring, and they are more preferably bonded to $R^2$ to form a ring. Further, in the case where $R^{17}$ (In the formula, $R^2$ to $R^9$ and $R^{11}$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{21}$ to $R^{24}$ each independently represent alkyl group, an aryl group, a heteroaryl group, or a hydrogen atom, and $R^{21}$ and $R^{23}$ may be bonded to any of $R^2$, $R^{14}$, or $R^{22}$ and any of $R^9$, $R^{11}$, or $R^{24}$, respectively, to form a ring.)

$R^2$ to $R^9$ and $R^{11}$ to $R^{14}$ in the general formula (6) have the same definitions as $R^2$ to $R^9$ and $R^{11}$ to $R^{14}$ in the general formula (1). Above all, $R^2$ to $R^9$ and $R^{11}$ to $R^{14}$ in the general formula (6) are each independently preferably a hydrogen atom, a deuterium atom, an alkyl group, an aryl group, a fluorine atom, a cyano group, or an alkoxy group, and more preferably a hydrogen atom or an alkyl group.

$R^{21}$ to $R^{24}$ in the general formula (6) each independently represent an alkyl group, an aryl group, a heteroaryl group, or a hydrogen atom. Preferably, $R^{21}$ and $R^{22}$ do not form a ring. $R^{21}$ and $R^{22}$ are more preferably a substituted or unsubstituted aryl group, and particularly preferably a substituted or unsubstituted phenyl group. The ranges of the substituents which $R^{21}$ and $R^{22}$ further have are the same as the ranges of the substituents which $R^{15}$ and $R^{16}$ in the general formula (2) further have In the case where $R^{23}$ and $R^{24}$ form a ring, they are preferably bonded to each other to form a ring or bonded to $R^9$ to form a ring, and they are more preferably bonded to $R^9$ to form a ring. Further, in the case where $R^{23}$ and $R^{24}$ are bonded to each other to form a ring, they preferably form a pyrrole skeleton or a carbazole skeleton. $R^{23}$ and $R^{24}$ are more preferably a substituted or unsubstituted aryl group, and particularly preferably a substituted or unsubstituted phenyl group. The ranges of the substituents which $R^{23}$ and $R^{24}$ further have are the same as the ranges of the substituents which $R^{15}$ and $R^{16}$ in the general formula (2) further have.

[Chem. 13]

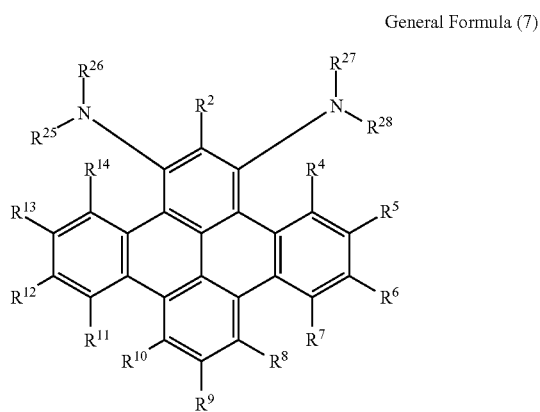

General Formula (7)

(In the formula, $R^2$ and $R^4$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{25}$ to $R^{28}$ each independently represent an alkyl group, an aryl group, a heteroaryl group, or a hydrogen atom, and $R^{25}$ and $R^{27}$ may be bonded to any of $R^2$, $R^{14}$, or $R^{26}$ and any of $R^2$, $R^4$ or $R^{28}$, respectively, to form a ring.)

$R^2$ and $R^4$ to $R^{14}$ in the general formula (7) have the same definitions as $R^2$ and $R^4$ to $R^{14}$ in the general formula (1). Above all, $R^2$ and $R^4$ to $R^{14}$ in the general formula (7) are each independently preferably a hydrogen atom, a deuterium atom, an alkyl group, an aryl group, a fluorine atom, a cyano group, or an alkoxy group, and more preferably a hydrogen atom or an aryl group.

$R^{25}$ to $R^{28}$ in the general formula (7) each independently represent an alkyl group, an aryl group, a heteroaryl group, or a hydrogen atom. Preferably, $R^{25}$ and $R^{26}$ do not form a ring. $R^{25}$ and $R^{26}$ are more preferably a substituted or unsubstituted aryl group, and particularly preferably a substituted or unsubstituted phenyl group. In a more particularly preferable case, $R^{25}$ and $R^{26}$ are both substituted phenyl groups. The ranges of the substituents which $R^{25}$ and $R^{26}$ further have are the same as the ranges of the substituents which $R^{15}$ and $R^{16}$ in the general formula (2) further have.

Preferably, $R^{27}$ and $R^{28}$ do not form a ring. $R^{27}$ and $R^{28}$ are more preferably a substituted or unsubstituted aryl group, and particularly preferably a substituted or unsubstituted phenyl group. A more particularly preferred case is a case where $R^{23}$ and $R^{24}$ are both substituted phenyl groups. The ranges of the substituents which $R^{27}$ and $R^{28}$ further have are the same as the ranges of the substituents which $R^{15}$ and $R^{16}$ in the general formula (2) further have.

Among the luminescent compounds represented by the general formulae (5) to (7), the luminescent compound represented by the general formula (5) or (7) is more preferred, and the compound represented by the general formula (5) is particularly preferred.

Next, a case where the luminescent compound represented by the general formula (1) is the luminescent compound represented by the general formula (3) will be described.

[Chem. 14]

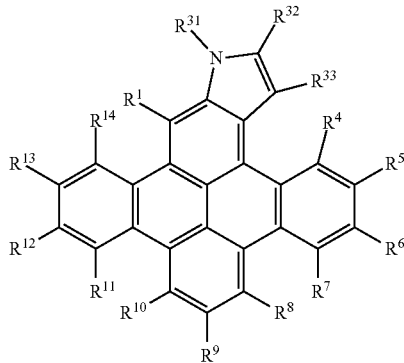

General Formula (3)

(In the formula, $R^1$ and $R^4$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{31}$ to $R^{33}$ each independently represent an alkyl group, an aryl group, a heteroaryl group, or a hydrogen atom, and $R^{32}$ and $R^{33}$ may be bonded to each other to form a ring.)

$R^1$ and $R^4$ to $R^{14}$ in the general formula (3) have the same definitions as $R^1$ and $R^4$ to $R^{14}$ in the general formula (1). Above all, $R^1$ and $R^4$ to $R^{14}$ in the general formula (3) are each independently preferably a hydrogen atom, a deuterium atom, an alkyl group, an aryl group, a fluorine atom, a cyano group, an amino group, or an alkoxy group, more preferably a hydrogen atom, an alkyl group, an aryl group, or an amino group, and particularly preferably a hydrogen atom or one having an amino group.

In the general formula (3), $R^{31}$ to $R^{33}$ each independently represent an alkyl group, an aryl group, a heteroaryl group, or a hydrogen atom, and $R^{32}$ and $R^{33}$ may be bonded to each other to form a ring.

It is preferable that each substituent other than the hydrogen atom and the deuterium atom represented by $R^{31}$ be specifically the following Substituent Group b.

<<Substituent Group b>>

An alkyl group (preferably having 1 to 30 carbon atoms, more preferably having 1 to 20 carbon atoms, and particularly preferably having 1 to 10 carbon atoms; for example, methyl, ethyl, isopropyl, t-butyl, n-octyl, n-decyl, n-hexadecyl, cyclopropyl, cyclopentyl, and cyclohexyl), an aryl group (preferably having 6 to 30 carbon atoms, more preferably having 6 to 20 carbon atoms, and particularly preferably having 6 to 12 carbon atoms; for example, phenyl, p-methylphenyl, naphthyl, and anthranyl), and a heteroaryl group (preferably having 1 to 30 carbon atoms, and more preferably having 1 to 12 carbon atoms, in which examples of the hetero atom include a nitrogen atom, an oxygen atom, a sulfur atom, a phosphorus atom, a silicon atom, a selenium atom, and a tellurium atom; and specific examples thereof include pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzoimidazolyl, benzothiazolyl, a carbazolyl group, an azepinyl group, and a silolyl group). These substituents may be further substituted, and examples of the additional substituent include the groups selected from the Substituent Group B. Further, the substituent substituted with a substituent may be further substituted, and examples of the additional substituent include the groups selected from the Substituent Group B as described above. In addition, the substituent substituted with the substituent which has been substituted with a substituent may be further substituted, and examples of the additional substituent include the groups selected from the Substituent Group b as described above.

$R^{31}$ is preferably an alkyl group, a perfluoroalkyl group, an aryl group, a heteroaryl group, or a fluorine atom, and more preferably any one of a linear, branched, or cyclic alkyl group having 1 to 10 carbon atoms; an aryl group having 6 to 50 carbon atoms; and a heteroaryl group having 5 to 20 carbon atoms and containing at least any one of N, O, and S as a hetero atom. $R^{31}$ is particularly preferably an aryl group having 6 to 14 carbon atoms, and more particularly preferably a substituted phenyl group. Examples of the substituent which an aryl group having 6 to 14 carbon atoms may have include a linear or branched alkyl group having 1 to 10 carbon atoms, and preferably, for example methyl, ethyl, isopropyl, t-butyl, n-octyl, and n-decyl.

Examples of $R^{32}$ and $R^{33}$ (the substituents on carbon atoms) include the Substituent Group A.

$R^{32}$ and $R^{33}$ each independently preferably represent an alkyl group, an aryl group, a heteroaryl group, a perfluoroalkyl group, an alkoxy group, or a fluorine atom, and more preferably an alkyl group, an aryl group, and a heteroaryl group. $R^{32}$ and $R^{33}$ each independently particularly preferably represent any one of an a linear, branched, or cyclic alkyl group having 1 to 10 carbon atoms; an aryl group having 6 to 14 carbon atoms; and a heteroaryl group having 5 to 20 carbon atoms and containing at least any one of N, O, and S as a hetero atom); and more particularly preferably a linear or branched alkyl group having 1 to 6 carbon atoms. In addition, from the viewpoint of easiness of synthesis, it is preferable that $R^{32}$ and $R^{33}$ be the same substituents as each other.

$R^{32}$ and $R^{33}$ may be combined with each other to form a 5- or 6-membered ring, and the 5- or 6-membered ring thus formed may be anyone of a benzene ring, a heteroaryl ring, a cycloalkyl ring, a cycloalkenyl ring, and a hetero ring. The 5- or 6-membered ring thus formed may be any one of a cycloalkenyl ring, a benzene ring, and a heteroaryl ring. Examples of the heteroaryl ring include those containing 1 to 3 hetero atoms selected from the group consisting of a nitrogen atom, an oxygen atom, and a sulfur atom in the ring-constituting atoms. Specific examples thereof include a pyridine ring, a pyrazine ring, a pyridazine ring, a pyrimidine ring, an imidazole ring, an oxazole ring, a thiazole ring, a pyrazole ring, a thiophene ring, and a furan ring. The 5- or 6-membered ring thus formed may have a substituent, examples of the substituent on the carbon atom include the Substituent Group A, and examples of the substituent on the nitrogen atom include the Substituent Group B. The 5- or 6-membered ring thus formed is preferably a benzene ring, and more preferably an unsubstituted benzene ring.

The luminescent compound represented by the general formula (1) is preferably a luminescent compound represented by the following general formula (4) among the luminescent compounds represented by the general formula (3).

[Chem. 15]

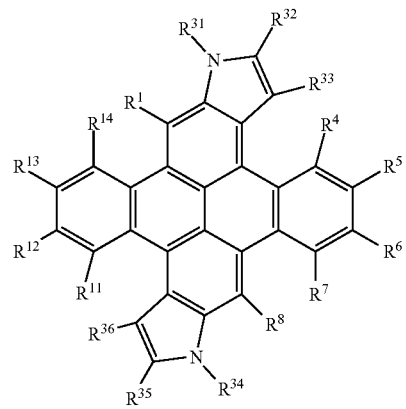

General Formula (4)

(In the formula, $R^1$, $R^4$ to $R^8$ and $R^{11}$ to $R^{14}$ each independently represent a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring. $R^{31}$ to $R^{36}$ each independently represent an alkyl group, an aryl group, a heteroaryl group, or a hydrogen atom, $R^{32}$ and $R^{33}$ may be bonded to each other to form a ring, and $R^{35}$ and $R^{36}$ may be bonded to each other to form a ring.)

$R^1$, $R^4$ to $R^8$ and $R^{11}$ to $R^{14}$ in the general formula (4) have the same definitions as $R^1$, $R^4$ to $R^8$ and $R^{11}$ to $R^{14}$ in the general formula (1). Above all, $R^1$, $R^4$ to $R^8$ and $R^{11}$ to $R^{14}$ in the general formula (4) are each independently preferably a hydrogen atom, a deuterium atom, an alkyl group, an aryl group, a fluorine atom, a cyano group, or an alkoxy group, more preferably a hydrogen atom, an alkyl group, or an aryl group, and particularly preferably a hydrogen atom.

In the general formula (4), $R^{31}$ to $R^{33}$ have the same definitions as $R^{31}$ to $R^{33}$ in the general formula (3), and the preferred ranges thereof are also the same. $R^{34}$ to $R^{36}$ each independently represent an alkyl group, an aryl group, a heteroaryl group, or a hydrogen atom, and $R^{35}$ and $R^{36}$ may be bonded to each other to form a ring.

The preferred range of $R^{34}$ is the same as the preferred range of $R^{31}$ in the general formula (3). The preferred ranges of $R^{35}$ and $R^{36}$ are the same as the preferred ranges of $R^{32}$ and $R^{33}$ in the general formula (3).

The maximum light emitting wavelength of the organic electroluminescent element using the luminescent compound represented by the general formula (1) is usually less than 455 nm, preferably 400 nm or more and less than 455 nm, more preferably 420 nm or more and less than 455 nm, still more preferably 430 nm or more and less than 455 nm, and most preferably 440 nm or more and less than 455 nm, from the viewpoint of obtaining blue light emission with high color purity.

The molecular weight of the luminescent compound represented by the general formula (1) is preferably 1000 or less, more preferably 900 or less, particularly preferably 850 or less, and still more preferably 800 or less. By reducing the molecular weight, the sublimation temperature can be lowered, and thus, it is possible to prevent the thermal decomposition of the compound by deposition. Further, the energy required for deposition can be suppressed by decreasing the deposition time. Here, since a material having a high sublimation temperature can undergo thermal decomposition during long-term deposition, it is favorable that the sublimation temperature be not too high from the viewpoint of deposition suitability. The sublimation temperature (which means a temperature which leads to reduction by 10% by mass in the present specification) of the luminescent compound represented by the general formula (1) is preferably 300° C., more preferably 285° C. or lower, and still more preferably 270° C. or lower.

Specific examples of the luminescent compound represented by the general formula (1) are shown below, but it should not be construed that the luminescent compound represented by the general formula (1) which can be used in the present invention is limited to these specific examples.

[Chem 16]

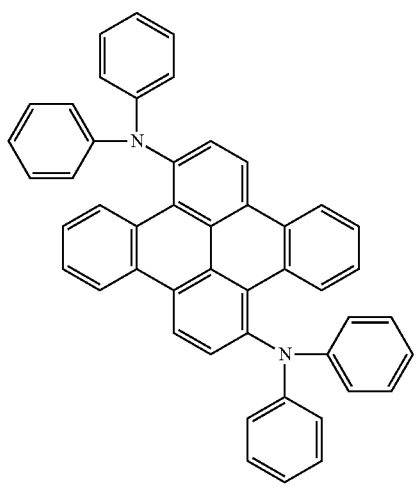

Light emitting material 1

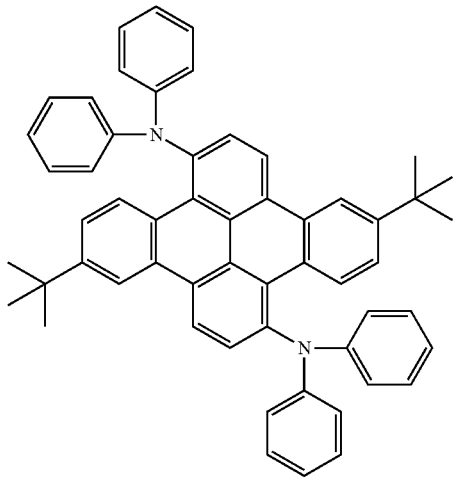

Light emitting material 2

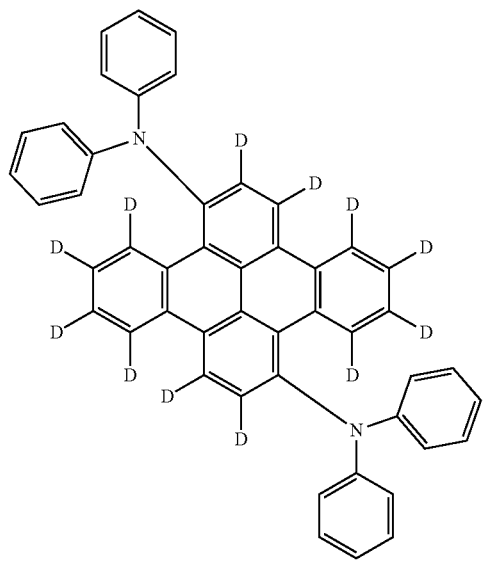

Light emitting material 3

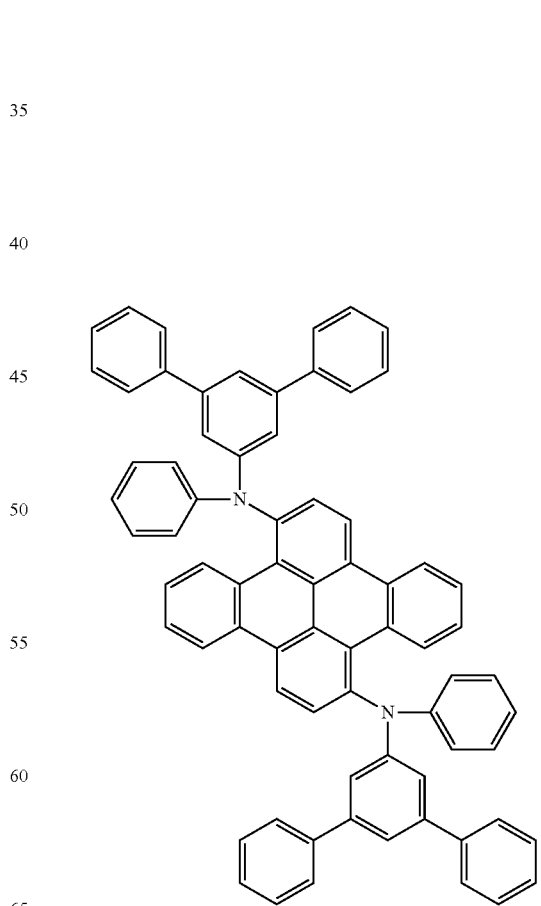

Light emitting material 4

-continued
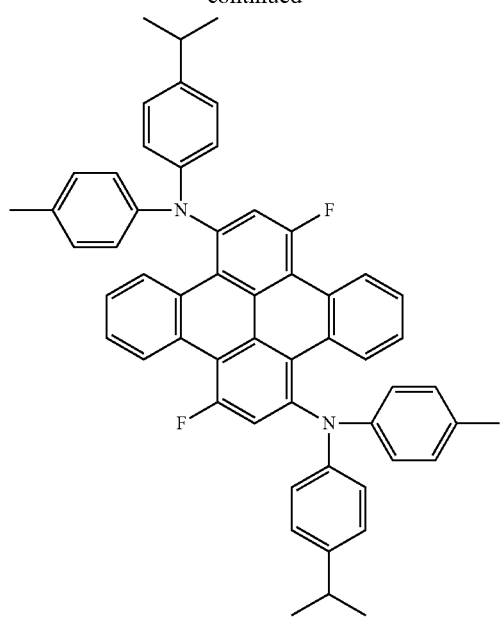
Light emitting material 5
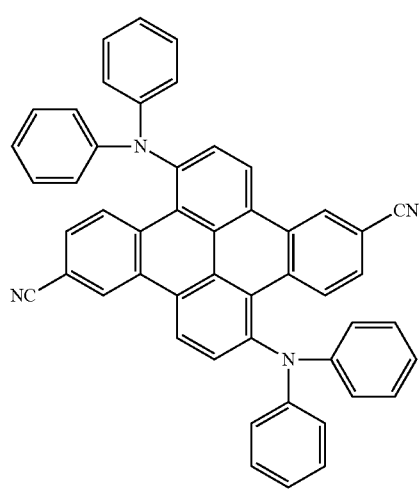
Light emitting material 6
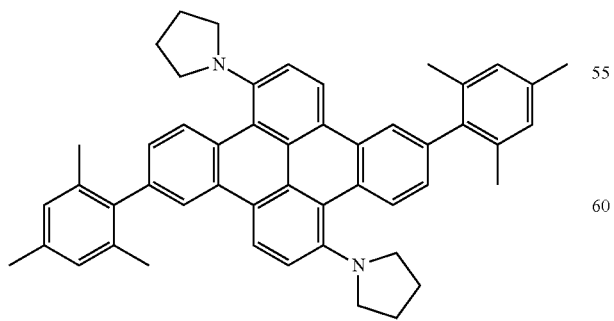
Light emitting material 7
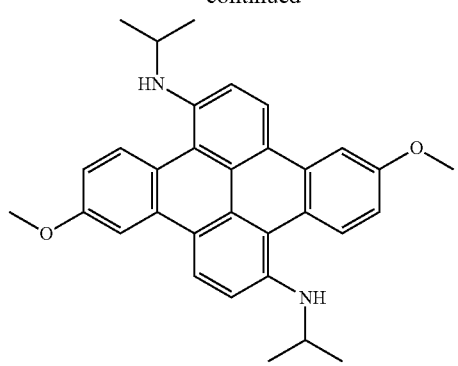
Light emitting material 8
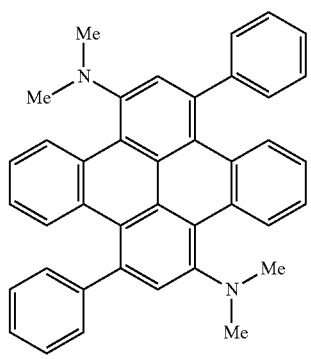
Light emitting material 9
[Chem. 17]
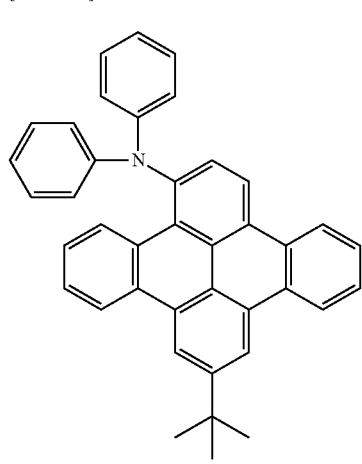
Light emitting material 10

-continued
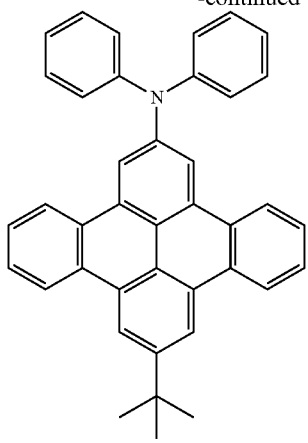
Light emitting material 11
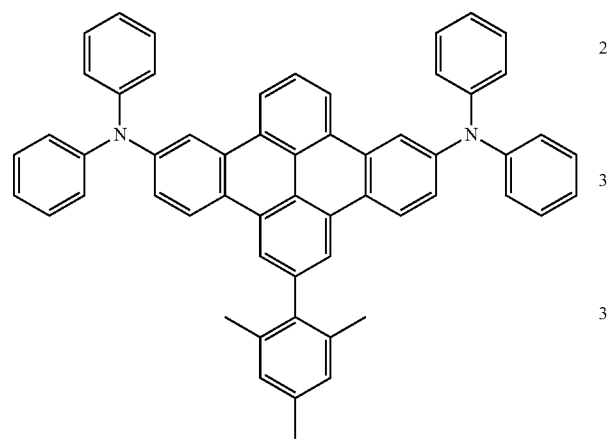
Light emitting material 12
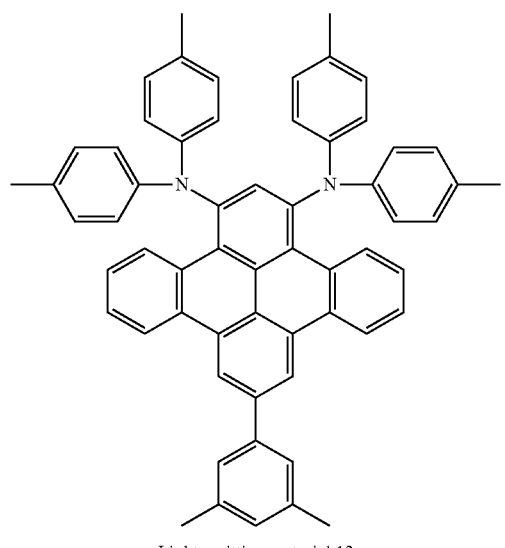
Light emitting material 13
-continued
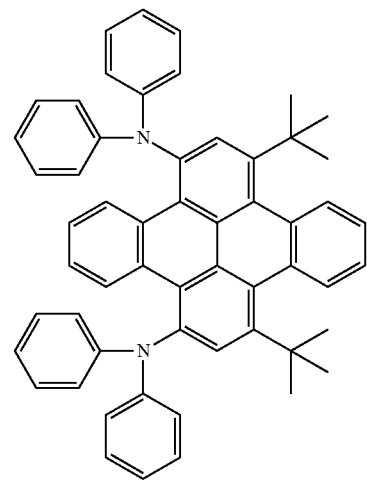
Light emitting material 14
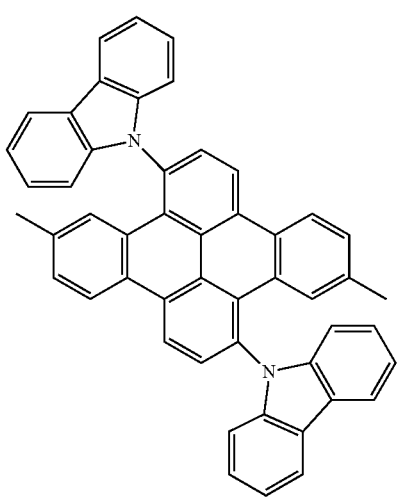
Light emitting material 15
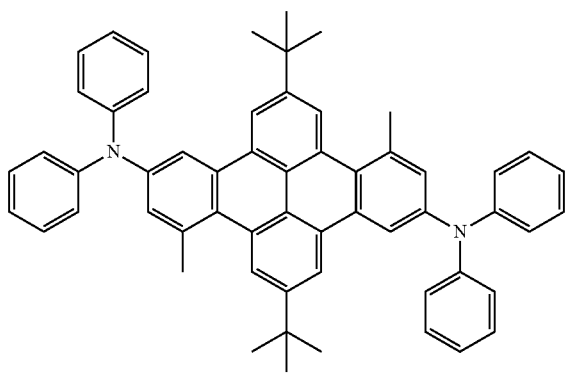
Light emitting material 16

-continued
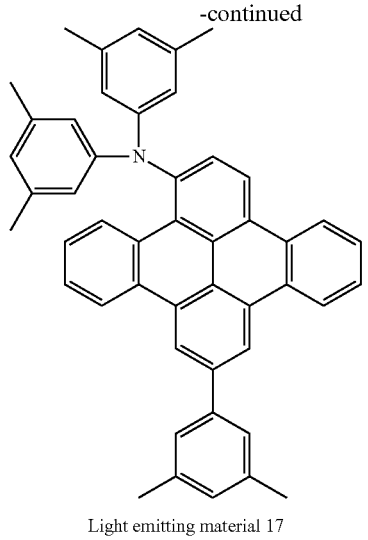
Light emitting material 17
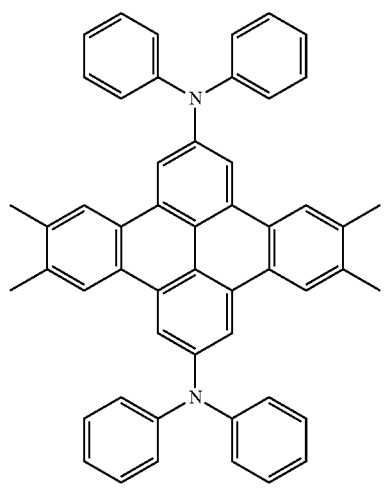
Light emitting material 18
[Chem. 18]
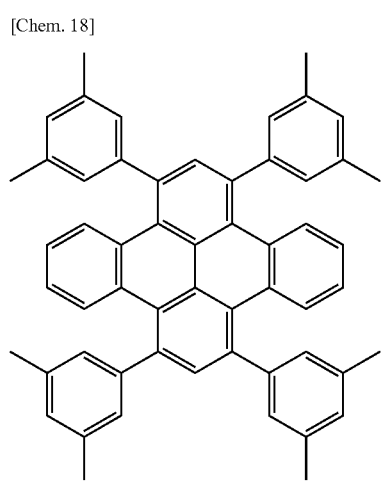
Light emitting material 19
-continued
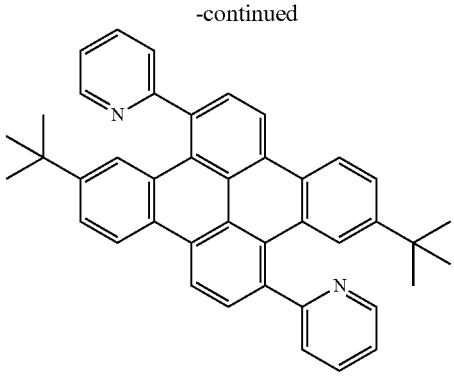
Light emitting material 20
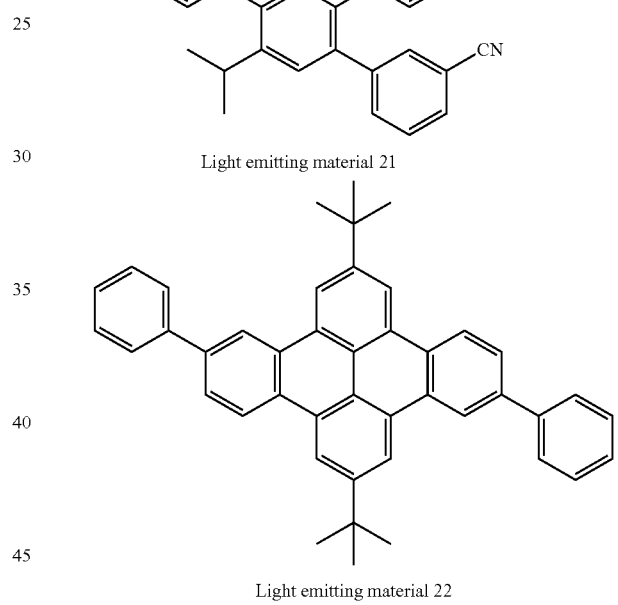
Light emitting material 21
Light emitting material 22
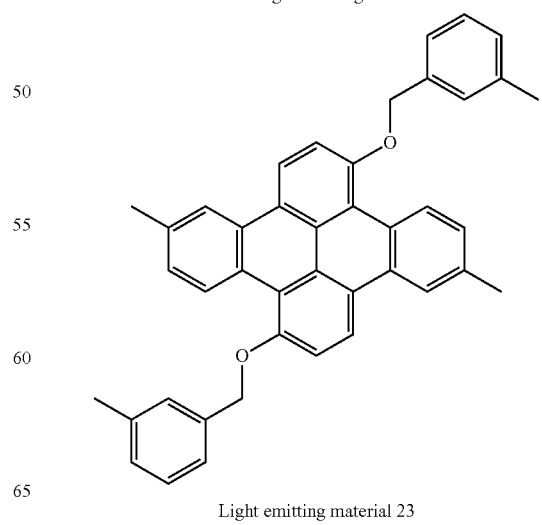
Light emitting material 23

-continued
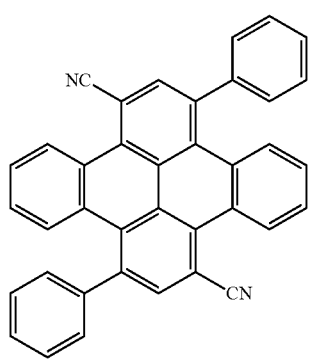
Light emitting material 24
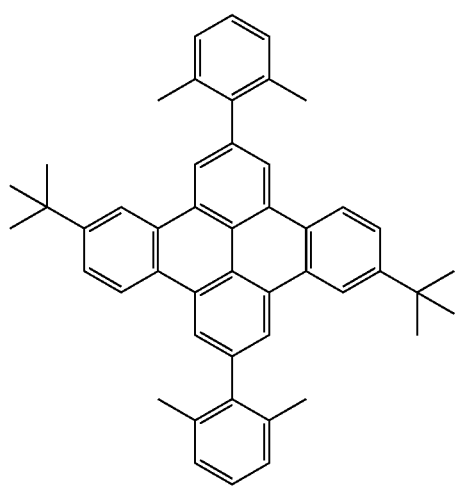
Light emitting material 25
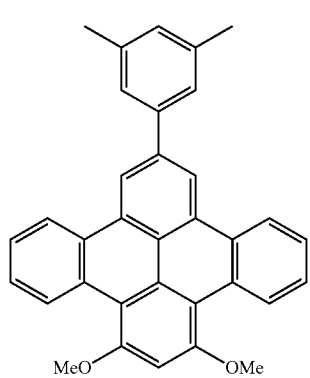
Light emitting material 26
-continued
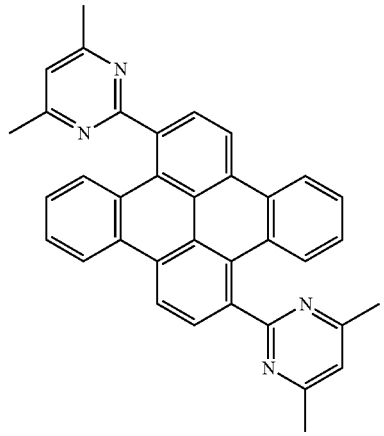
Light emitting material 27
[Chem. 19]
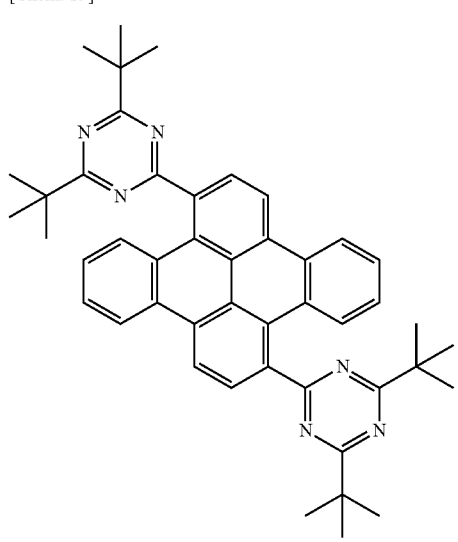
Light emitting material 28
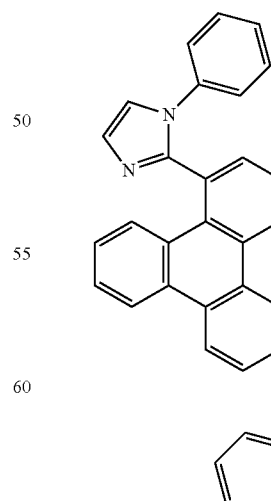
Light emitting material 29

-continued
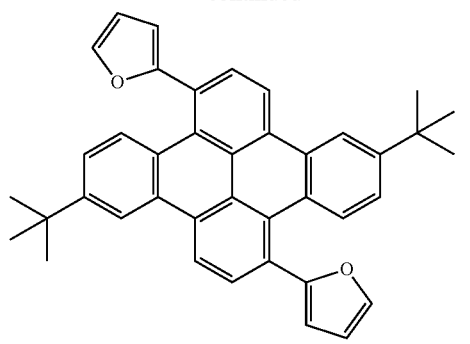
Light emitting material 30
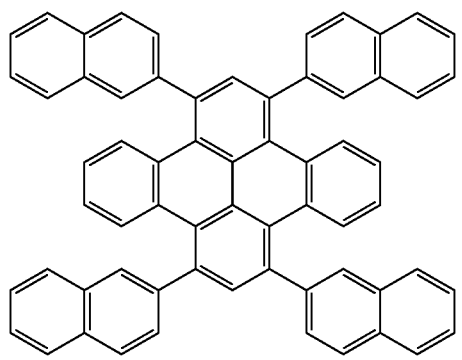
Light emitting material 31
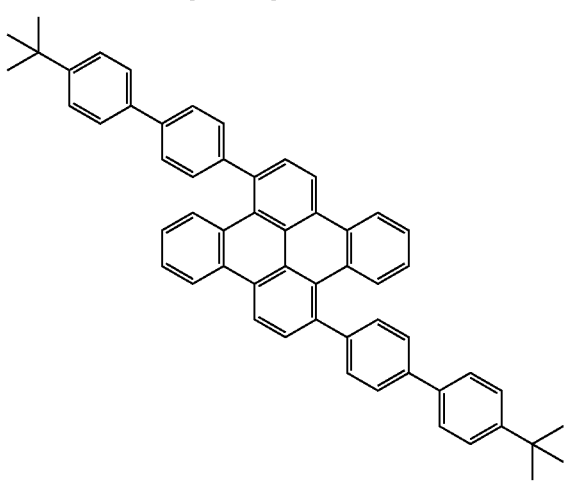
Light emitting material 32
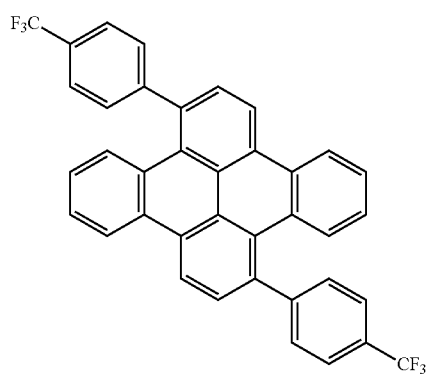
Light emitting material 33
-continued
[Chem. 20]
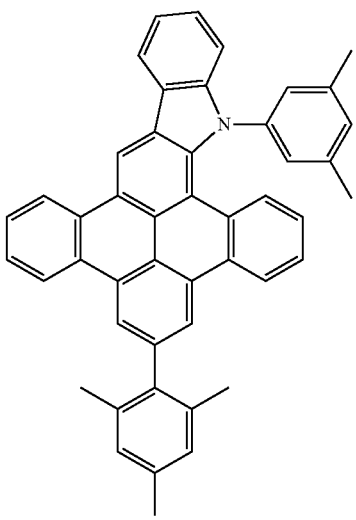
Light emitting material 34
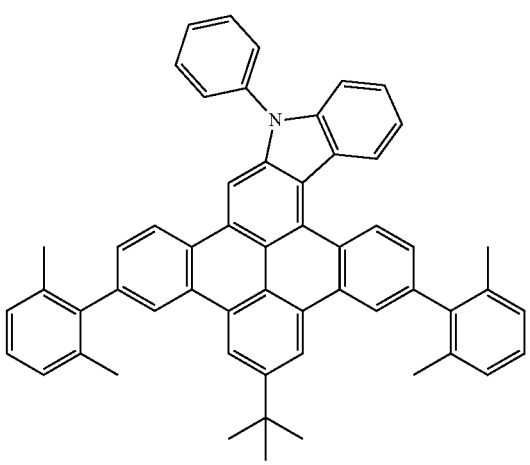
Light emitting material 35
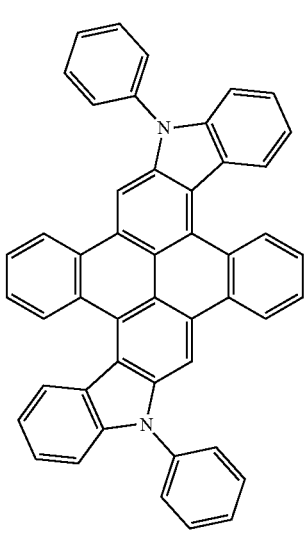
Light emitting material 36

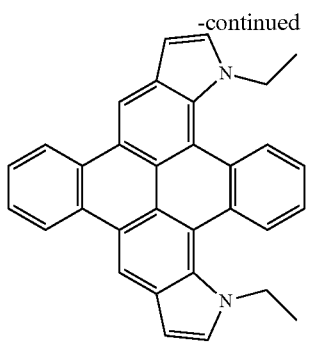

Light emitting material 37

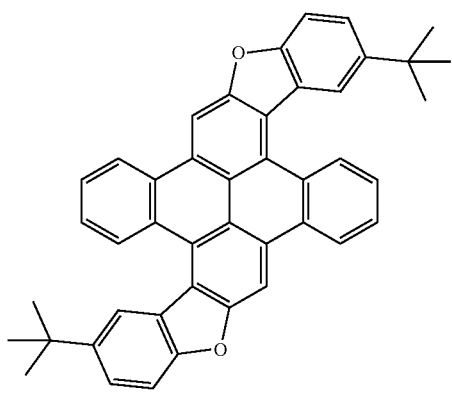

Light emitting material 38

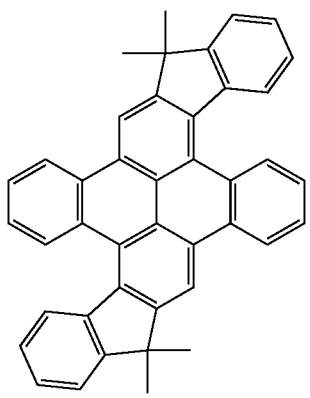

Light emitting material 39

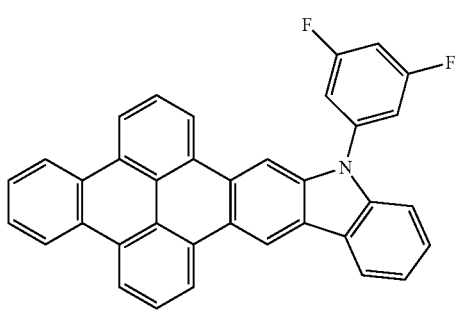

Light emitting material 40

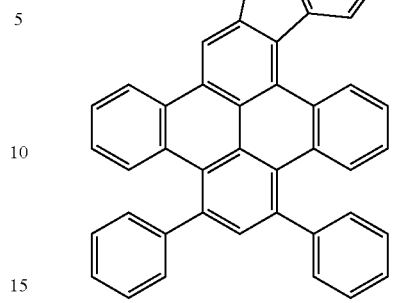

Light emitting material 41

The luminescent compound represented by the general formula (1) can be synthesized by the method described in *Org. Lett.*, 2003, 2587, or the like, or a combination of other known methods. In addition, for example, it can also be synthesized by a combination of the following schemes.

Scheme

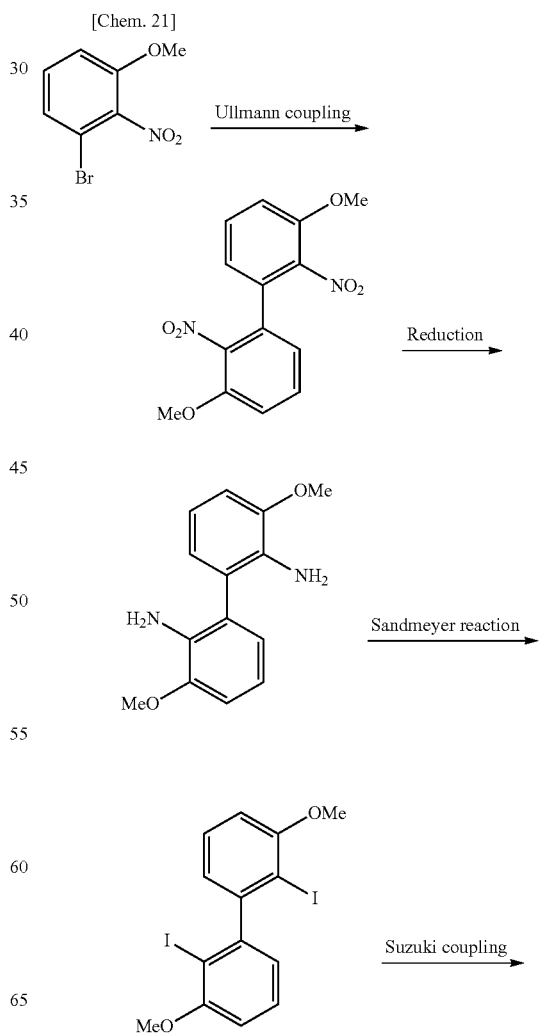

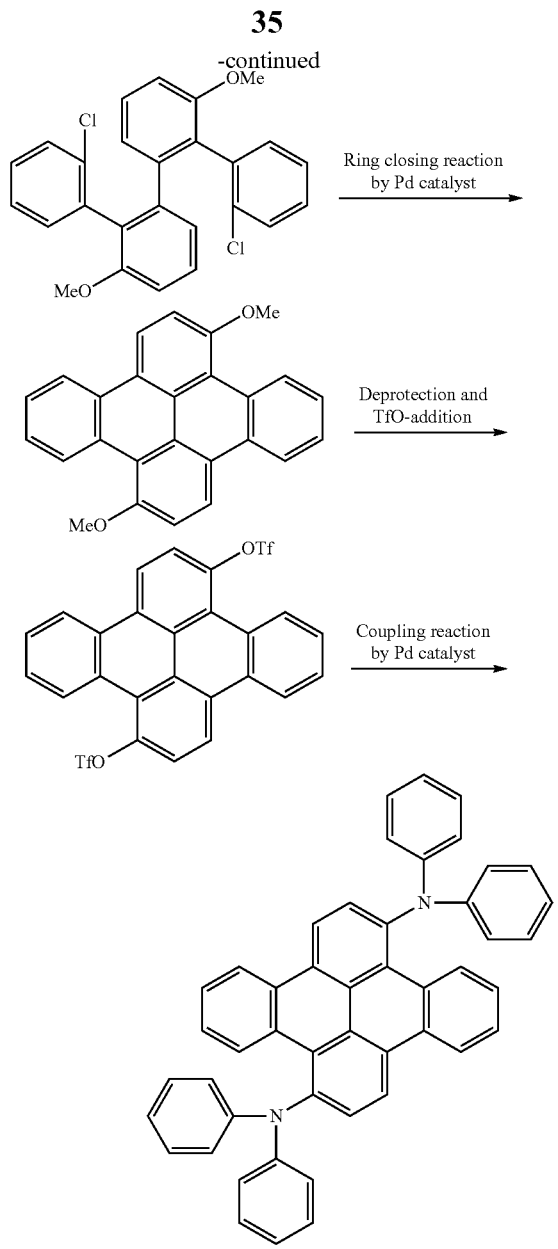

Synthesis intermediates having various substituents can be synthesized by a combination of known reactions. Further, for the reaction in each step, the synthesis can be carried out using the conditions described in, for example, Org. Synth., III, 339, (1955) for Ullmann coupling. The subsequent step for a reduction reaction can be carried out under the reaction conditions described in, for example, J. Org. Chem., 1993, 58, 1666.

For a Sandmeyer reaction, the synthesis can be carried out by the method described in, for example, J. Org. Chem., 1987, 52, 1339. For a Suzuki coupling, the synthesis can be carried out by the method described in, for example, Bioorg. Med. Chem. Lett., 2007, 17, 5233. For a ring closing reaction by a Pd catalyst, the synthesis can be carried out by the method described in, for example, J. Am. Chem. Soc., 2006, 128, 581. The subsequent deprotection and TfO-addition can be carried out under the reaction conditions described in, for example, Tetrahedron, 2001, 57, 9575. The subsequent coupling reaction by a Pd catalyst can be carried out under the reaction conditions described in, for example, J. Org. Chem., 2011, 1054. Further, each of the substituents may be introduced in any stage for the intermediate.

After the synthesis, purification is preferably carried out by column chromatography, recrystallization, or the like, and then by sublimation purification. By the sublimation purification, organic impurities can be separated and inorganic salts, residual solvents, or the like can be removed effectively.

The maximum light emitting wavelength of the light emitting material for an organic electroluminescent element, represented by general formula (1) is preferably less than 455 nm, more preferably from 400 nm to 455 nm, particularly preferably 420 nm or more and less than 455 nm, still more preferably 430 nm or more and less than 455 nm, and most preferably 440 nm or more and less than 455 nm.

[Configuration of Organic Electroluminescent Element]

The organic electroluminescent element of the present invention has a substrate, a pair of electrodes including an anode and a cathode, disposed on the substrate, and at least one organic layer including a light emitting layer, disposed between the electrodes, in which the light emitting layer contains the luminescent compound represented by the general formula (1).

The configuration of the organic electroluminescent element of the present invention is not particularly limited. FIG. 1 shows an example of the configuration of the organic electroluminescent element of the present invention. An organic electroluminescent element 10 in FIG. 1 includes organic layers between a pair of electrodes (an anode 3 and a cathode 9) on a substrate 2.

The element configuration, the substrate, the anode, and the cathode of the organic electroluminescent element are described in detail, for example, in JP-A-2008-270736, and the matters described in the patent publication can be applied to the present invention.

Hereinafter, preferred embodiments of the organic electroluminescent element of the present invention will be described in detail, in the order of the substrate, the electrode, the organic layer, the protective layer, the sealing enclosure, the driving method, the light emitting wavelength, and applications thereof.

<Substrate>

The organic electroluminescent element of the present invention has a substrate.

The substrate used in the present invention is preferably a substrate that does not scatter or attenuate light emitted from the organic layer. In the case of an organic material, those having excellent heat resistance, dimensional stability, solvent resistance, electrical insulating properties, and processability are preferred.

<Electrodes>

The organic electroluminescent element of the present invention has a pair of electrodes including an anode and a cathode, disposed on the substrate.

In view of the properties of the light emitting element, at least one electrode of a pair of electrodes, the anode and the cathode, is preferably transparent or semi-transparent.

(Anode)

The anode may be typically one having a function as an electrode of supplying holes into an organic layer, and is not particularly limited in its shape, structure, size, or the like. Further, depending on the use and purpose of the light emitting element, the anode can be suitably selected from the known electrode materials. As described above, the anode is usually provided as a transparent anode.

(Cathode)

The cathode may be typically one having a function as an electrode of injecting electrons to an organic layer, and is not particularly limited in its shape, structure, size, or the like. Further, depending on the use and purpose of the light emitting element, the cathode can be suitably selected from the known electrode materials.

<Organic Layer>

The organic electroluminescent element of the present invention includes at least one layer of the organic layer(s) including the light emitting layers disposed between the electrodes, in which the light emitting layer contains the luminescent compound represented by the general formula (1).

The organic layer is not particularly limited and can be suitably selected depending on the use and purpose of the organic electroluminescent element. However, the organic layer is preferably formed on the transparent electrode or the semi-transparent electrode. In that case, the organic layer is formed on the whole surface or one surface of the transparent electrode or the semi-transparent electrode.

The shape, the size, the thickness, and the like of the organic layer are not particularly limited and can be suitably selected depending on the purpose.

Hereinafter, the configuration of the organic layer, the method for forming an organic layer, preferred aspects of the respective layers constituting the organic layer, and the materials used in the respective layers in the organic electroluminescent element of the present invention will be described in order.

(Configuration of Organic Layers)

In the organic electroluminescent element of the present invention, the organic layer includes a light emitting layer. Furthermore, the organic layer preferably includes a charge transporting layer. The charge transporting layer refers to a layer in which charges move when voltage is applied to the organic electroluminescent element. Specifically, examples thereof include a hole injecting layer, a hole transporting layer, an electron blocking layer, a light emitting layer, a hole blocking layer, an electron transporting layer, and an electron injecting layer. When the charge transporting layer is a hole injecting layer, a hole transporting layer, an electron blocking layer, or a light emitting layer, an organic electroluminescent element can be prepared with low cost and high efficiency.

The luminescent compound represented by the general formula (1) is contained in the light emitting layers in the organic layers disposed between the electrodes of the organic electroluminescent element.

However, the luminescent compound represented by the general formula (1) may be contained in another organic layer of the organic electroluminescent element of the present invention. Examples of the organic layer other than the light emitting layer, which may contain the luminescent compound represented by the general formula (1), include a hole injecting layer, a hole transporting layer, an electron transporting layer, an electron injecting layer, an exciton blocking layer, and a charge blocking layer (a hole blocking layer, an electron blocking layer, or the like), preferably any one of an exciton blocking layer, a charge blocking layer, an electron transporting layer, and an electron injecting layer, and more preferably an exciton blocking layer, a charge blocking layer, or an electron transporting layer.

The luminescent compound represented by the general formula (1) is contained in the amount of preferably 0.1% by mass to 100% by mass, more preferably 1% by mass to 50% by mass, and still more preferably 2% by mass to 20% by mass, with respect to the total mass of the light emitting layer.

In the case where the luminescent compound represented by the general formula (1) is contained in an organic layer other than the light emitting layer, the luminescent compound represented by the general formula (1) is contained in the amount of preferably 70% by mass to 100% by mass, more preferably 80% by mass to 100% by mass, and still more preferably 90% by mass to 100% by mass, with respect to the total mass of the organic layer.

(Method for Forming Organic Layers)

Each of the organic layers in the organic electroluminescent element of the present invention can be suitably formed by any of dry type film forming methods such as a deposition method and a sputtering method, and wet type film forming methods (solution coating methods) such as a transfer method, a printing method, a spin coating method, and a bar coating method.

In the organic electroluminescent element of the present invention, the light emitting layer disposed between the pair of electrodes is preferably formed by a vacuum deposition process or a wet process. Further, the light emitting layer is more preferably formed by deposition of a composition containing the luminescent compound represented by the general formula (1) in at least one layer.

(Light Emitting Layer)

The light emitting layer is a layer having a function of, upon application of an electric field, receiving holes from the anode, the hole injecting layer, or the hole transporting layer, receiving electrons from the cathode, the electron injecting layer, or the electron transporting layer, providing a recombination site of the holes and the electrons, and causing light emitting. However, the light emitting layer in the present invention is not necessarily limited to the light emitting by such a mechanism.

The light emitting layer in the organic electroluminescent element of the present invention may be constituted of only the light emitting material, or may be constituted as a mixed layer of a host material and the light emitting material. The light emitting material may be made of one kind or two or more kinds thereof. The host material is preferably a charge transporting material. The host material may be made of one kind or two or more kinds thereof. Examples thereof include a configuration in which an electron transporting host material and a hole transporting host material are mixed. Further, the light emitting layer may include a material which does not have charge transporting properties and does not emit light.

In addition, the light emitting layer may be made of a single layer or multiple layers of two or more layers. Each of the layers may include the same light emitting material or host material, and may also include a different material in every layer. In the case where a plurality of light emitting layers are present, each of the light emitting layers may emit light in a different luminous color from each other.

The thickness of the light emitting layer is not particularly limited, but it is usually from 2 nm to 500 nm, and above all, from the viewpoint of external quantum efficiency, it is more preferably from 3 nm to 200 nm, and still more preferably from 5 nm to 100 nm.

In the organic electroluminescent element of the present invention, the light emitting layer contains the luminescent compound represented by the general formula (1), and the luminescent compound represented by the general formula (1) is used as the light emitting material of the light emitting layer. The host material used in the light emitting layer is not particularly limited. Here, in the present specification, the host material is a compound which usually plays a role in injecting or transporting charges in the light emitting layer and is also a compound which does not substantially emit light in itself. As used herein, the statement "which does not substantially emit light" means that the amount of light emission from the compound which does not substantially emit light is preferably 5° or less, more preferably 3% or less, and still more preferably 1% or less, with respect to the total amount of light emission in the whole of the element.

(Light Emitting Material)

In the organic electroluminescent element of the present invention, the luminescent compound represented by the general formula (1) is preferably used as the light emitting material, but in this case, it is possible to use the luminescent compound represented by the general formula (1) in combination with light emitting materials different from the compound. Further, in the organic electroluminescent element of the present invention, in the case where the luminescent compound represented by the general formula (1) is used as a host material of the light emitting layer or in the case where the luminescent compound represented by the general formula (1) is used in an organic layer other than the light emitting layer, a light emitting material different from the luminescent compound represented by the general formula (1) is used in the light emitting layer.

The light emitting material which can be used in the present invention may be any one of a phosphorescent light emitting material, a fluorescent light emitting material, and the like. Further, the light emitting layer in the present invention may contain two or more kinds of light emitting materials in order to improve the color purity or widen the light emitting wavelength region.

The fluorescent light emitting material and the phosphorescent light emitting material which can be used in the organic electroluminescent element of the present invention are described in detail in, for example, paragraph Nos. [0100] to [0164] of JP-A-2008-270736 and paragraph Nos. [0088] to [0090] of JP-A-2007-266458, and the detailed descriptions in these publications can be applied to the present invention.

Examples of the phosphorescent light emitting material which can be used in the present invention include phosphorescent light emitting compounds described in patent documents, for example, U.S. Pat. Nos. 6,303,238 and 6,097,147, WO00/57676, WO00/70655, WO01/08230, WO01/39234, WO01/41512, WO02/02714, WO02/15645, WO02/44189, WO05/19373, JP-A-2001-247859, JP-A-2002-302671, JP-A-2002-117978, JP-A-2003-133074, JP-A-2002-235076, JP-A-2003-123982, JP-A-2002-170684, EP1211257, JP-A-2002-226495, JP-A-2002-234894, JP-A-2001-247859, JP-A-2001-298470, JP-A-2002-173674, JP-A-2002-203678, JP-A-2002-203679, JP-A-2004-357791, JP-A-2006-256999, JP-A-2007-19462, JP-A-2007-84635, and JP-A-2007-96259. Above all, examples of the light emitting material which is more preferred include phosphorescent light emitting metal complex compounds such as Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes, and Ir complexes, Pt complexes, and Re complexes are particularly preferred. Above all, Ir complexes, Pt complexes, and Re complexes each including at least one coordination mode of a metal-carbon bond, a metal-nitrogen bond, a metal-oxygen bond, and a metal-sulfur bond are preferred. Furthermore, from the viewpoints of luminous efficiency, driving durability, chromaticity, or the like, Ir complexes and Pt complexes are particularly preferred, and Ir complexes are the most preferred.

The kind of the fluorescent light emitting material which can be used in the present invention is not particularly limited, but examples thereof include those other than the luminescent compound represented by the general formula (1), for example, benzoxazole, benzimidazole, benzothiazole, styrylbenzene, polyphenyl, diphenylbutadiene, tetraphenylbutadiene, naphthalimide, coumarin, pyrane, perinone, oxadiazole, aldazine, pyralizine, cyclopentadiene, bisstyrylanthracene, quinacridone, pyrrolopyridine, thiadiazolopyridine, cyclopentadiene, styrylamine, aromatic fused polycyclic compounds (anthracene, phenanthroline, pyrene, perylene, rubrene, pentacene, and the like), a variety of metal complexes typified by metal complexes of 8-quinolinol, pyrromethene complexes, and rare-earth complexes, polymer compounds such as polythiophene, polyphenylene, and polyphenylenevinylene, organic silanes, and derivatives thereof.

In addition, the compound described in paragraph No. [0082] of JP-A-2010-111620 can also be used as a light emitting material.

The light emitting layer in the organic electroluminescent element of the present invention may be constituted with only a light emitting material or may be constituted as a mixed layer of a host material and a light emitting material. The light emitting material may be made of one kind or two or more kinds. The host material is preferably a charge transporting material. The host material may be made of one kind or two or more kinds. Examples thereof include a configuration in which an electron transporting host material and a hole transporting host material are mixed. Further, the light emitting layer may contain a material which does not have charge transporting properties and which does not emit light.

In addition, the light emitting layer may be made of a single layer or two or more layers. Each of the layers may include the same light emitting materials or host materials, and may also include different materials from each other over layers. In the case where a plurality of light emitting layers are present, each of the light emitting layers may emit light in different luminous colors from each other.

(Host Material)

The host material is a compound that usually plays a role in injecting or transporting charges in the light emitting layer and is also a compound which does not substantially emit light in itself. As used herein, the statement "which does not substantially emit light" means that the amount of light emission from the compound which does not substantially emit light is preferably 5% or less, more preferably 3% or less, and still more preferably 1% or less of the total amount of light emitting in the whole of the element.

Examples of the host material which can be used in the organic electroluminescent element of the present invention include the following compounds, other than the luminescent compound represented by the general formula (1):

conductive high-molecular oligomers such as pyrrole, indole, carbazole, azaindole, azacarbazole, triazole, oxazole, oxadiazole, pyrazole, imidazole, thiophene, benzothiophene, dibenzothiophene, furan, benzofuran, dibenzofuran, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, porphyrin-based compounds, fused ring aromatic hydrocarbon compounds (fluorene, naphthalene, phenanthrene, triphenylene, and the like), polysilane-based compounds, poly(N-vinylcarbazole), aniline-based copolymers, thiophene oligomers, and polythiophene, organic silanes, carbon films, pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyrazine, fluorine-substituted aromatic compounds, heterocyclic tetracarboxylic anhydrides such as naphthalene perylene, phthalocyanine, and a variety of metal complexes typified by metal complexes of 8-quinolinol derivatives and metal complexes having metal phthalocyanine, benzoxazole, or benzothiazole as a ligand thereof, and derivatives thereof (which may have a substituent or a fused ring). In addition, the compounds described in paragraph No. [0081] or [0083] of JP-A-2010-111620 can also be used.

Above all, carbazole, dibenzothiophene, dibenzofuran, arylamine, aromatic hydrocarbon compounds with fused rings, and metal complexes are preferred, and aromatic hydrocarbon compounds with fused rings are particularly preferred since they are stable. As the aromatic hydrocarbon compounds with fused rings, naphthalene-based compounds, anthracene-based compounds, phenanthrene-based compounds, triphenylene-based compounds, and pyrene-based compounds are preferred; anthracene-based compounds and pyrene-based compounds are more preferred; and anthracene-based compounds are particularly preferred. As the anthracene-based compounds, those described in paragraph Nos. [0033] to [0064] of WO 2010/134350 are particularly preferred, and examples thereof include Compounds H-1 and H-2 as described later.

The host material that can be used in the light emitting layer in the organic electroluminescent element of the present invention may be a host material having hole transporting properties or a host material having electron transporting properties.

In the light emitting layer, the singlet lowest excited energy ($S_1$ energy) in the film state of the host material is preferably higher than the $S_1$ energy of the light emitting material from the viewpoints of color purity, luminous efficiency, and driving durability. The $S_1$ of the host material is higher than the $S_1$ of the light emitting material preferably by 0.1 eV or more, more preferably by 0.2 eV or more, and still more preferably by 0.3 eV or more.

When $S_1$ in the film state of the host material is lower than $S_1$ of the light emitting material, the light emitting is lost, and thus, the host material is required to have higher $S_1$ than the $S_1$ of the light emitting material. Further, even in the case where $S_1$ of the host material is higher than the $S_1$ of the light emitting material, a small difference in the $S_1$ of the both leads to partial reverse energy movement from the light emitting material to the host material, which causes reduction in efficiency, color purity, or durability. Therefore, there is a demand for a host material having a sufficiently high $S_1$, and high chemical stability and carrier injecting/transporting properties.

Moreover, the content of the host compound in the light emitting layer in the organic electroluminescent element of the present invention is not particularly limited, but from the viewpoint of luminous efficiency and driving voltage, it is preferably from 15% by mass to 95% by mass, with respect to the total mass of the compounds forming the light emitting layer. When the light emitting layer includes a plurality of kinds of host compounds containing the luminescent compound represented by the general formula (1), the content of the luminescent compound represented by the general formula (1) is preferably from 50% by mass to 99% by mass, with respect to the total host compounds.

(Other Layers)

The organic electroluminescent element of the present invention may include layers other than the light emitting layer.

Examples of the organic layer other than the light emitting layer which may be included in the organic layer include a hole injecting layer, a hole transporting layer, a blocking layer (a hole blocking layer, an exciton blocking layer, and the like), and an electron transporting layer. Specifically, examples of the layer configuration include those described below, but it should not be construed that the present invention is limited to these configurations.

Anode/hole transporting layer/light emitting layer/electron transporting layer/cathode, Anode/hole transporting layer/light emitting layer/blocking layer/electron transporting layer/cathode, Anode/hole transporting layer/light emitting layer/blocking layer/electron transporting layer/electron injecting layer/cathode, Anode/hole injecting layer/hole transporting layer/light emitting layer/blocking layer/electron transporting layer/cathode, Anode/hole injecting layer/hole transporting layer/light emitting layer/electron transporting layer/electron injecting layer/cathode, Anode/hole injecting layer/hole transporting layer/light emitting layer/blocking layer/electron transporting layer/electron injecting layer/cathode, Anode/hole injecting layer/hole transporting layer/blocking layer/light emitting layer/blocking layer/electron transporting layer/electron injecting layer/cathode.

The organic electroluminescent element of the present invention preferably includes at least one (A) organic layer which is preferably disposed between the anode and the light emitting layer. Examples of the (A) organic layer which is preferably disposed between the anode and the light emitting layer include an hole injecting layer, a hole transporting layer, and an electron blocking layer from the anode side.

The organic electroluminescent element of the present invention preferably includes at least one (B) organic layer which is preferably disposed between the cathode and the light emitting layer. Examples of the (B) organic layer which is preferably disposed between the cathode and the light emitting layer include an electron injecting layer, an electron transporting layer, and a hole blocking layer from the cathode side.

Specifically, an example of the preferred aspects of the organic electroluminescent element of the present invention is the aspect shown in FIG. 1, in which a hole injecting layer 4, a hole transporting layer 5, a light emitting layer 6, a hole blocking layer 7, and an electron transporting layer 8 are laminated in this order as the organic layer from the anode 3 side.

Hereinafter, the layers other than the light emitting layer which the organic electroluminescent element of the present invention may have will be described.

(A) Organic Layer Preferably Disposed Between Anode and Light Emitting Layer:

First, the (A) organic layer preferably disposed between the anode and the light emitting layer will be described.

(A-1) Hole Injecting Layer and Hole Transporting Layer

The hole injecting layer and the hole transporting layer are layers having a function of receiving holes from the anode or the anode side and transporting them to the cathode side.

The light emitting element of the present invention preferably includes at least one organic layer between the light emitting layer and the anode, and the organic layer(s) preferably includes at least one compound of the compounds represented by the following general formulae (Sa-1), (Sb-1), and (Sc-1).

[Chem. 22]

General Formula (Sa-1)

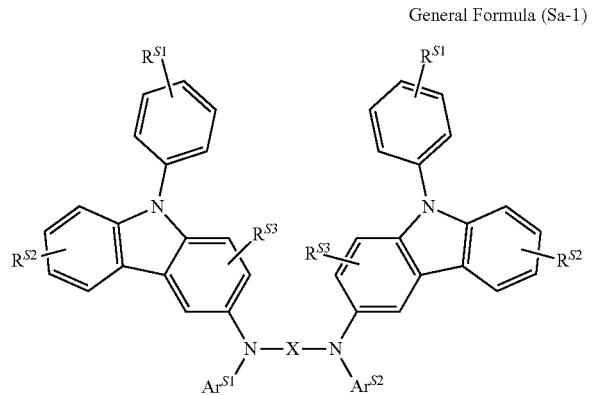

(In the formula, X represents a substituted or unsubstituted alkylene group having 1 to 30 carbon atoms, a substituted or unsubstituted alkenylene group having 2 to 30 carbon atoms, a substituted or unsubstituted arylene group having 6 to 30 carbon atoms, a substituted or unsubstituted heteroarylene group having 2 to 30 carbon atoms, a substituted or unsubstituted heterocyclic group having 2 to 30 carbon atoms, or a group formed by a combination thereof. $R^{S1}$, $R^{S2}$, and $R^{S3}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocyclic group having 2 to 30 carbon atoms, a substituted or unsubstituted fused polycyclic group having 5 to 30 carbon atoms, a hydroxyl group, a cyano group, or a substituted or unsubstituted amino group. Adjacent $R^{S1}$, $R^{S2}$, and $R^{S3}$ may be bonded to each other to form a saturated carbocycle or an unsaturated carbocycle. $Ar^{S1}$ and $Ar^{S2}$ each independently represent a substituted or unsubstituted aryl group having 6 to 30 carbon atoms, or a substituted or unsubstituted heteroaryl group having 2 to 30 carbon atoms.)

[Chem. 23]

General Formula (Sb-1)

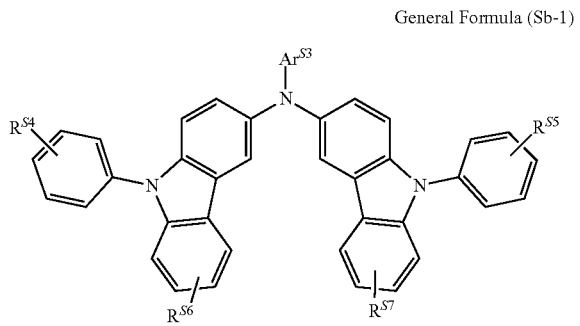

(In the formula, $R^{S4}$, $R^{S5}$, $R^{S6}$, and $R^{S7}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, a substituted or unsubstituted fused polycyclic group having 5 to 30 carbon atoms, a hydroxyl group, a cyano group, or a substituted or unsubstituted amino group. Adjacent $R^{S4}$, $R^{S5}$, $R^{S6}$, and $R^{S7}$ may be bonded to each other to form a saturated carbocycle or an unsaturated carbocycle. $Ar^{S3}$ represents a substituted or unsubstituted aryl group having 6 to 30 carbon atoms, or a substituted or unsubstituted heteroaryl group having 2 to 30 carbon atoms.)

[Chem. 24]

General Formula (Sc-1)

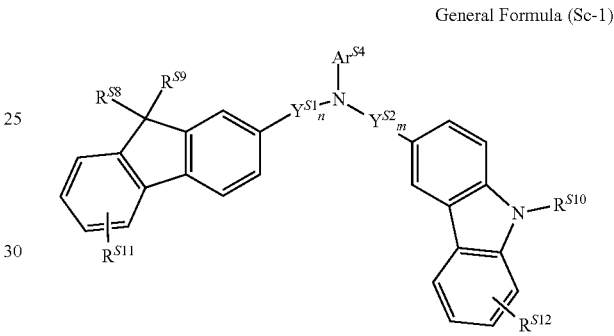

(In the formula, $R^{S8}$ and $R^{S9}$ each independently represent a hydrogen atom, a substituted or unsubstituted alkyl group having 1 to 30 carbon atoms, a substituted or unsubstituted aryl group having 6 to 30 carbon atoms, a substituted or unsubstituted heterocyclic group having 2 to 30 carbon atoms, or a substituted or unsubstituted fused polycyclic group having 5 to 30 carbon atoms. $R^{S10}$ represents a substituted or unsubstituted alkyl group having 1 to 30 carbon atoms, a substituted or unsubstituted aryl group having 6 to 30 carbon atoms, a substituted or unsubstituted heterocyclic group having 2 to 30 carbon atoms, or a substituted or unsubstituted fused polycyclic group having 5 to 30 carbon atoms. $R^{S11}$ and $R^{S12}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, a substituted or unsubstituted fused polycyclic group having 5 to 30 carbon atoms, a hydroxyl group, a cyano group, or a substituted or unsubstituted amino group. Adjacent $R^{S11}$ and $R^{S12}$ may be bonded to each other to form a saturated carbocycle or an unsaturated carbocycle. $Ar^{S4}$ represents a substituted or unsubstituted aryl group having 6 to 30 carbon atoms, or a substituted or unsubstituted heteroaryl group having 2 to 30 carbon atoms. $Y^{S1}$ and $Y^{S2}$ each independently represent a substituted or unsubstituted alkylene group having 1 to 30 carbon atoms, or a substituted or unsubstituted arylene group having 6 to 30 carbon atoms. n and m each independently represent an integer of 0 to 5.)

The general formula (Sa-1) will be described.

In the general formula (Sa-1), X represents a substituted or unsubstituted alkylene group having 1 to 30 carbon atoms, a substituted or unsubstituted alkenylene group having 2 to 30 carbon atoms, a substituted or unsubstituted arylene group having 6 to 30 carbon atoms, a substituted or unsubstituted heteroarylene group having 2 to 30 carbon atoms, a substituted or unsubstituted heterocycle having 2 to 30 carbon atoms, or a group formed by a combination thereof. X is preferably a substituted or unsubstituted arylene group having 6 to 30 carbon atoms, more preferably a substituted or unsubstituted phenylene, a substituted or unsubstituted biphenylene, and a substituted or unsubstituted naphthylene, and still more preferably a substituted or unsubstituted biphenylene.

$R^{S1}$, $R^{S2}$, and $R^{S3}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, a substituted or unsubstituted fused polycyclic group having 5 to 30 carbon atoms, a hydroxyl group, a cyano group, or a substituted or unsubstituted amino group. Adjacent $R^{S1}$, $R^{S2}$, and $R^{S3}$ may be bonded to each other to form a saturated carbocycle or an unsaturated carbocycle. Examples of the saturated carbocycle or the unsaturated carbocycle include naphthalene, azulene, anthracene, fluorene, and phenalene. $R^{S1}$, $R^{S2}$, and $R^{S3}$ are preferably a hydrogen atom, a substituted or unsubstituted alkyl group having 1 to 30 carbon atoms, a substituted or unsubstituted aryl group having 6 to 30 carbon atoms, a substituted or unsubstituted fused polycyclic group having 5 to 30 carbon atoms, or a cyano group, and more preferably a hydrogen atom.

$Ar^{S1}$ and $Ar^{S2}$ each independently represent a substituted or unsubstituted aryl group having 6 to 30 carbon atoms, or a substituted or unsubstituted heteroaryl group having 2 to 30 carbon atoms. $Ar^{S1}$ and $Ar^{S2}$ are preferably a substituted or unsubstituted phenyl group.

Next, the general formula (Sb-1) will be described.

In the general formula (Sb-1), $R^{S4}$, $R^{S5}$, $R^{S6}$ and $R^{S7}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, or a substituted or unsubstituted fused polycyclic group having 5 to 30 carbon atoms, a hydroxyl group, a cyano group, or a substituted or unsubstituted amino group. Adjacent $R^{S4}$, $R^{S5}$, $R^{S6}$ and $R^{S7}$ may be bonded to each other to form a saturated carbocycle or an unsaturated carbocycle. Examples of the saturated carbocycle or the unsaturated carbocycle include naphthalene, azulene, anthracene, fluorene, and phenalene. $R^{S4}$, $R^{S5}$, $R^{S6}$ and $R^{S7}$ are preferably a hydrogen atom, a substituted or unsubstituted alkyl group having 1 to 30 carbon atoms, a substituted or unsubstituted aryl group having 6 to 30 carbon atoms, a substituted or unsubstituted fused polycyclic group having 5 to 30 carbon atoms, or a cyano group, and more preferably a hydrogen atom.

$Ar^{S3}$ represents a substituted or unsubstituted aryl group having 6 to 30 carbon atoms, or a substituted or unsubstituted heteroaryl group having 2 to 30 carbon atoms. $Ar^{S3}$ is preferably a substituted or unsubstituted phenyl group.

Next, the general formula (Sc-1) will be described.

In the general formula (Sc-1), $R^{S8}$ and $R^{S9}$ each independently represent a hydrogen atom, a substituted or unsubstituted alkyl group having 1 to 30 carbon atoms, a substituted or unsubstituted aryl group having 6 to 30 carbon atoms, a substituted or unsubstituted heterocyclic group having 2 to 30 carbon atoms, or a substituted or unsubstituted fused polycyclic group having 5 to 30 carbon atoms. $R^{S8}$ and $R^{S9}$ are preferably a substituted or unsubstituted alkyl group having 1 to 30 carbon atoms, or a substituted or unsubstituted aryl group having 6 to 30 carbon atoms, and more preferably a methyl group or a phenyl group. $R^{S10}$ is a substituted or unsubstituted alkyl group having 1 to 30 carbon atoms, a substituted or unsubstituted aryl group having 6 to 30 carbon atoms, a substituted or unsubstituted heterocyclic group having 2 to 30 carbon atoms, or a substituted or unsubstituted fused polycyclic group having 5 to 30 carbon atoms. $R^{S10}$ is preferably a substituted or unsubstituted aryl group having 6 to 30 carbon atoms, and more preferably a phenyl group. $R^{S11}$ and $R^{S12}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, a substituted or unsubstituted fused polycyclic group having 5 to 30 carbon atoms, a hydroxyl group, a cyano group, or a substituted or unsubstituted amino group. Adjacent $R^{S11}$ and $R^{S12}$ may be bonded to each other to form a saturated carbocycle or an unsaturated carbocycle. Examples of the saturated carbocycle or the unsaturated carbocycle include naphthalene, azulene, anthracene, fluorene, and phenalene. $R^{S11}$ and $R^{S12}$ are preferably a hydrogen atom, a substituted or unsubstituted alkyl group having 1 to 30 carbon atoms, a substituted or unsubstituted aryl group having 6 to 30 carbon atoms, a substituted or unsubstituted fused polycyclic group having 5 to 30 carbon atoms, or a cyano group, and more preferably a hydrogen atom. $Ar^{S4}$ represents a substituted or unsubstituted aryl group having 6 to 30 carbon atoms, or a substituted or unsubstituted heteroaryl group having 2 to 30 carbon atoms. $Y^{S1}$ and $Y^{S2}$ represent a substituted or unsubstituted alkylene having 1 to 30 carbon atoms, or substituted or unsubstituted arylene having 6 to 30 carbon atoms. $Y^{S1}$ and $Y^{S2}$ are preferably a substituted or unsubstituted arylene having 6 to 30 carbon atoms, and more preferably a substituted or unsubstituted phenylene. n is an integer of 0 to 5, preferably 0 to 3, more preferably 0 to 2, and still more preferably 0. m is an integer of 0 to 5, preferably 0 to 3, more preferably 0 to 2, and still more preferably 1.

The general formula (Sa-1) is preferably a compound represented by the following general formula (Sa-2).

[Chem. 25]

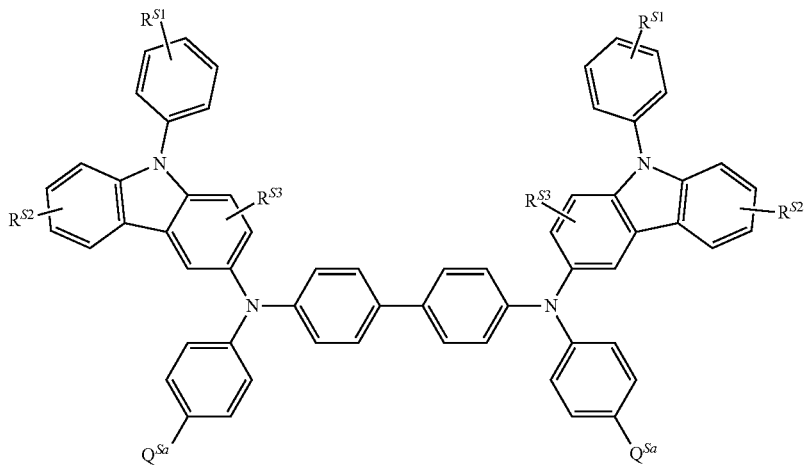

General Formula (Sa-2)

(In the formula, $R^{S1}$, $R^{S2}$, and $R^{S3}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, a substituted or unsubstituted fused polycyclic group having 5 to 30 carbon atoms, a hydroxyl group, a cyano group, or a substituted or unsubstituted amino group. Adjacent $R^{S1}$, $R^{S2}$, and $R^{S3}$ may be bonded to each other to form a saturated carbocycle or an unsaturated carbocycle. $Q^{Sa}$s each independently represent a hydrogen atom, a cyano group, a fluorine atom, an alkoxy group having 1 to 30 carbon atoms, a substituted or unsubstituted alkyl group having 1 to 30 carbon atoms, an aryloxy group having 6 to 30 carbon atoms, a substituted or unsubstituted aryl group having 6 to 30 carbon atoms, a substituted or unsubstituted heterocycle having 2 to carbon atoms, or a substituted or unsubstituted amino group.)

The general formula (Sa-2) will be described. $R^{S1}$, $R^{S2}$, and $R^{S3}$ have the same definitions as those in the general formula (Sa-1), and their preferred ranges are also the same. $Q^{Sa}$s each independently represent a hydrogen atom, a cyano group, a fluorine atom, an alkoxy group having 1 to 30 carbon atoms, a substituted or unsubstituted alkyl group having 1 to 30 carbon atoms, an aryloxy group having 6 to 30 carbon atoms, a substituted or unsubstituted aryl group having 6 to 30 carbon atoms, a substituted or unsubstituted heterocycle having 2 to 30 carbon atoms, or a substituted or unsubstituted amino group. $Q^{Sa}$ is preferably a hydrogen atom, a cyano group, a fluorine atom, a substituted or unsubstituted alkyl group having 1 to 30 carbon atoms, or a substituted or unsubstituted aryl group having 6 to 30 carbon atoms, more preferably a hydrogen atom or a substituted or unsubstituted alkyl group having 1 to 30 carbon atoms, and still more preferably a hydrogen atom.

The general formula (Sb-1) is preferably a compound represented by the following general formula (Sb-2).

[Chem. 26]

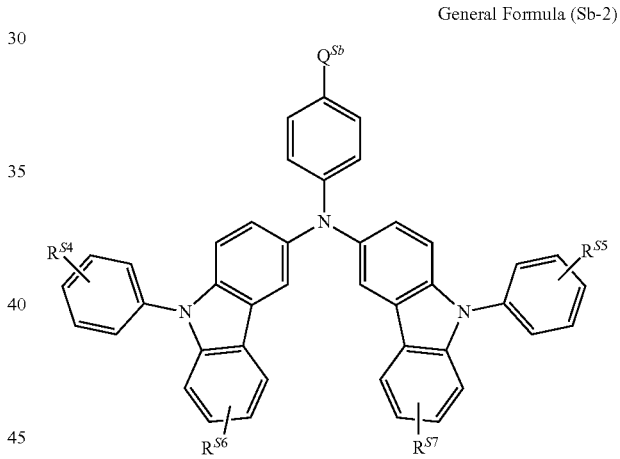

General Formula (Sb-2)

(In the formula, $R^{S4}$, $R^{S5}$, $R^{S6}$, and $R^{S7}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, a substituted or unsubstituted fused polycyclic group having 5 to 30 carbon atoms, a hydroxyl group, a cyano group, or a substituted or unsubstituted amino group. Adjacent $R^{S4}$, $R^{S5}$, $R^{S6}$ and $R^{S7}$ may be bonded to each other to form a saturated carbocycle or an unsaturated carbocycle. $Q^{Sb}$ represents a hydrogen atom, a cyano group, a fluorine atom, an alkoxy group having 1 to 30 carbon atoms, a substituted or unsubstituted alkyl group having 1 to 30 carbon atoms, an aryloxy group having 6 to 30 carbon atoms, a substituted or unsubstituted aryl group having 6 to 30 carbon atoms, a substituted or unsubstituted heterocycle having 2 to 30 carbon atoms, or a substituted or unsubstituted amino group.)

The general formula (Sb-2) will be described. $R^{S4}$, $R^{S5}$, $R^{S6}$ and $R^{S7}$ have the same definitions as those in the general formula (Sb-1), and their preferred ranges are also the same. $Q^{Sa}$ represents a hydrogen atom, a cyano group, a fluorine atom, an alkoxy group having 1 to 30 carbon atoms, a substituted or unsubstituted alkyl group having 1 to 30 carbon atoms, an aryloxy group having 6 to 30 carbon atoms, a substituted or unsubstituted aryl group having 6 to 30 carbon atoms, a substituted or unsubstituted heterocycle having 2 to 30 carbon atoms, or a substituted or unsubstituted amino group. $Q^{Sa}$ is preferably a hydrogen atom, a cyano group, a fluorine atom, a substituted or unsubstituted alkyl group having 1 to 30 carbon atoms, or a substituted or unsubstituted aryl group having 6 to 30 carbon atoms, more preferably a hydrogen atom, or a substituted or unsubstituted alkyl group having 1 to 30 carbon atoms, and still more preferably a hydrogen atom.

The general formula (Sc-1) is preferably a compound represented by the following general formula (Sc-2).

[Chem. 27]

General Formula (Sc-2)

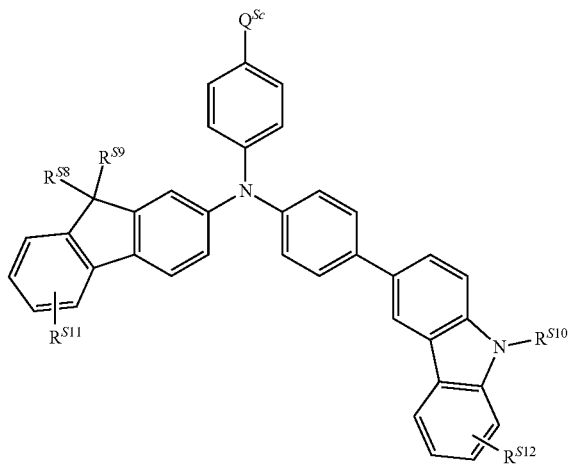

(In the formula, $R^{S8}$ and $R^{S9}$ each independently represent a hydrogen atom, a substituted or unsubstituted alkyl group having 1 to 30 carbon atoms, a substituted or unsubstituted aryl group having 6 to 30 carbon atoms, a substituted or unsubstituted heterocyclic group having 2 to 30 carbon atoms, or a substituted or unsubstituted fused polycyclic group having 5 to 30 carbon atoms. $R^{S10}$ represents a substituted or unsubstituted alkyl group having 1 to 30 carbon atoms, a substituted or unsubstituted aryl group having 6 to 30 carbon atoms, a substituted or unsubstituted heterocyclic group having 2 to 30 carbon atoms, or a substituted or unsubstituted fused polycyclic group having 5 to 30 carbon atoms. $R^{S11}$ and $R^{S12}$ each independently represent a hydrogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aryloxy group having 6 to 30 carbon atoms, a substituted or unsubstituted heterocycle having 2 to 30 carbon atoms, or a substituted or unsubstituted fused polycyclic group having 5 to 30 carbon atoms, a hydroxyl group, a cyano group, or a substituted or unsubstituted amino group. Adjacent $R^{S11}$ and $R^{S12}$ may be bonded to each other to form a saturated carbocycle or an unsaturated carbocycle. $Q^{Sc}$ represents a hydrogen atom, a cyano group, a fluorine atom, an alkoxy group having 1 to 30 carbon atoms, a substituted or unsubstituted alkyl group having 1 to 30 carbon atoms, an aryloxy group having 6 to 30 carbon atoms, a substituted or unsubstituted aryl group having 6 to 30 carbon atoms, a substituted or unsubstituted heterocycle having 2 to 30 carbon atoms, or a substituted or unsubstituted amino group.)

The general formula (Sc-2) will be described. $R^{S8}$, $R^{S9}$, $R^{S10}$, $R^{S11}$ and $R^{S12}$ have the same definitions as those in the general formula (Sc-1), and their preferred ranges are also the same. $Q^{Sc}$ represents a hydrogen atom, a cyano group, a fluorine atom, an alkoxy group having 1 to 30 carbon atoms, a substituted or unsubstituted alkyl group having 1 to 30 carbon atoms, an aryloxy group having 6 to 30 carbon atoms, a substituted or unsubstituted aryl group having 6 to 30 carbon atoms, a substituted or unsubstituted heterocycle having 2 to 30 carbon atoms, or a substituted or unsubstituted amino group. $Q^{Sc}$ is preferably a hydrogen atom, a cyano group, a fluorine atom, a substituted or unsubstituted alkyl group having 1 to 30 carbon atoms, or a substituted or unsubstituted aryl group having 6 to 30 carbon atoms, more preferably a hydrogen atom, or a substituted or unsubstituted aryl group having 6 to 30 carbon atoms, and still more preferably a phenyl group.

Specific examples of the compounds represented by the general formulae (Sa-1), (Sb-1), and (Sc-1) include the following ones. However, the present invention is not limited to the following specific examples.

[Chem. 28]

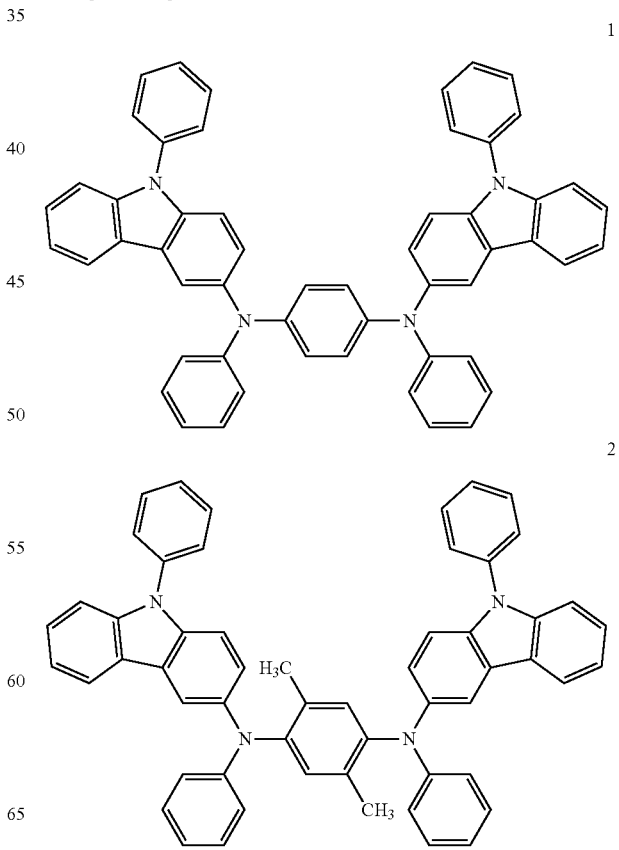

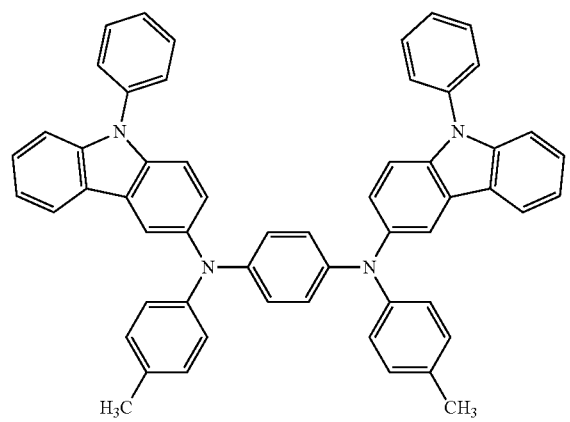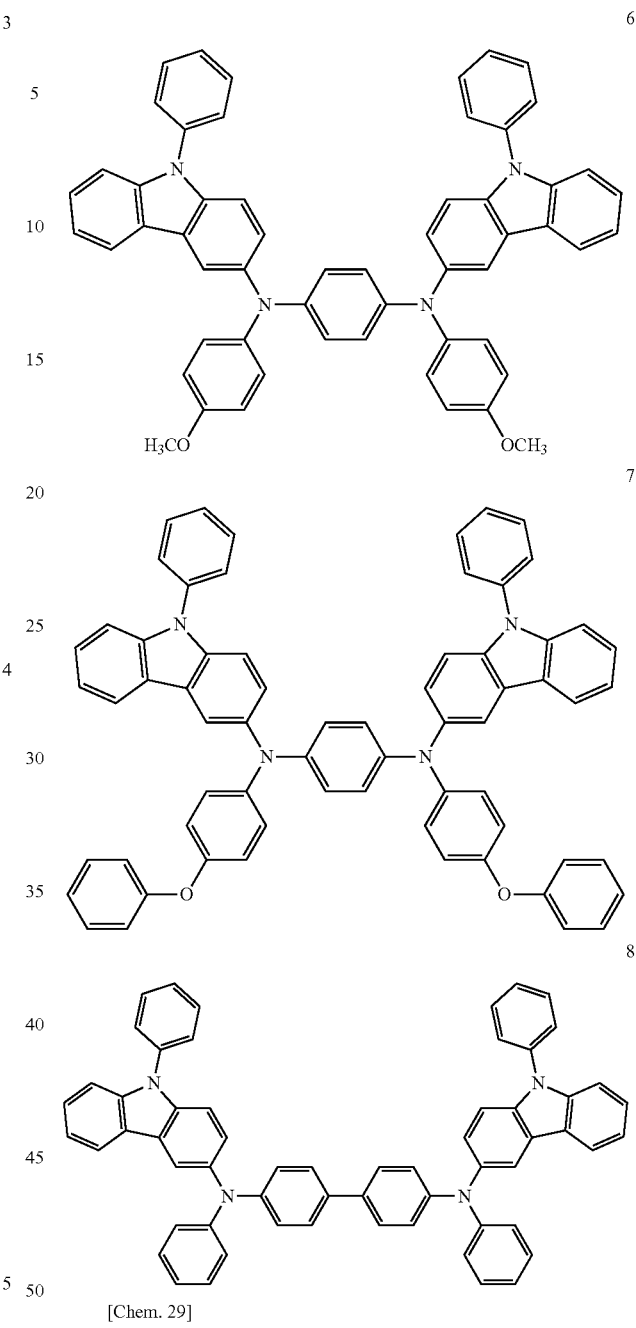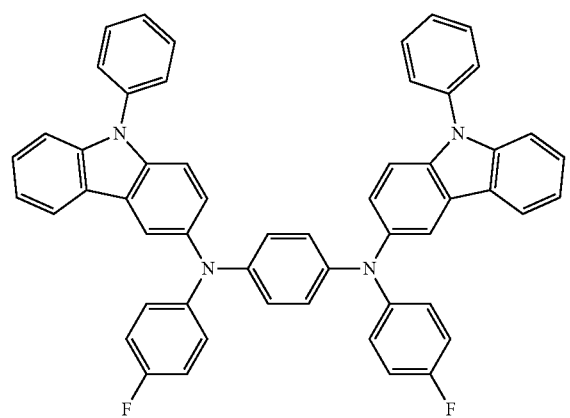

10
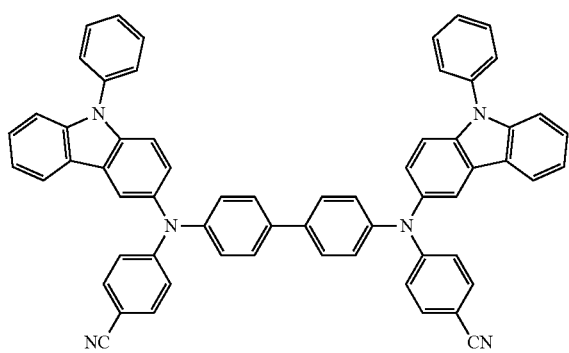
11
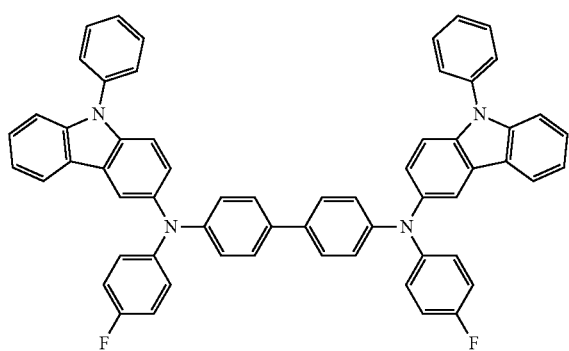
12
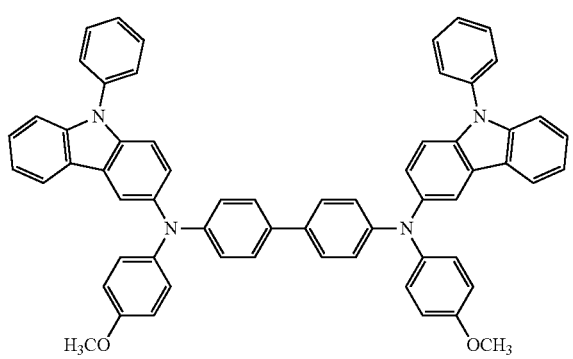
13
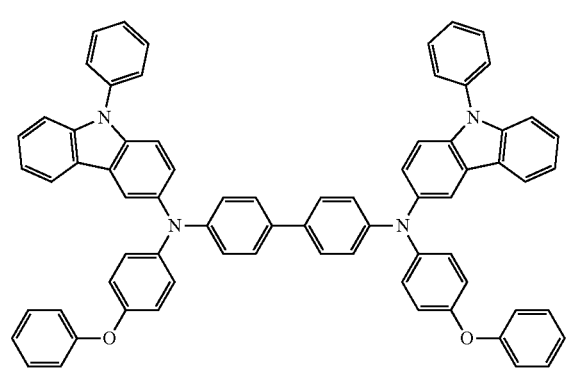
14
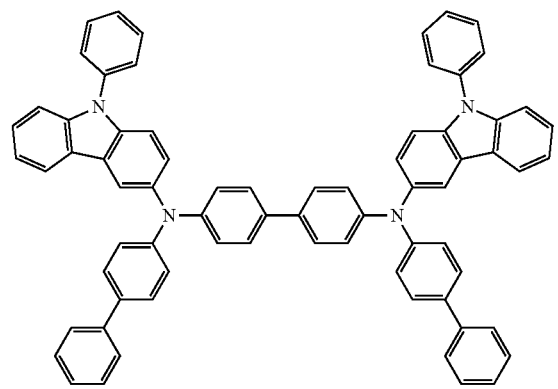
[Chem. 30]
15
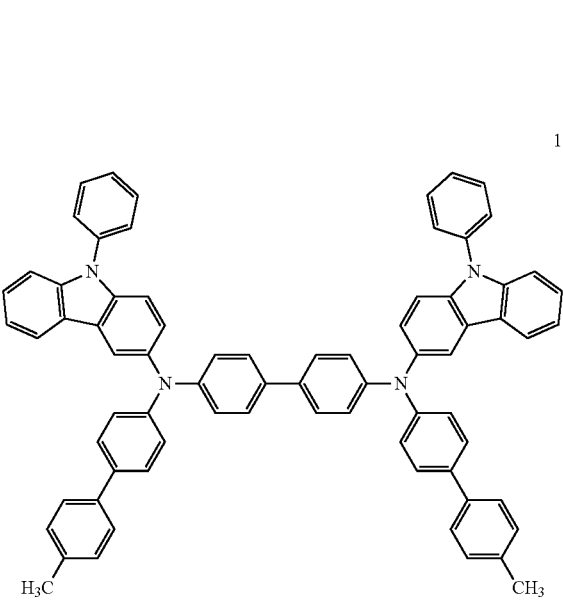
16
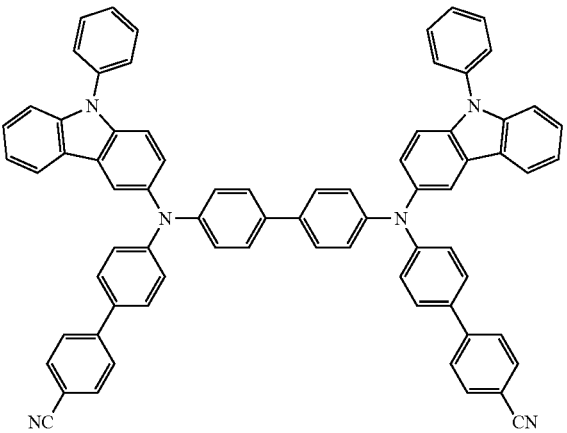

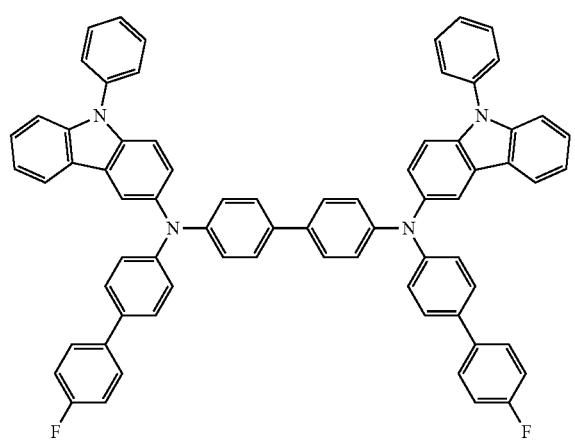
17
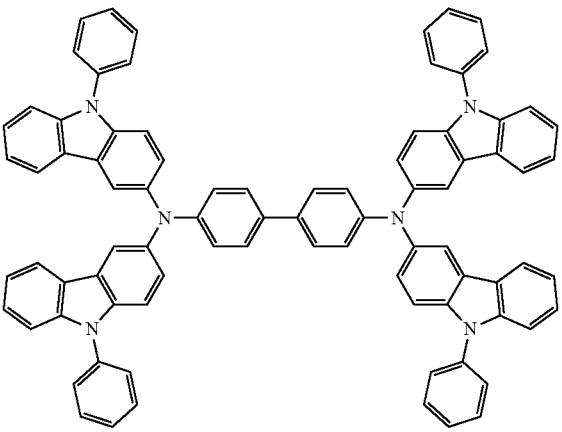
20
[Chem. 31]
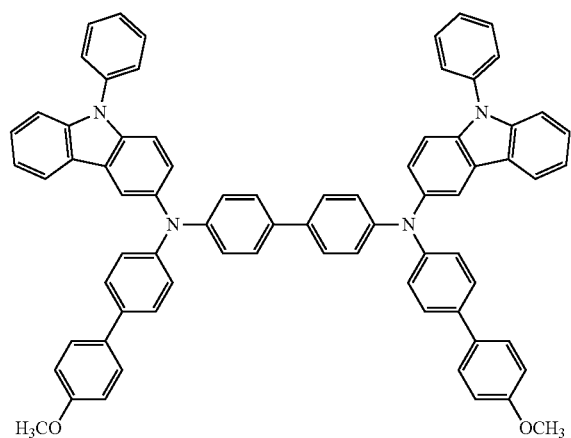
18
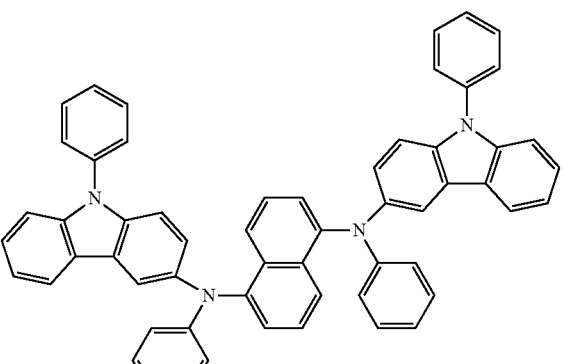
21
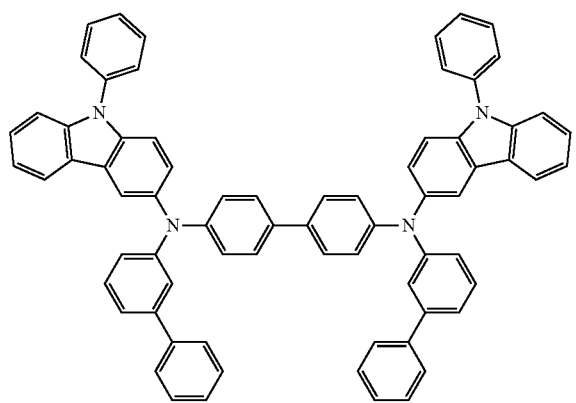
19
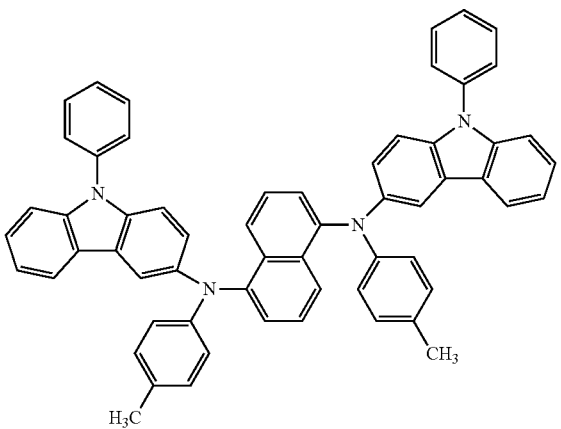
22

23
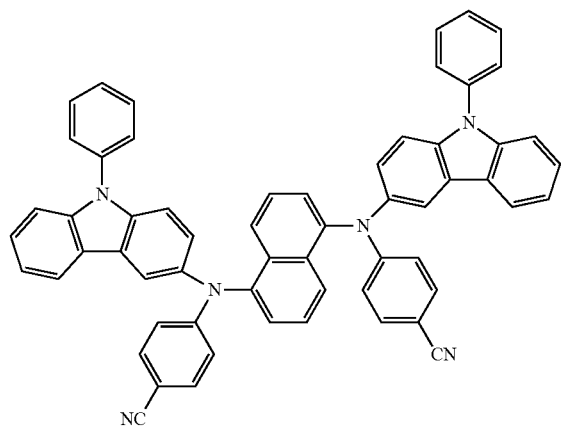
24
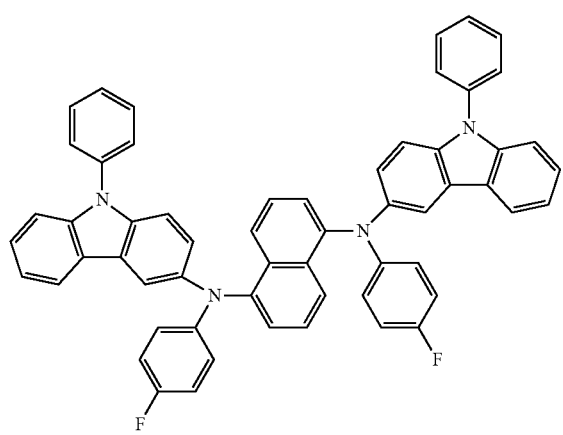
25
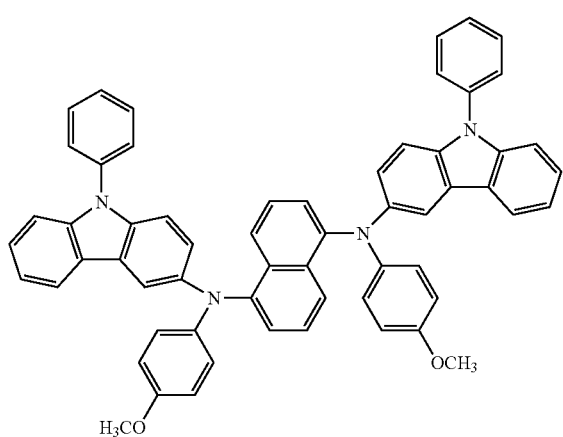
26
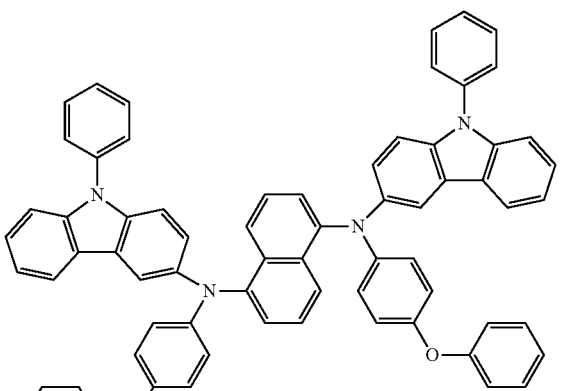
[Chem. 32]
27
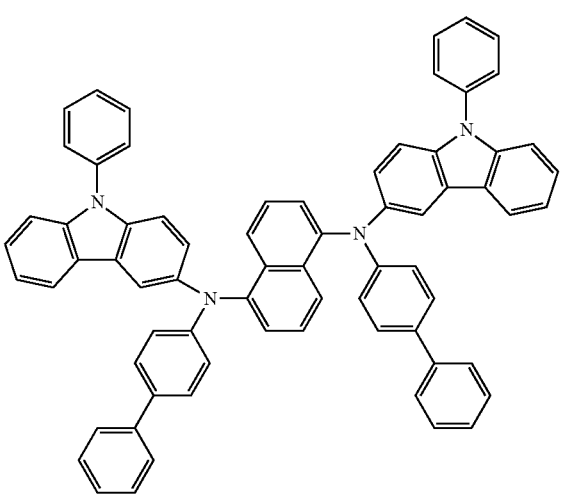
28
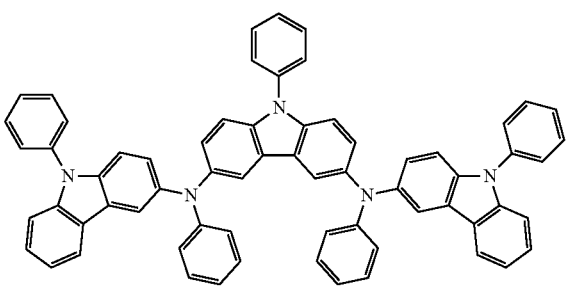

29
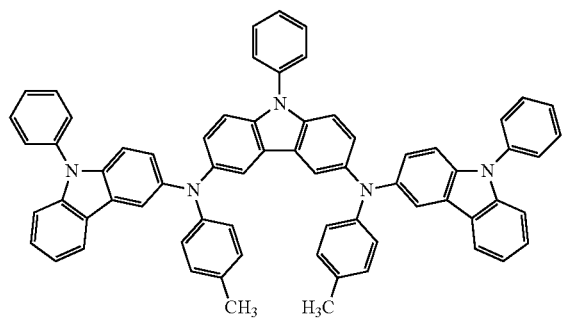
30
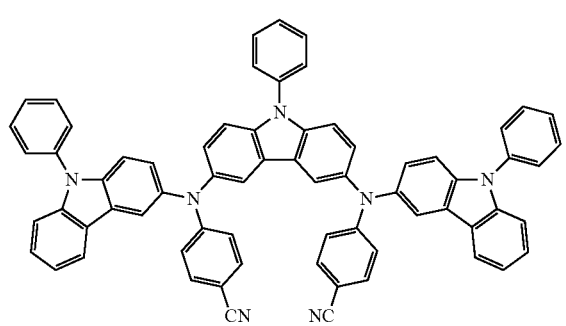
31
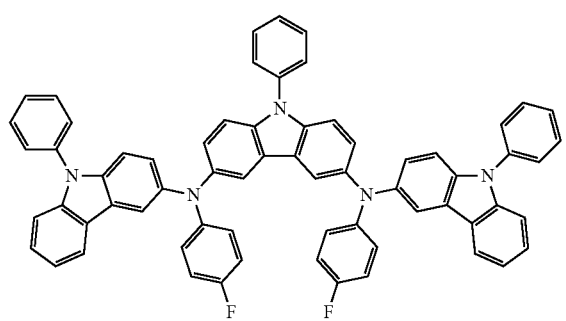
32
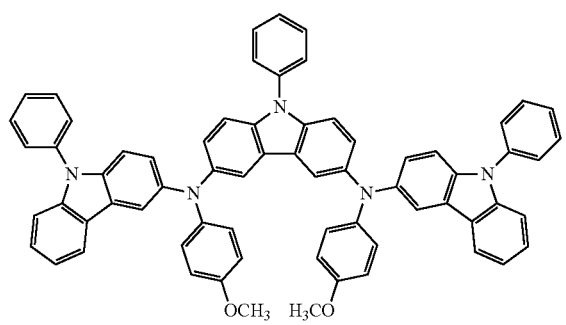
[Chem. 33]
33
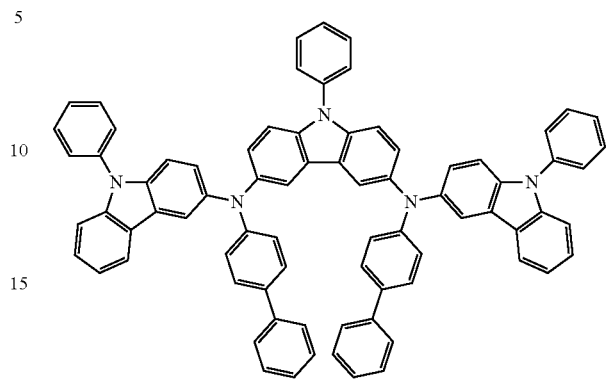
34
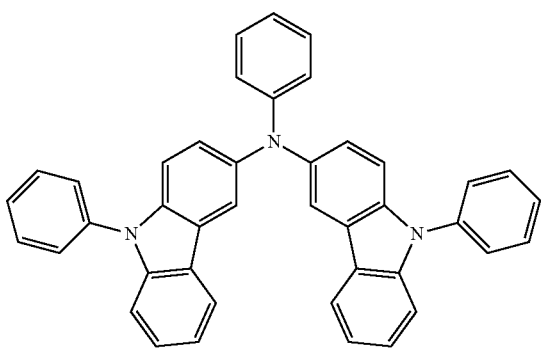
35
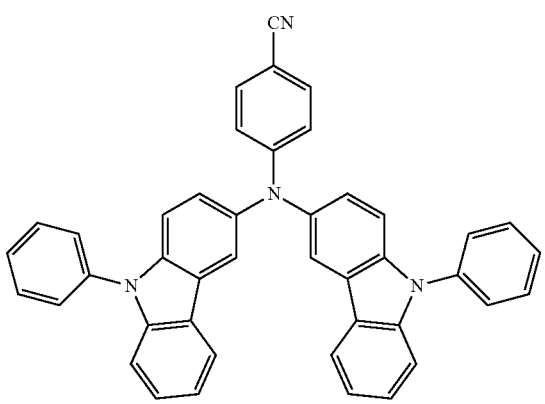
36
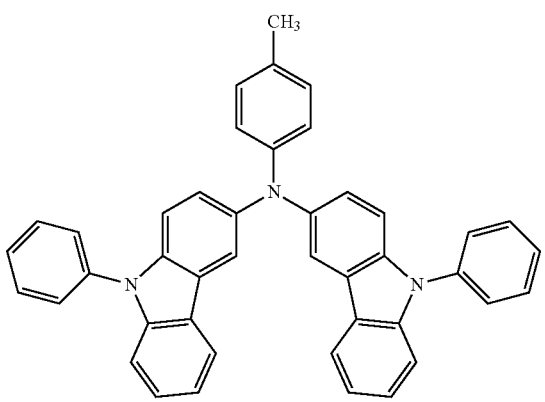

37
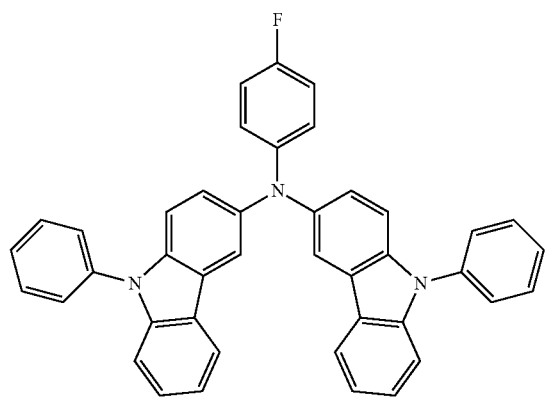
38
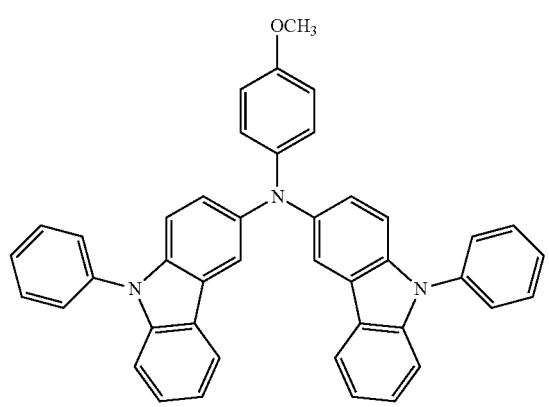
[Chem. 34]
39
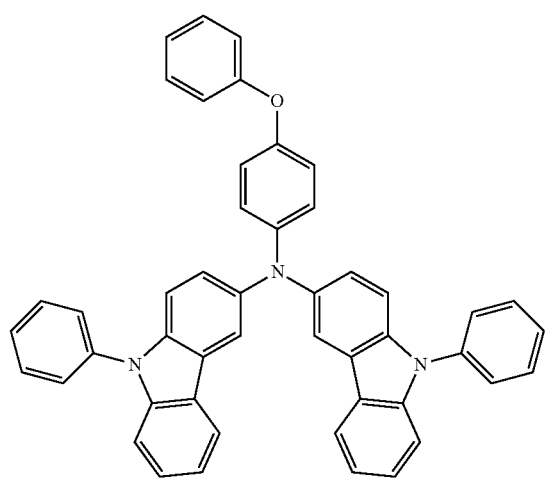
40
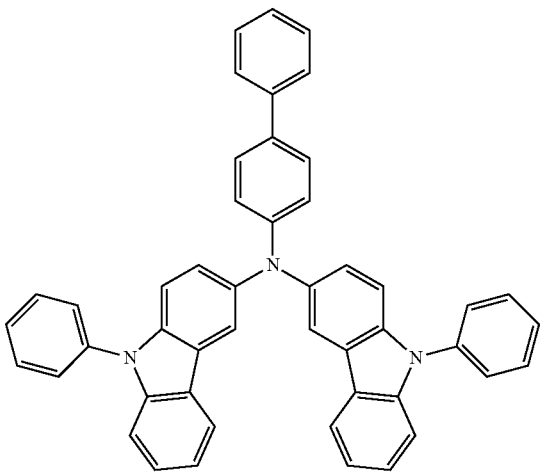
41
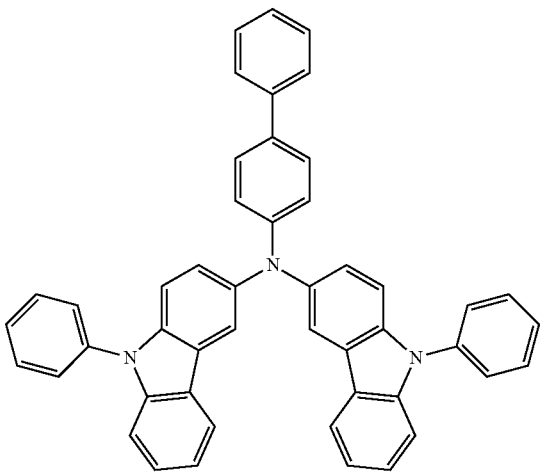
42
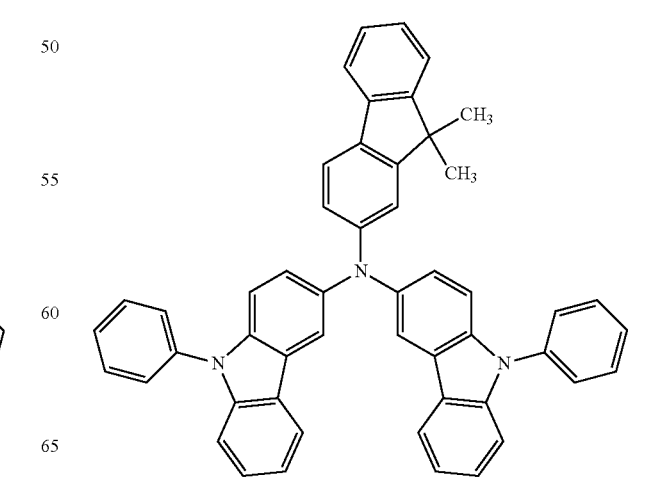

[Chem. 35]
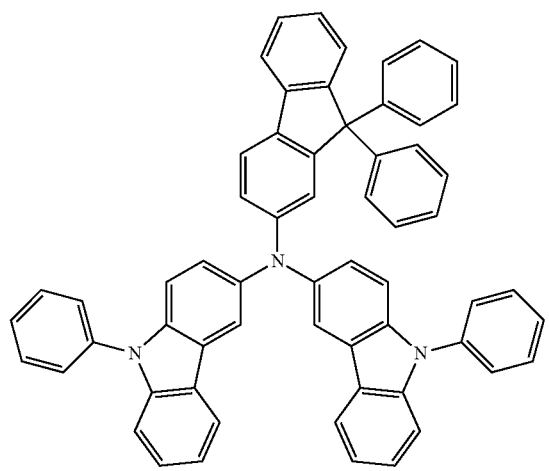
43
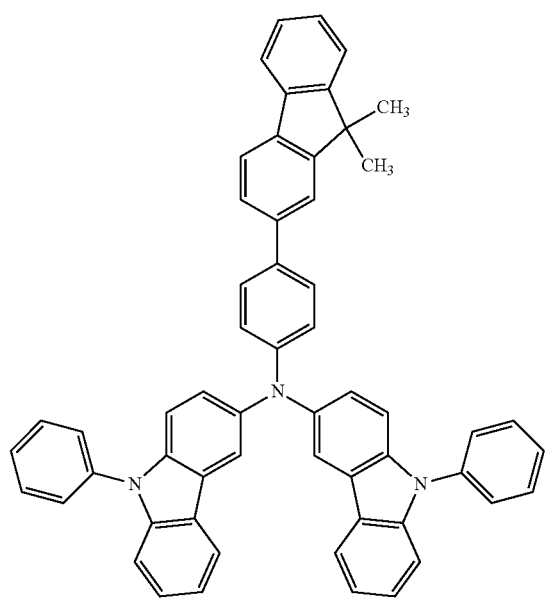
44
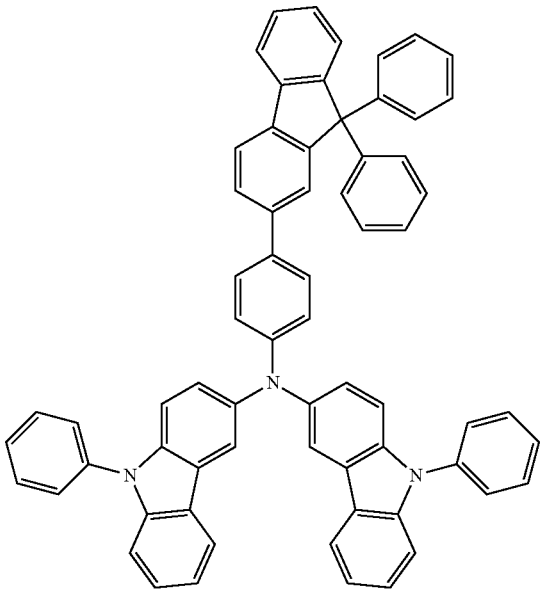
45
[Chem. 36]
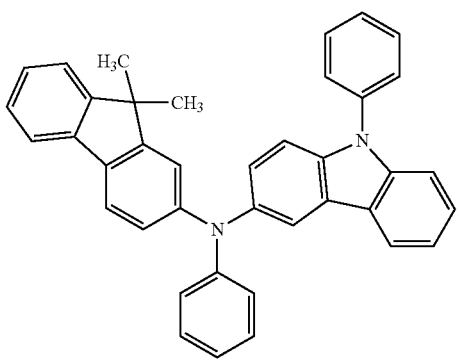
46
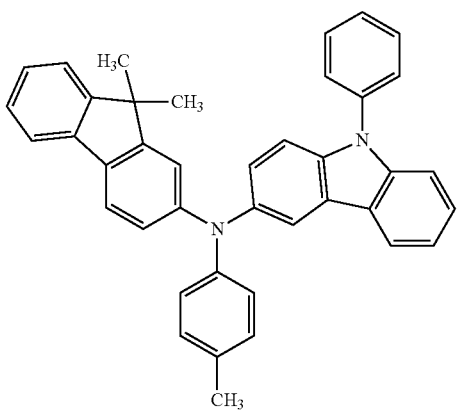
47

48
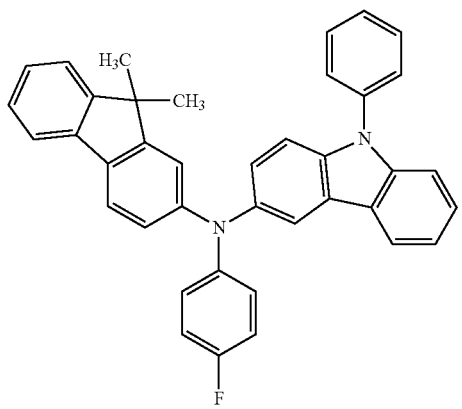
49
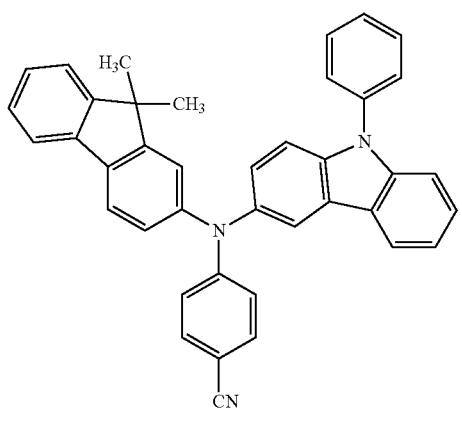
50
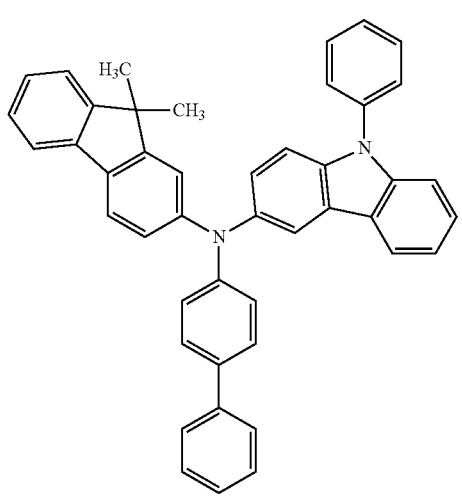
51
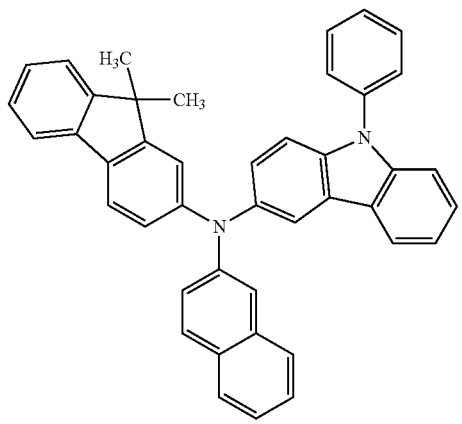
52
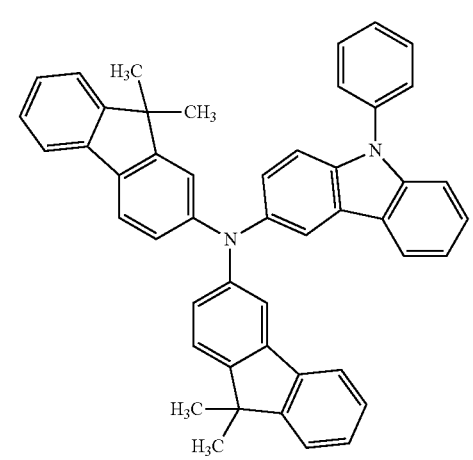
53
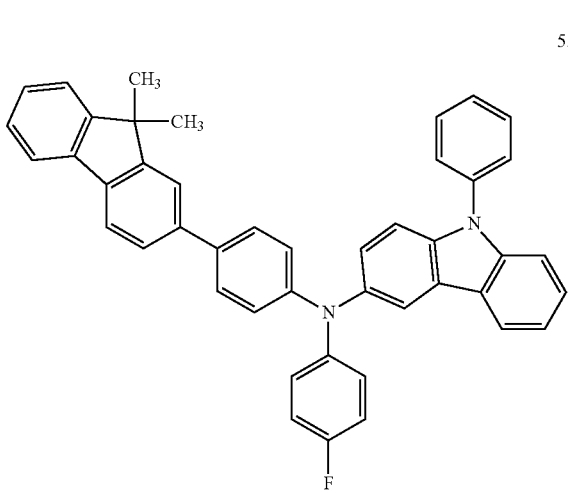

54
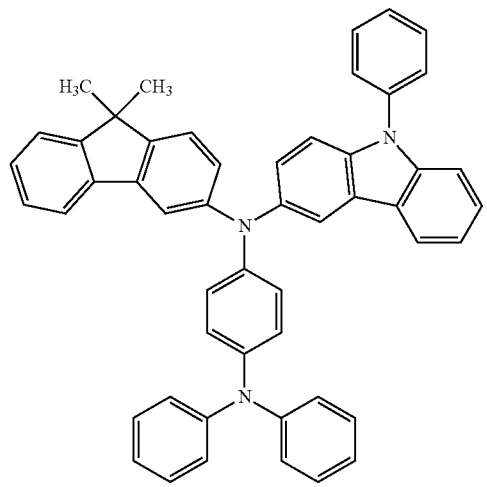
57
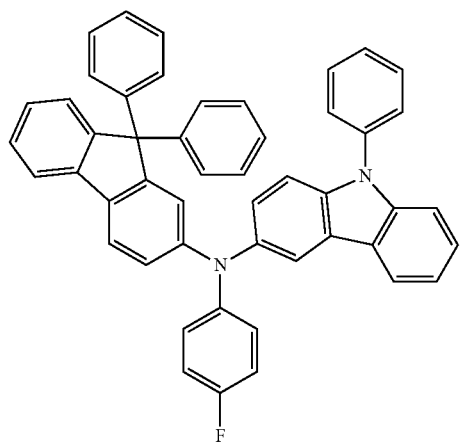
55
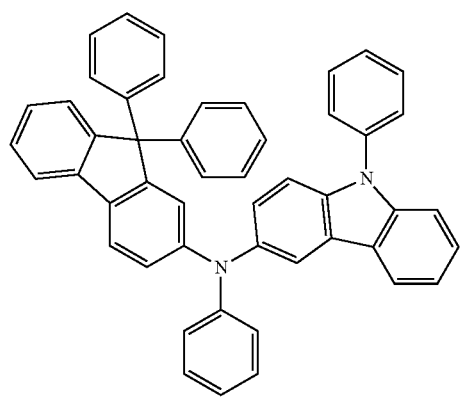
58
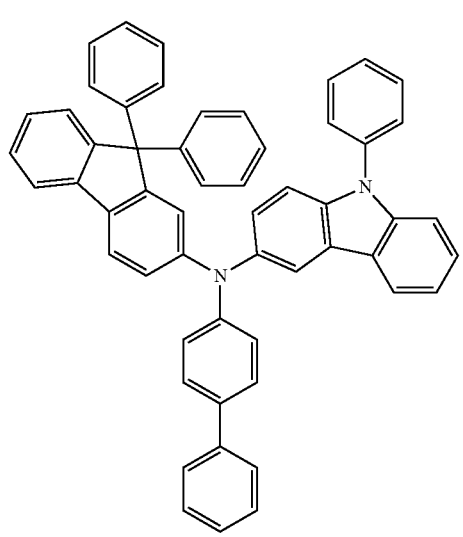
[Chem. 37]
56
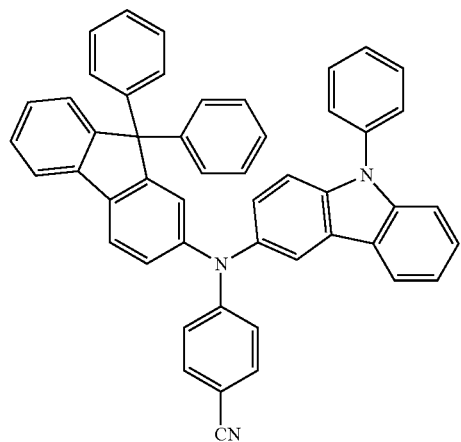
59
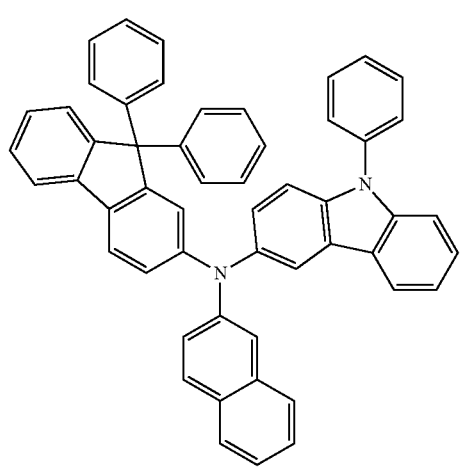

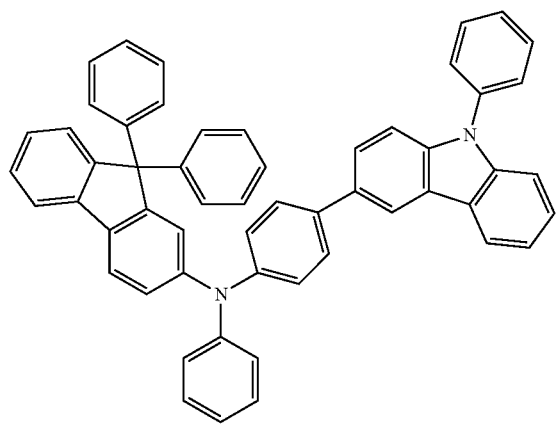

60

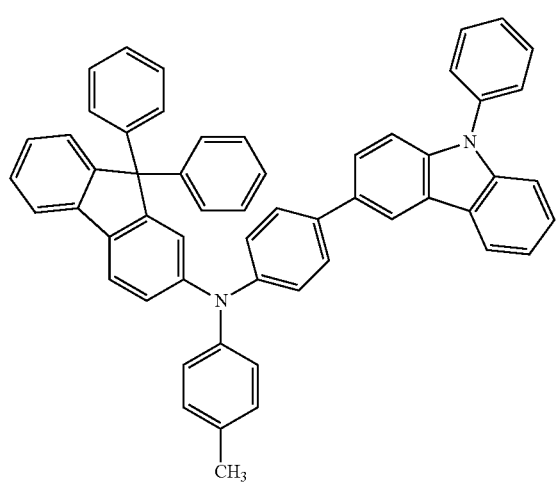

61

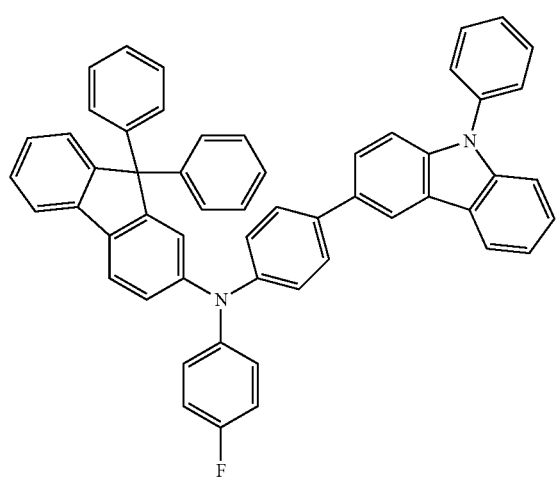

62

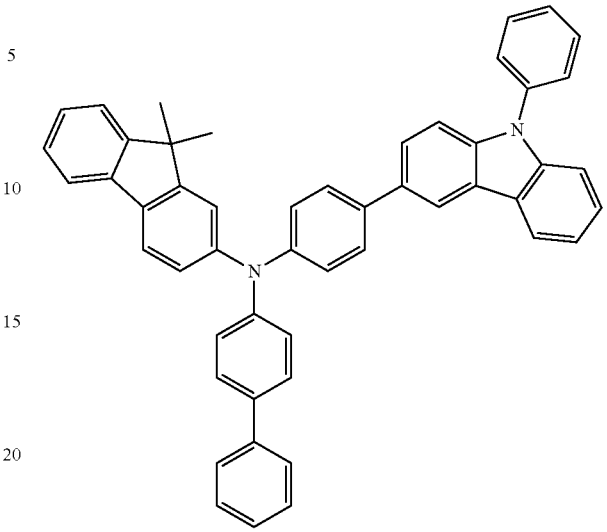

63

The compound represented by the general formula (Sa-1), (Sb-1), or (Sc-1) can be synthesized by the method described in JP-A-2007-318101. After the synthesis, purification is preferably carried out by column chromatography, recrystallization, reprecipitation, or the like, and then by sublimation purification. By the sublimation purification, organic impurities can be separated and inorganic salts, residual solvents, moisture, or the like can be removed effectively.

In the light emitting element of the present invention, the compound represented by the general formula (Sa-1), (Sb-1), or (Sc-1) is preferably contained in the organic layer between the light emitting layer and the anode, and above all, it is more preferably contained in the layer on the anode side adjacent to the light emitting layer, and it is particularly preferably a hole transporting material contained in the hole transporting layer.

The compound represented by the general formula (Sa-1), (Sb-1), or (Sc-1) is contained in the amount of preferably from 70% by mass to 100% by mass, and more preferably from 85% by mass to 100% by mass, with respect to the total mass of the organic layer added.

[Compound Represented by General Formula (M-3)]

The organic electroluminescent element of the present invention is a material which is particularly preferably used in the (A) organic layer preferably disposed between the anode and the light emitting layer, and examples thereof include at least one kind of compound represented by the following general formula (M-3).

The compound represented by the general formula (M-3) is more preferably contained in the organic layer adjacent to the light emitting layer between the light emitting layer and the anode, but is not limited in its uses and may be further contained in any layer in the organic layers. A layer into which the compound represented by the general formula (M-3) is introduced may contain any one or a plurality of a light emitting layer, a hole injecting layer, a hole transporting layer, an electron transporting layer, an electron injecting layer, and a charge blocking layer.

The organic layer adjacent to the light emitting layer between the light emitting layer and the anode, in which the compound represented by the general formula (M-3) is contained, is more preferably an electron blocking layer or a hole transporting layer.

[Chem. 38]

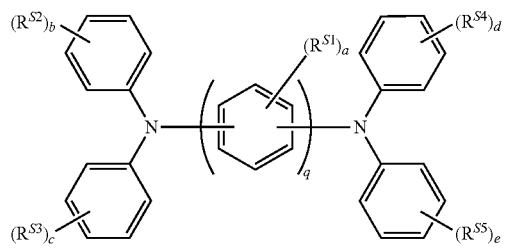

(M-3)

In the general formula (M-3), $R^{S1}$ to $R^{S5}$ each independently represent an alkyl group, a cycloalkyl group, an alkenyl group, an alkynyl group, —CN, a perfluoroalkyl group, a trifluorovinyl group, —$CO_2R$, —C(O)R, —$NR_2$, —$NO_2$, —OR, a halogen atom, an aryl group, or a heteroaryl group, and may further have a substituent Z. Rs each independently represent a hydrogen atom, an alkyl group, a perhaloalkyl group, an alkenyl group, an alkynyl group, a heteroalkyl group, an aryl group, or a heteroaryl group. When a plurality of $R^{S1}$ to $R^{S5}$ are present, those groups may be bonded to each other to form a ring, and may further have a substituent Z.

a represents an integer of 0 to 4, and when a plurality of $R^{S1}$s are present, the $R^{S1}$s may be the same as or different from one another, and may be bonded to each other to form a ring. b to e each independently represent an integer of 0 to 5, and when a plurality of groups are present for each $R^{S2}$ to $R^{S5}$, the groups may be the same as or different from one another, and any two thereof may be bonded to each other to form a ring.

q is an integer of 1 to 5, and when q is 2 or more, a plurality of $R^{S1}$s may be the same as or different from one another and may be bonded to each other to form a ring.

The alkyl group may have a substituent and may be saturated or unsaturated, and examples of the group that may be substituted include the substituent Zs as described above. The alkyl group represented by $R^{S1}$ to $R^{S5}$ is preferably an alkyl group having a total carbon number of 1 to 8, and more preferably an alkyl group having a total carbon number of 1 to 6, and examples thereof include a methyl group, an ethyl group, an i-propyl group, a cyclohexyl group, and a t-butyl group.

The cycloalkyl group may have a substituent and may be saturated or unsaturated, and examples of the group that may be substituted include the substituent Zs as described above. The cycloalkyl group represented by $R^{S1}$ to $R^{S5}$ is preferably a cycloalkyl group having 4 to 7 ring members, and more preferably a cycloalkyl group having a total carbon number of 5 or 6, and examples thereof include a cyclopenthyl group and a cyclohexyl group.

The alkenyl group represented by $R^{S1}$ to $R^{S5}$ preferably has 2 to 30 carbon atoms, more preferably has 2 to 20 carbon atoms, and particularly preferably has 2 to 10 carbon atoms, and examples thereof include vinyl, allyl, 1-propenyl, 1-isopropenyl, 1-butenyl, 2-butenyl, and 3-pentenyl.

The alkynyl group represented by $R^{S1}$ to $R^{S5}$ preferably has 2 to 30 carbon atoms, more preferably has 2 to 20 carbon atoms, and particularly preferably has 2 to 10 carbon atoms, and examples thereof include ethynyl, propargyl, 1-propynyl, and 3-pentynyl.

The perfluoroalkyl group represented by $R^{S1}$ to $R^{S5}$ includes a group obtained by substituting all the hydrogen atoms in the above-mentioned alkyl group with fluorine atoms.

The aryl group represented by $R^{S1}$ to $R^{S2}$ is preferably a substituted or unsubstituted aryl group having 6 to 30 carbon atoms, and examples thereof include a phenyl group, a tolyl group, a biphenyl group, and a terphenyl group.

The heteroaryl group represented by $R^{S1}$ to $R^{S5}$ is preferably a heteroaryl group having 5 to 8 carbon atoms, and more preferably a substituted or unsubstituted 5- or 6-membered heteroaryl group, and examples thereof include a pyridyl group, a pyrazinyl group, a pyridazinyl group, a pyrimidinyl group, a triazinyl group, a quinolinyl group, an isoquinolinyl group, a quinazolinyl group, a cinnolinyl group, a phthalazinyl group, a quinoxalinyl group, a pyrrolyl group, an indolyl group, a furyl group, a benzofuryl group, a thienyl group, a benzothienyl group, a pyrazolyl group, an imidazolyl group, a benzimidazolyl group, a triazolyl group, an oxazolyl group, a benzoxazolyl group, a thiazolyl group, a benzothiazolyl group, an isothiazolyl group, a benzisothiazolyl group, a thiadiazolyl group, an isoxazolyl group, a benzisoxazolyl group, a pyrrolidinyl group, a piperidinyl group, a piperazinyl group, an imidazolidinyl group, a thiazolinyl group, a sulfolanyl group, a carbazolyl group, a dibenzofuryl group, a dibenzothienyl group, and a pyridoindolyl group. Preferred examples thereof include a pyridyl group, a pyrimidinyl group, an imidazolyl group, and a thienyl group, and more preferred examples thereof include a pyridyl group and a pyrimidinyl group.

$R^{S1}$ to $R^{S5}$ are each preferably a hydrogen atom, an alkyl group, a cyano group, a trifluoromethyl group, a perfluoroalkyl group, a dialkylamino group, a fluoro group, an aryl group, or a heteroaryl group, more preferably a hydrogen atom, an alkyl group, a cyano group, a trifluoromethyl group, a fluoro group, or an aryl group, and still more preferably a hydrogen atom, an alkyl group, or an aryl group. The substituent Z is preferably an alkyl group, an alkoxy group, a fluoro group, a cyano group, or a dialkylamino group, and more preferably a hydrogen atom or an alkyl group.

Any two of $R^{S1}$ to $R^{S5}$ may be bonded to each other to form a fused 4- to 7-membered ring, the fused 4- to 7-membered ring is cycloalkyl, aryl, or heteroaryl, and the fused 4- to 7-membered ring may further have a substituent Z. The definitions and the preferred ranges of the formed cycloalkyl, aryl and heteroaryl are the same as those of the cycloalkyl group, the aryl group, and the heteroaryl group defined in $R^{S1}$ to $R^{S5}$.

In the case where the compound represented by the general formula (M-3) is used in a hole transporting layer, the compound represented by the general formula (M-3) is preferably contained in an amount of 50% by mass to 100% by mass, more preferably contained in an amount of 80% by mass to 100% by mass, and particularly preferably contained in an amount of 95% by mass to 100% by mass.

In addition, in the case where the compound represented by the general formula (M-3) is used in a plurality of organic layers, the compound is preferably contained in each layer within the above range.

The thickness of the hole transporting layer containing the compound represented by the general formula (M-3) is preferably from 1 nm to 500 nm, more preferably from 3 nm to 200 nm, and still more preferably from 5 nm to 100 nm. In addition, the hole transporting layer is preferably provided to be adjacent to the light emitting layer.

Specific examples of the compound represented by the general formula (M-3) are shown below, but the present invention is not limited thereto.
[Chem. 39]
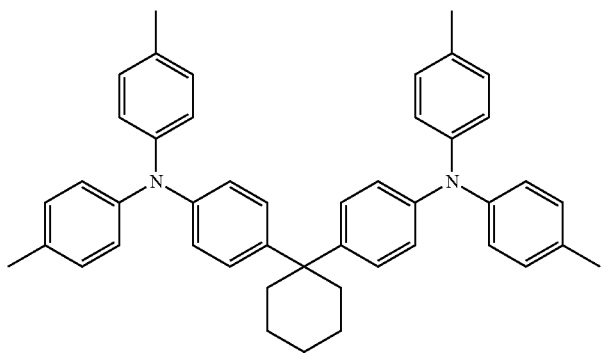
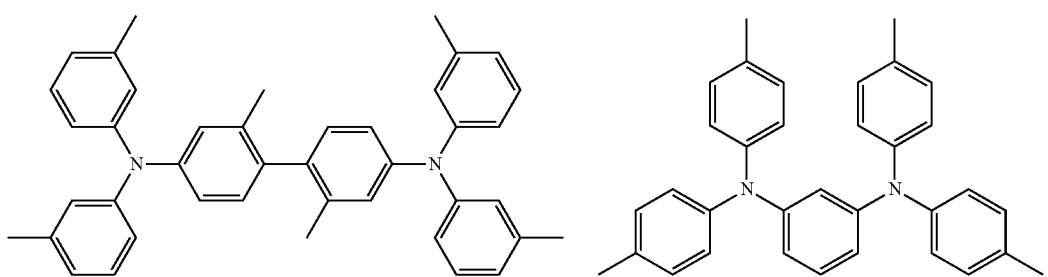
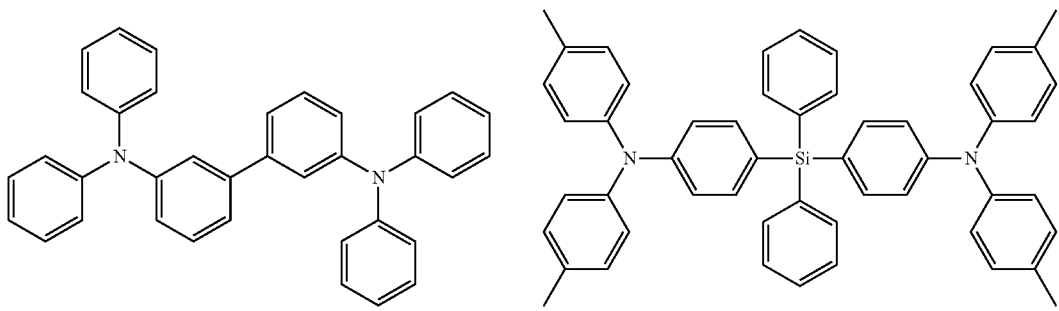
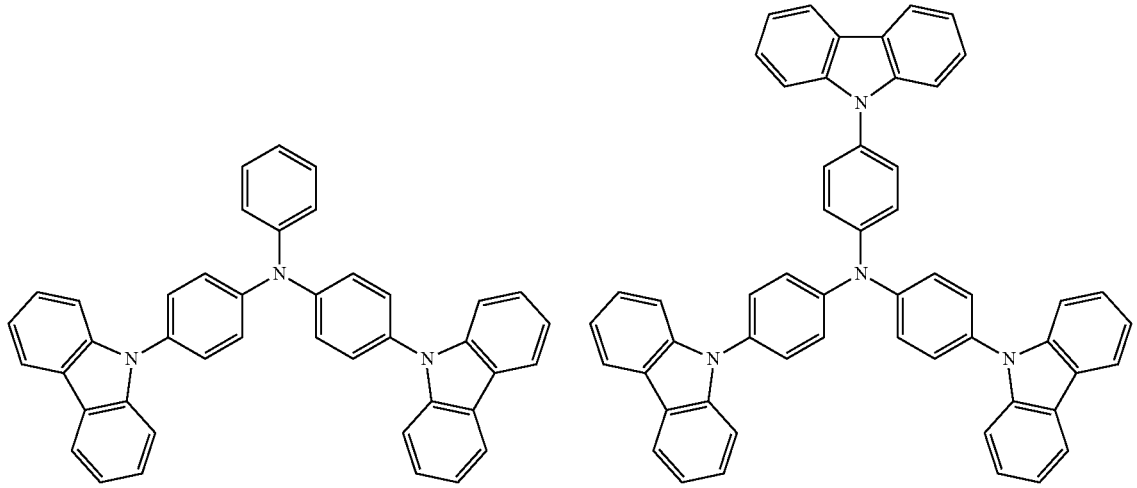

-continued
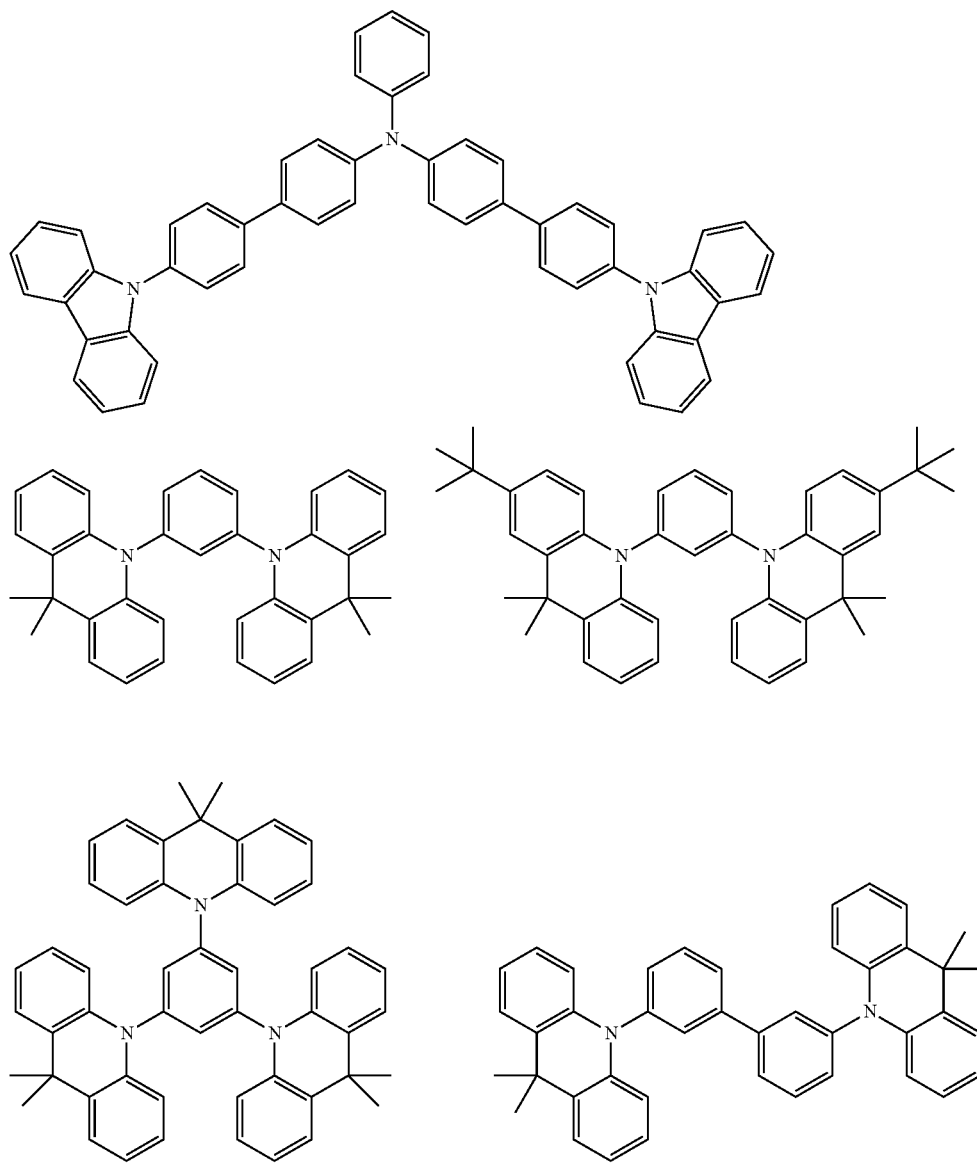
[Chem. 40]
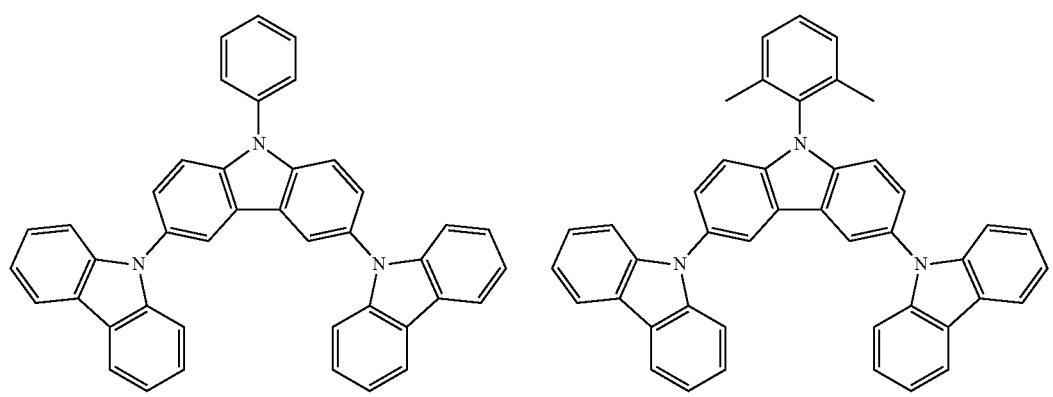

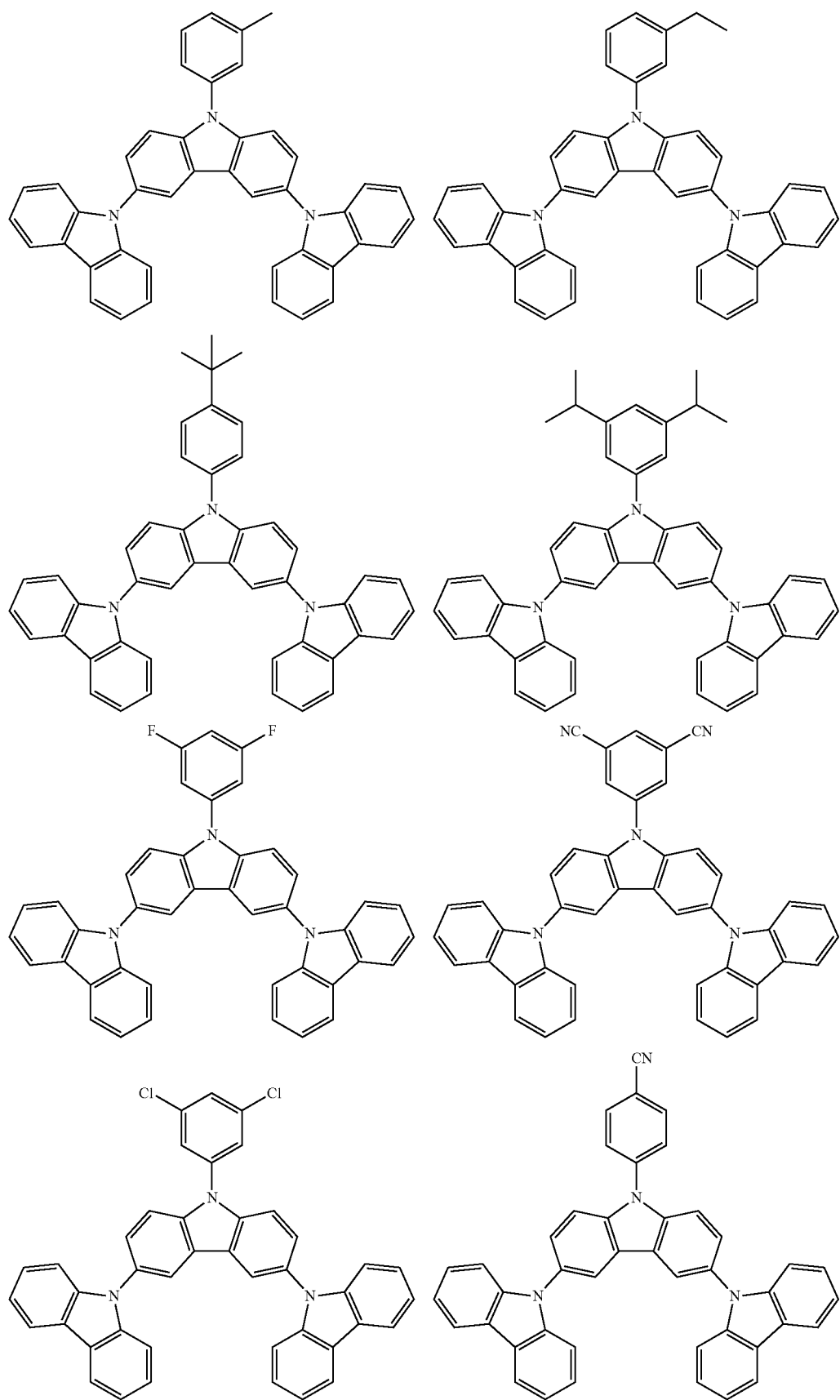

-continued
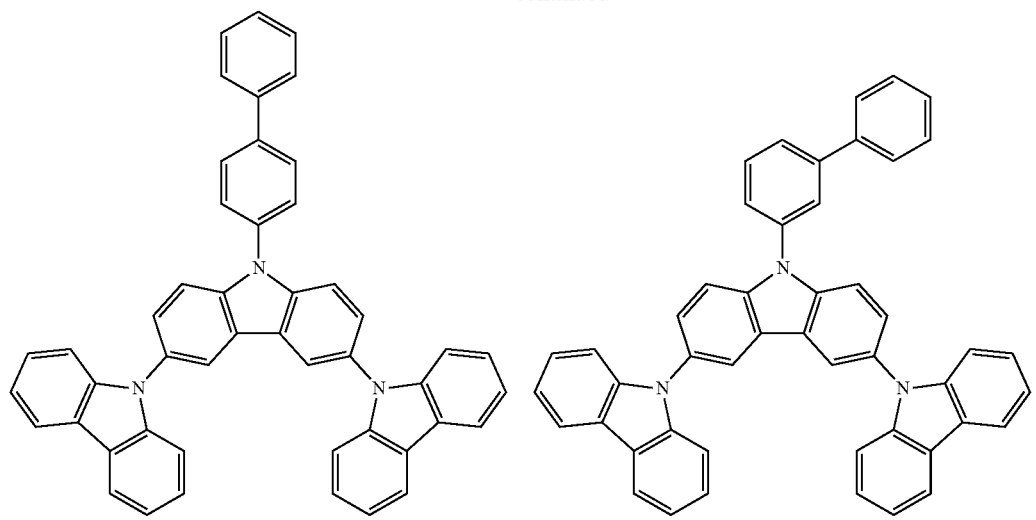
[Chem. 41]
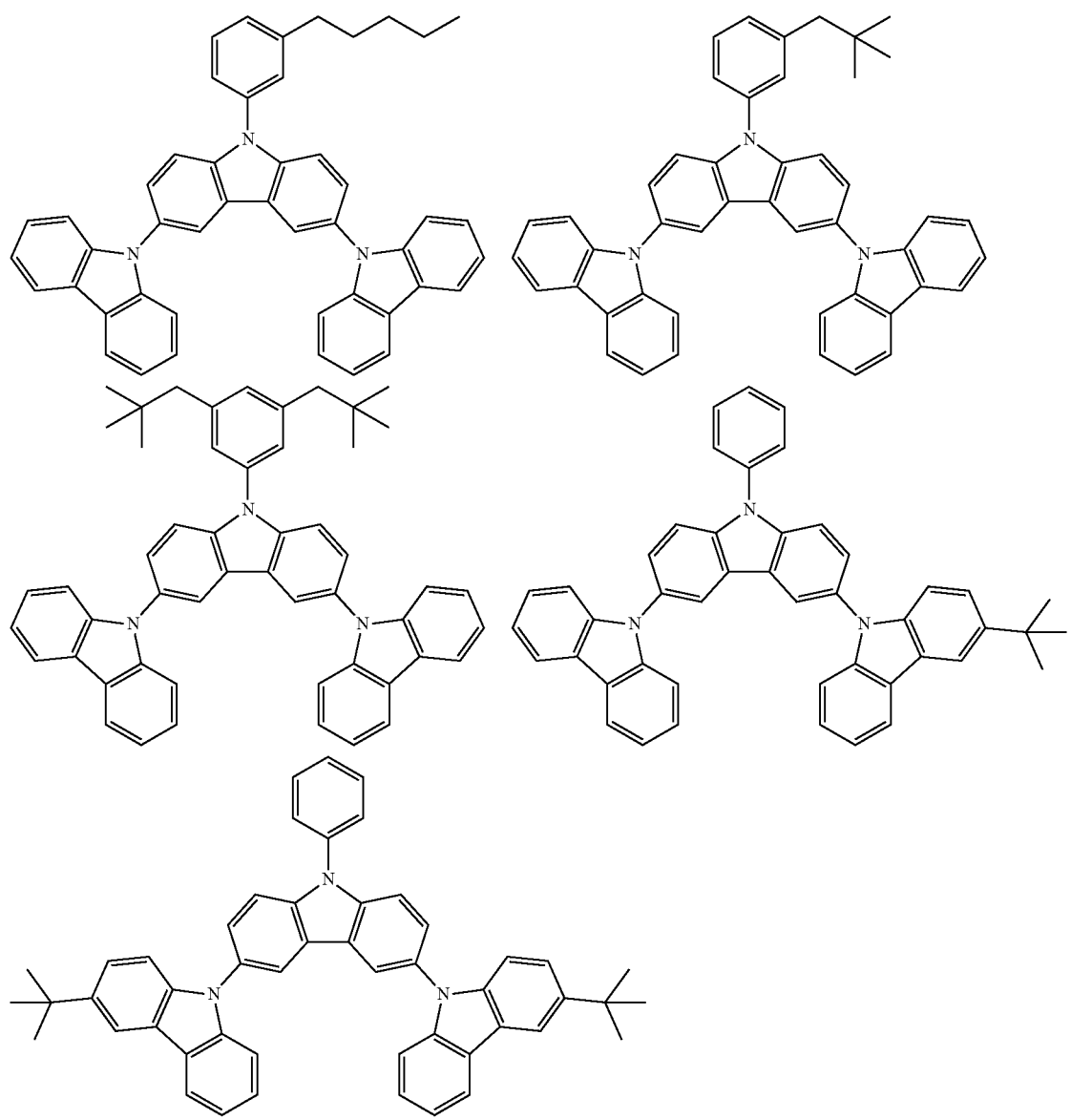

-continued
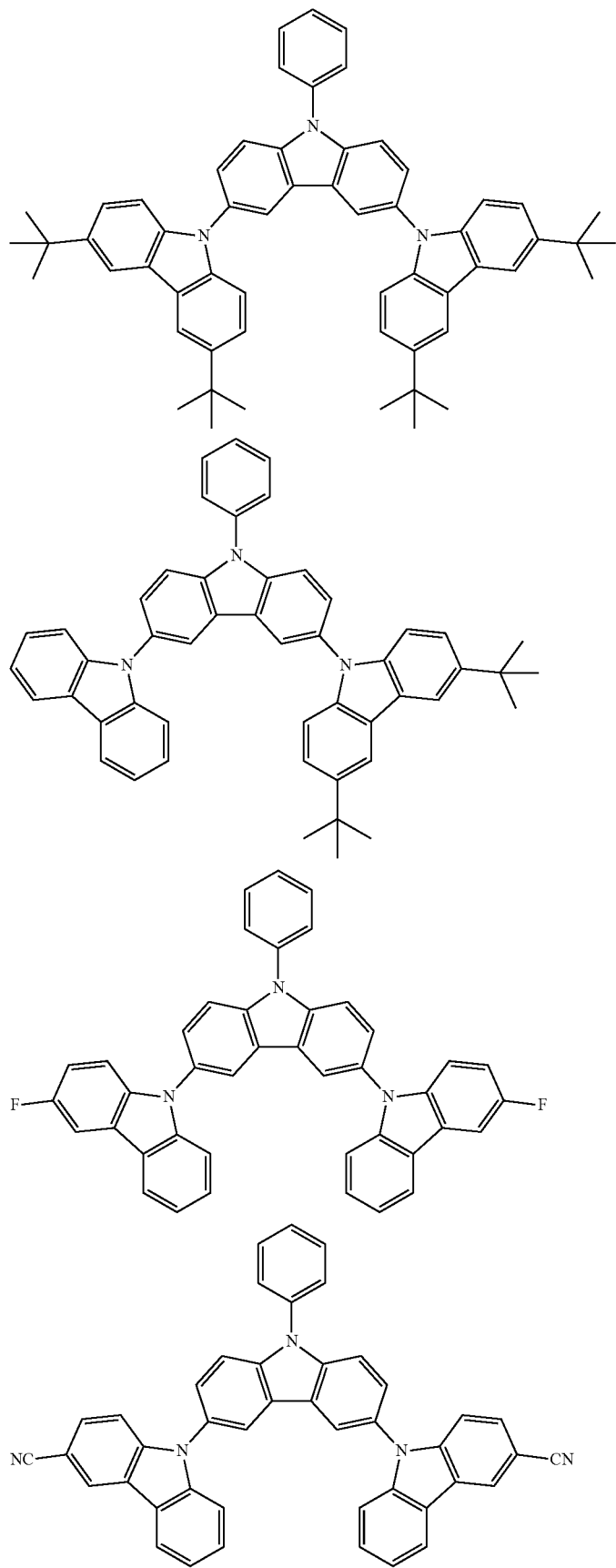

[Chem. 42]
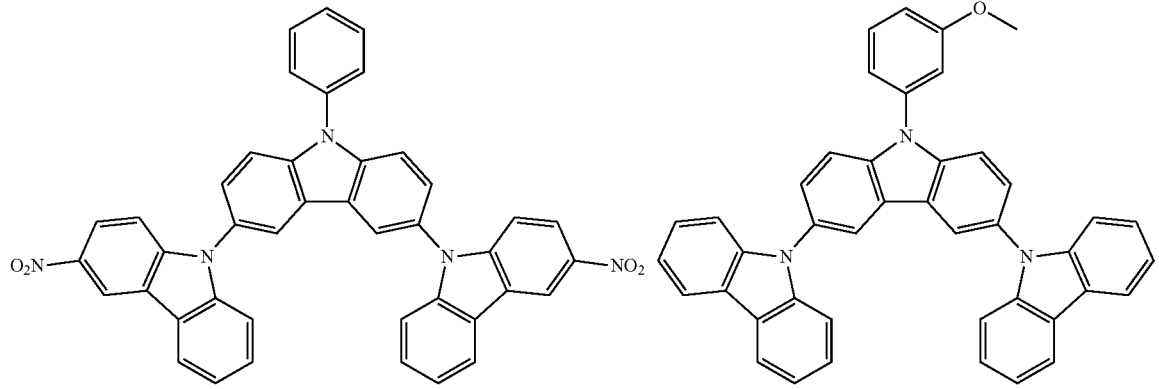
83　　　　　　　　　　　　　　84
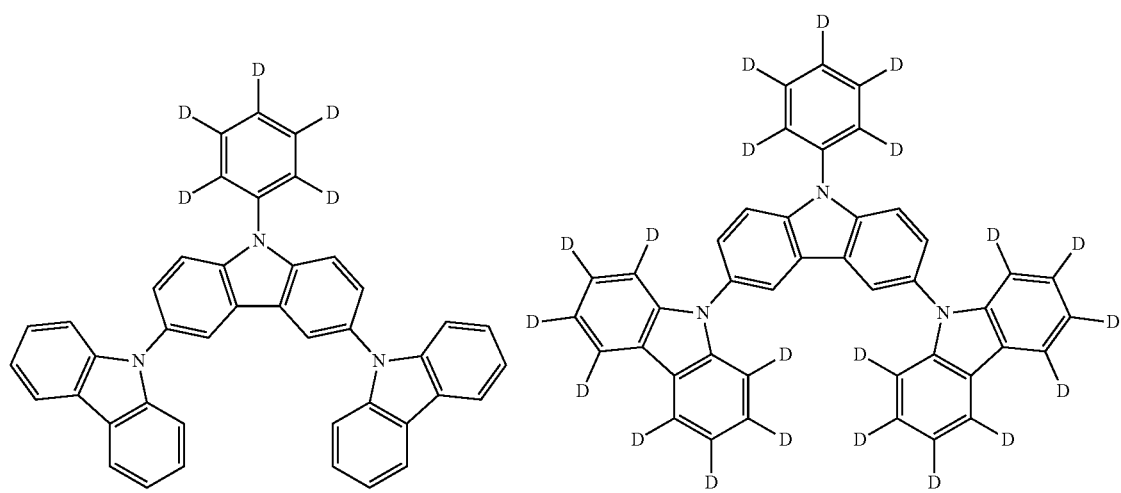
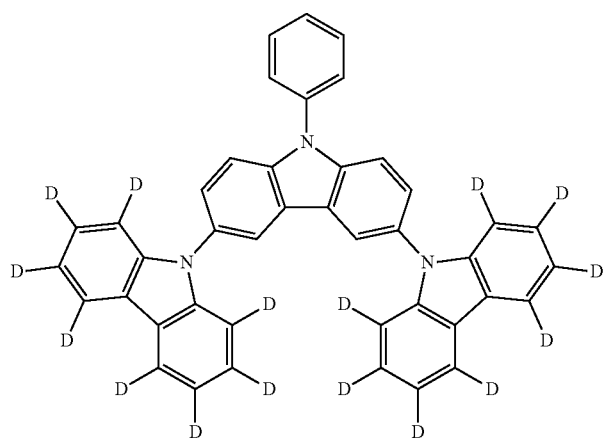

-continued
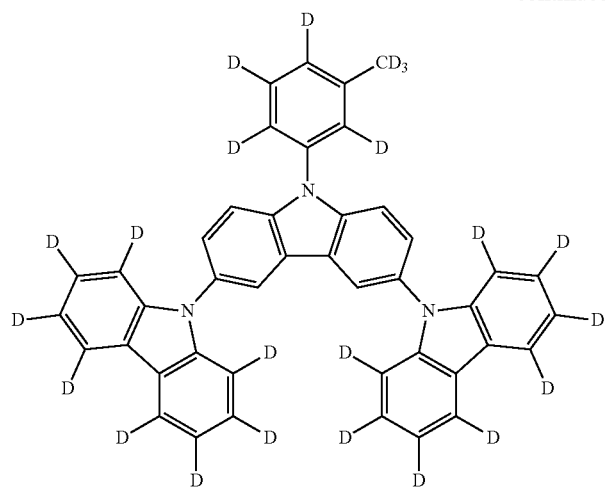
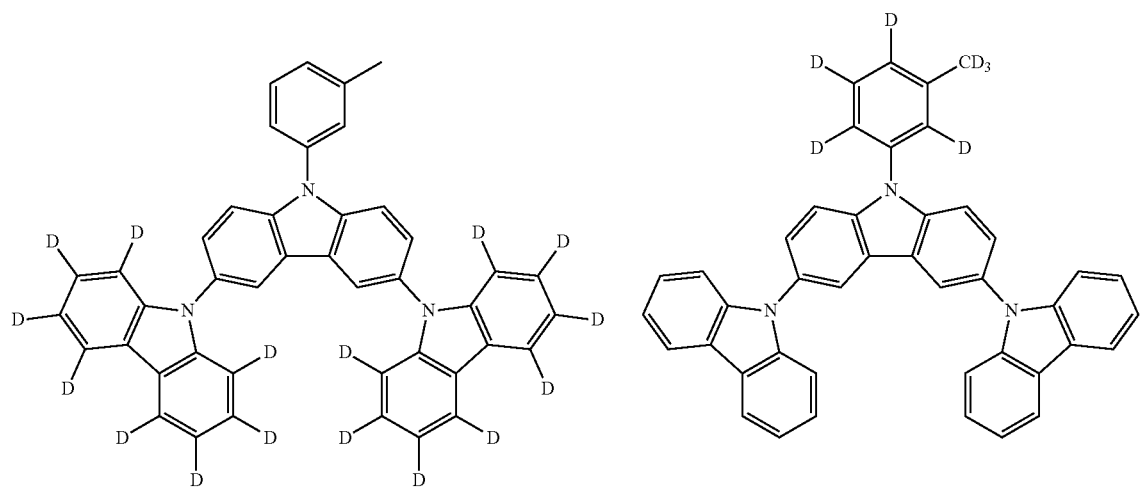
[Chem. 43]
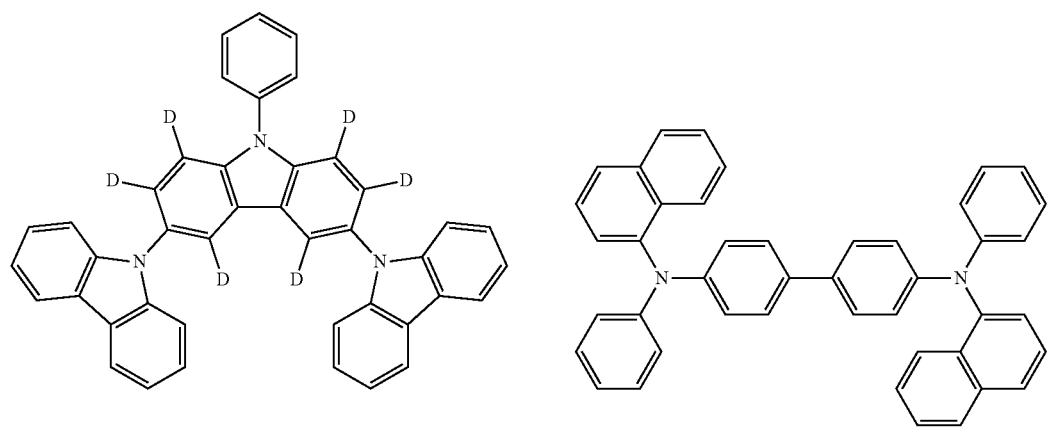

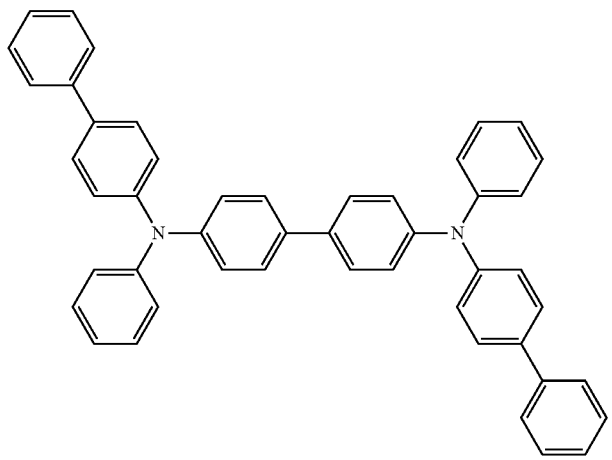
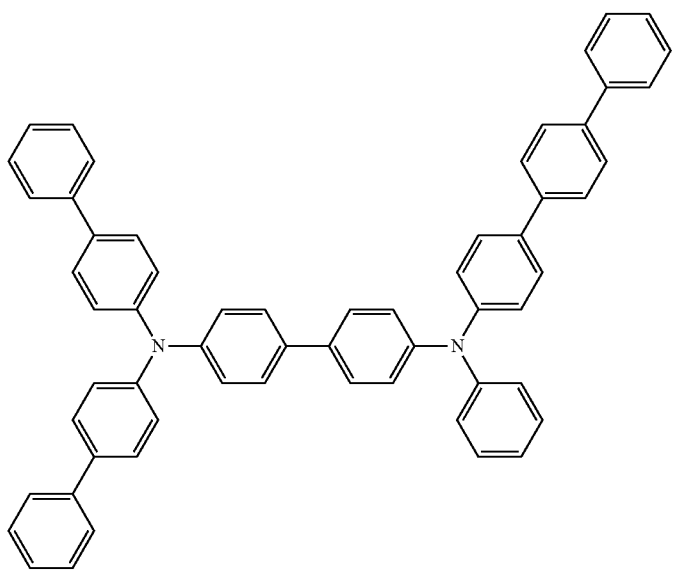
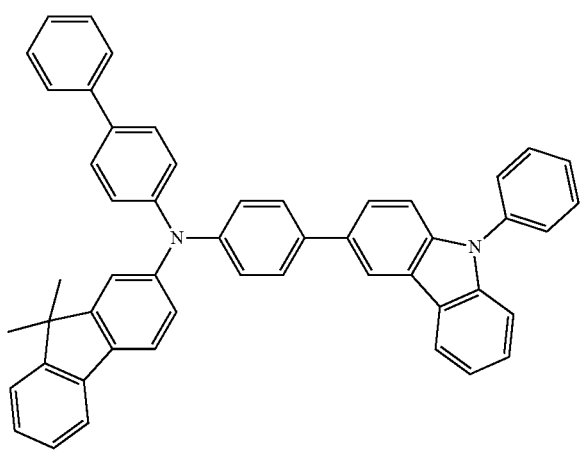

-continued

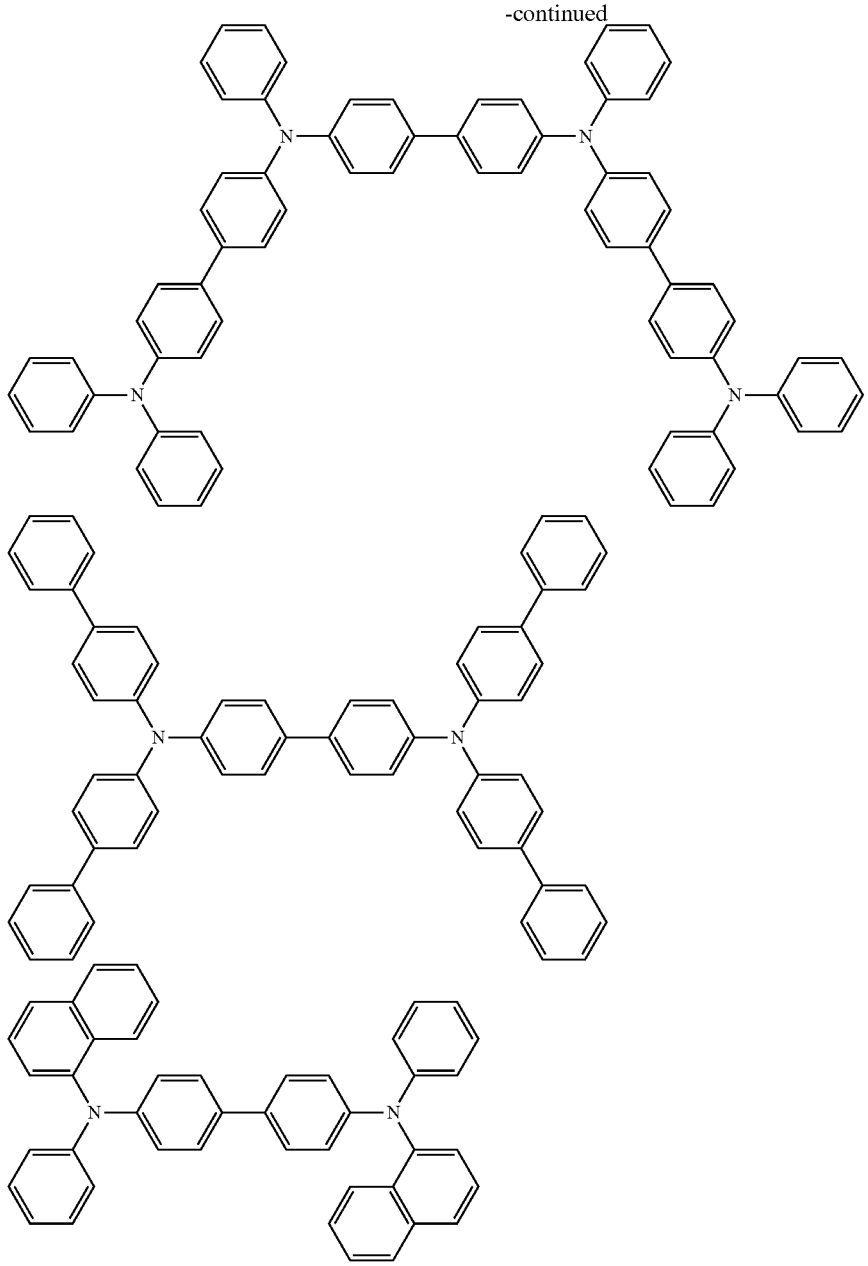

In addition, with respect to the hole injecting layer and the hole transporting layer, the detailed descriptions in paragraph Nos. [0165] to [0167] of JP-A-2008-270736 can be applied to the present invention. Further, the detailed descriptions in paragraph Nos. [0250] to [0339] of JP-A-2011-71452 can be applied to the hole injecting layer and the hole transporting layer of the present invention.

The hole injecting layer preferably contains an electron receptive dopant. By incorporating the electron receptive dopant in the hole injecting layer, there are effects in which, for example, the hole injecting properties are improved, the driving voltage is lowered, and the efficiency is improved. The electron receptive dopant may be any one of organic materials and inorganic materials as long as it is capable of withdrawing electrons from a material to be doped and generating radical cations, and examples thereof include TCNQ compounds such as tetracyanoquinodimethane (TCNQ) and tetrafluorotetracyanoquinodimethane ($F_4$-TCNQ), hexaazatriphenylene compounds such as hexacyanohexaazatriphenylene (HAT-CN), and molybdenum oxide.

The electron receptive dopant in the hole injecting layer is contained in the amount of preferably from 0.01% by mass to 50% by mass, more preferably from 0.1% by mass to 40% by mass, and still more preferably from 0.2° by mass to 30% by mass, with respect to the total mass of the compounds forming the hole injecting layer.

(A-2) Electron Blocking Layer

The electron blocking layer is a layer having a function of preventing the electrons, which have been transported from the cathode side to the light emitting layer, from passing through to the anode side. In the present invention, the electron blocking layer can be provided as an organic layer adjacent to the light emitting layer on the anode side.

As the organic compound constituting the electron blocking layer, for example, those exemplified above as the hole transporting material can be applied.

The thickness of the electron blocking layer is preferably from 1 nm to 500 nm, more preferably from 3 nm to 100 nm, and still more preferably from 5 nm to 50 nm.

The electron blocking layer may have either a single layer structure composed of one kind or two or more kinds of materials selected from the above-exemplified materials or a multilayer structure composed of a plurality of layers having the same composition or different compositions.

The material used in the electron blocking layer preferably has higher $S_1$ energy than that of the light emitting material from the viewpoints of color purity, luminous efficiency, and driving durability. The $S_1$ in the film state of the material used in the electron blocking layer is higher than the $S_1$ of the light emitting material preferably by 0.1 eV or more, more preferably by 0.2 eV or more, and still more preferably by 0.3 eV or more.

(B) Organic Layer Preferably Disposed Between Cathode and Light Emitting Layer

Next, the (B) organic layer preferably disposed between the cathode and the light emitting layer will be described.

(B-1) Electron Injecting Layer and Electron Transporting Layer

The electron injecting layer and the electron transporting layer are layers having a function of receiving electrons from the cathode or the cathode side and transporting them to the anode side. The electron injecting material and the electron transporting material used in these layers may be either a low-molecular compound or a high-molecular compound.

As the electron transporting material, for example, the luminescent compound represented by the general formula (1) can be used. As the other electron transporting materials, any one selected from aromatic ring tetracarboxylic acid anhydrides, such as pyridine derivatives, quinoline derivatives, pyrimidine derivatives, pyrazine derivatives, phthalazine derivatives, phenanthroline derivatives, triazine derivatives, triazole derivatives, oxazole derivatives, oxadiazole derivatives, imidazole derivatives, benzimidazole derivatives, imidazopyridine derivatives, fluorenone derivatives, anthraquinodimethane derivatives, anthrone derivatives, diphenylquinone derivatives, thiopyranedioxide derivatives, carbodiimide derivatives, fluorenylidenemethane derivatives, distyrylpyrazine derivatives, naphthalene, and perylene; various metal complexes typified by metal complexes of phthalocyanine derivatives or 8-quinolinol derivatives and metal complexes having metal phthalocyanine, benzoxazole, or benzothiazole as a ligand thereof; organic silane derivatives typified by silole; and hydrocarbon compounds with fused rings, such as naphthalene, anthracene, phenanthrene, triphenylene, and pyrene is preferred, and any one selected from pyridine derivatives, benzimidazole derivatives, imidazopyridine derivatives, metal complexes, and hydrocarbon compounds with fused rings is more preferred.

From the viewpoint of decreasing the driving voltage, the thickness of each of the electron injecting layer and the electron transporting layer is preferably 500 nm or less.

The thickness of the electron transporting layer is preferably from 1 nm to 500 nm, more preferably from 5 nm to 200 nm, and still more preferably from 10 nm to 100 nm. In addition, the thickness of the electron injecting layer is preferably from 0.1 nm to 200 nm, more preferably from 0.2 nm to 100 nm, and still more preferably from 0.5 nm to 50 nm.

The electron injecting layer and the electron transporting layer may have either a single layer structure composed of one kind or two or more kinds of the above-described materials or a multilayer structure composed of a plurality of layers having the same composition or different compositions.

The electron injecting layer preferably contains an electron donating dopant. By incorporating the electron donating dopant in the electron injecting layer, there are effects that, for example, the electron injecting properties are improved, the driving voltage is lowered, and the efficiency is improved. The electron donating dopant may be any one of organic materials and inorganic materials as long as it is capable of giving electrons to the material to be doped and generating radical anions, and examples thereof include dihydroimidazole compounds such as tetrathiafulvalene (TTF), tetrathianaphthacene (TTT), and bis-[1,3-diethyl-2-methyl-1,2-dihydrobenzimidazolyl], lithium, and cesium.

The electron donating dopant in the electron injecting layer is contained in the amount of preferably from 0.01% by mass to 50% by mass, more preferably from 0.1% by mass to 40% by mass, and still more preferably 0.5% by mass to 30% by mass, with respect to the total mass of the compounds forming the electron injecting layer.

(B-2) Hole Blocking Layer

The hole blocking layer is a layer having a function of preventing holes, which have been transported from the anode side to the light emitting layer, from passing through to the cathode side. In the present invention, the hole blocking layer can be provided as an organic layer adjacent to the light emitting layer on the cathode side.

In order that the $S_1$ energy of the organic compound in the film state constituting the hole blocking layer prevents the energy movement of excitons produced in the light emitting layer, and thus, does not lower the luminous efficiency, it is preferably higher than $S_1$ energy of the light emitting material.

As an example of the organic compound constituting the hole blocking layer, for example, the luminescent compound represented by the general formula (1) can be used.

Examples of the organic compounds constituting the hole blocking layer, other than the luminescent compound represented by the general formula (1), include aluminum complexes such as aluminum (III) bis(2-methyl-8-quinolinato)-4-phenylphenolate (abbreviated as BAlq), triazole derivatives, and phenanthroline derivatives such as 2,9-dimethyl-4,7-diphenyl-1,10-phenanthroline (abbreviated as BCP).

The thickness of the hole blocking layer is preferably from 1 nm to 500 nm, more preferably from 3 nm to 100 nm, and still more preferably from 5 nm to 50 nm.

The hole blocking layer may have either a single layer structure composed of one kind or two or more kinds of the above-described materials or a multilayer structure composed of a plurality of layers having the same composition or different compositions.

The material used in the hole blocking layer preferably has higher $S_1$ energy than that of the light emitting material from the viewpoints of color purity, luminous efficiency, and driving durability. The $S_1$ in the film state of the material used in the hole blocking layer is preferably higher than the $S_1$ of the light emitting material by 0.1 eV or more, more preferably by 0.2 eV or more, and still more preferably by 0.3 eV or more.

(B-3) Material which is Particularly Preferably Used in Organic Layer, Preferably Disposed Between Cathode and Light Emitting Layer For the organic electroluminescent element of the present invention, examples of the material which is particularly preferably used in the (B) materials for an organic layer, preferably disposed between the cathode and the light emitting layer include the luminescent compound represented by the general formula (1), a compound represented by the following general formula (P-1), and a compound represented by the following general formula (O-1).

Hereinafter, a compound represented by the general formula (O-1) and a compound represented by the general formula (P-1) will be described.

The organic electroluminescent element of the present invention preferably includes at least one organic layer between the light emitting layer and the cathode, and the organic layer preferably contains at least one of compounds represented by the following general formula (O-1), from the viewpoint of efficiency or driving voltage of an element. Hereinafter, the general formula (O-1) will be described.

[Chem. 44]

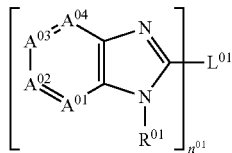

General Formula (O-1)

(In the general formula (O-1), $R^{O1}$ represents an alkyl group, an aryl group, or a heteroaryl group. $A^{O1}$ to $A^{O4}$ each independently represent C—$R^A$ or a nitrogen atom. $R^A$ represents a hydrogen atom, an alkyl group, an aryl group, or a heteroaryl group, and a plurality of $R^A$s may be the same as or different from each other. $L^{O1}$ represents any of divalent to hexavalent linking groups with an aryl ring or a heteroaryl ring. $n^{O1}$ represents an integer of 2 to 6).

$R^{O1}$ represents an alkyl group (preferably having 1 to 8 carbon atoms), an aryl group (preferably having 6 to 30 carbon atoms), or a heteroaryl group (preferably having 4 to 12 carbon atoms), which may have a substituent selected from the Substituent Group A as described above. $R^{O1}$ is preferably an aryl group or a heteroaryl group, and more preferably an aryl group. Preferred examples of the substituent in the case where the aryl group of $R^{O1}$ has a substituent include an alkyl group, an aryl group, and a cyano group, more preferred examples thereof include an alkyl group and an aryl group, and still more preferred examples thereof include an aryl group. In the case where the aryl group of $R^{O1}$ has a plurality of substituents, the plurality of substituents may be bonded to each other to form a 5- or 6-membered ring. The aryl group of $R^{O1}$ is preferably a phenyl group which may have a substituent selected from Substituent Group A, more preferably a phenyl group which may be substituted with an alkyl group or an aryl group, and still more preferably an unsubstituted phenyl group or 2-phenylphenyl group.

$A^{O1}$ to $A^{O4}$ each independently represent C—$R^A$ or a nitrogen atom. It is preferable that 0 to 2 groups out of $A^{O1}$ to $A^{O4}$ be nitrogen atoms; and it is more preferable that 0 or 1 group out of $A^{O1}$ to $A^{O4}$ be nitrogen atoms. It is preferable that all of $A^{O1}$ to $A^{O4}$ be C—$R^A$, or $A^{O1}$ be a nitrogen atom, and $A^{O2}$ to $A^{O4}$ be C—$R^A$; it is more preferable that $A^{O1}$ be a nitrogen atom, and $A^{O2}$ to $A^{O4}$ be C—$R^A$; and it is still more preferable that $A^{O1}$ be a nitrogen atom, $A^{O2}$ to $A^{O4}$ be C—$R^A$, and $R^A$s be all hydrogen atoms.

$R^A$ represents a hydrogen atom, an alkyl group (preferably having 1 to 8 carbon atoms), an aryl group (preferably having 6 to 30 carbon atoms), or a heteroaryl group (preferably having 4 to 12 carbon atoms), which may have a substituent selected from the Substituent Group A as described above. Further, a plurality of $R^A$s may be the same as or different from each other. $R^A$ is preferably a hydrogen atom or an alkyl group, and more preferably a hydrogen atom.

$L^{O1}$ represents any of a divalent to hexavalent linking group including an aryl ring (preferably having 6 to 30 carbon atoms) or a heteroaryl ring (preferably having 4 to 12 carbon atoms). $L^{O1}$ is preferably an arylene group, a heteroarylene group, an aryltriyl group, or a heteroaryltriyl group, more preferably a phenylene group, a biphenylene group, or a benzenetriyl group, and still more preferably a biphenylene group or a benzenetriyl group. $L^{O1}$ may have a substituent selected from the Substituent Group A as described above, and in a case of having the substituent, the substituent is preferably an alkyl group, an aryl group, or a cyano group. Specific examples of $L^{O1}$ include the following.

[Chem. 45]

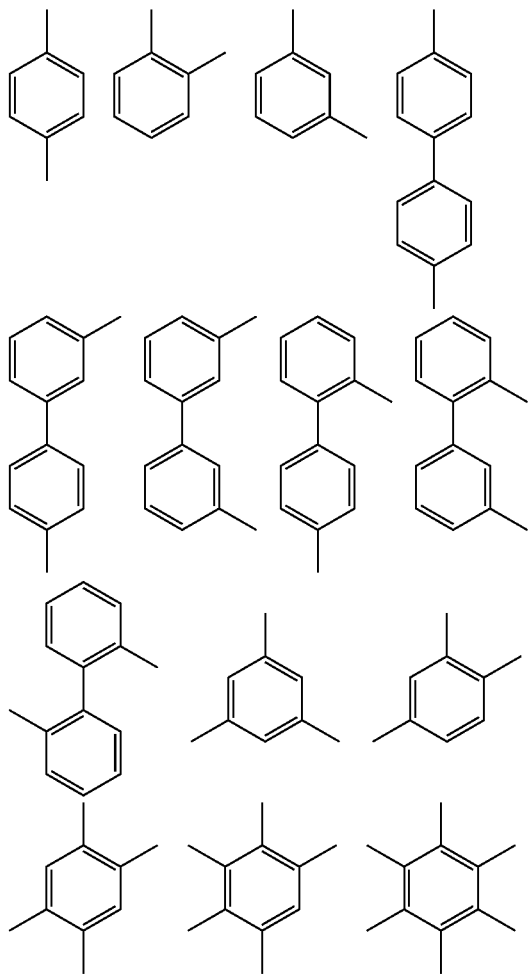

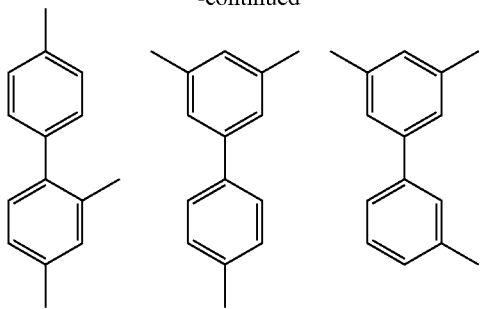
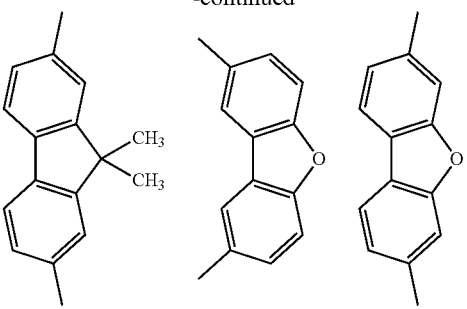

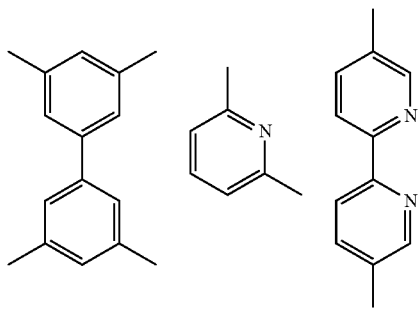
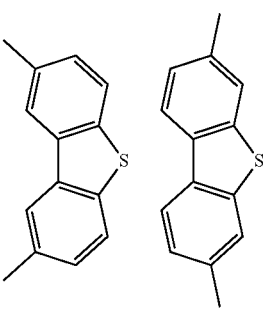

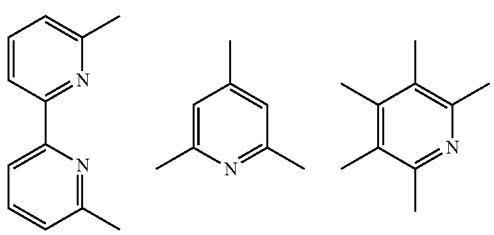
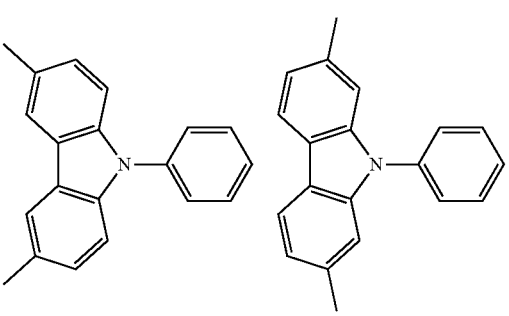

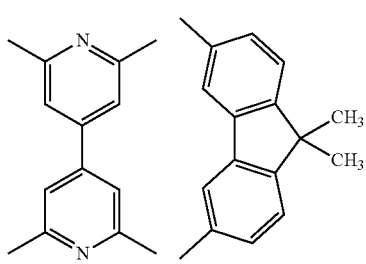

$n^{O1}$ represents an integer of 2 to 6, preferably an integer of 2 to 4, and more preferably 2 or 3. $n^{O1}$ is most preferably 3 from the viewpoint of the efficiency of an element, or most preferably 2 from the viewpoint of the durability of an element.

The glass transition temperature (Tg) of the compound represented by the general formula (O-1) is preferably from 100° C. to 300° C., more preferably from 120° C. to 300° C., still more preferably from 120° C. to 300° C., and even still more preferably from 140° C. to 300° C., from the viewpoint of stability at the time of storage at a high temperature, or stable operation during driving at a high temperature or against heat generation during driving.

Specific examples of the compound represented by the general formula (O-1) are shown below, but the compound represented by the general formula (O-1), which can be used in the present invention, should not be construed to be limited to the specific examples.

[Chem. 46]
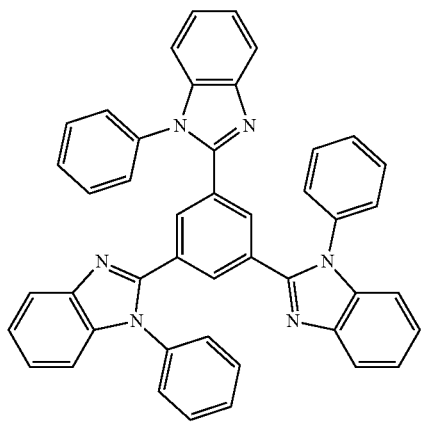 OM-1
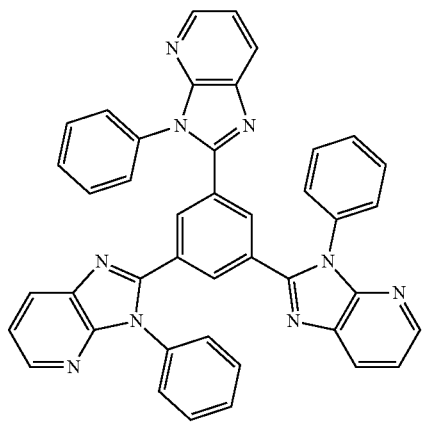 OM-2
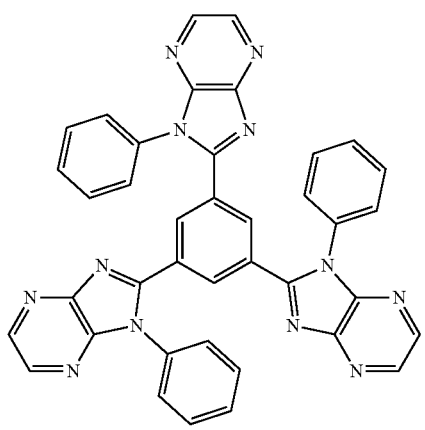 OM-3
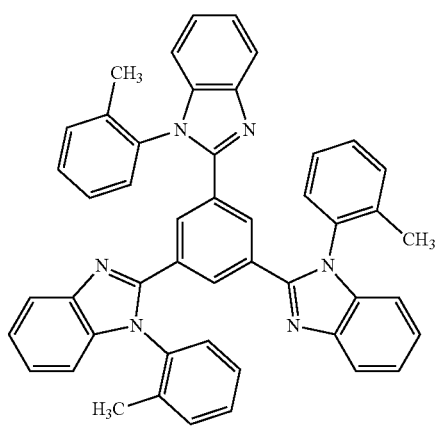 OM-4
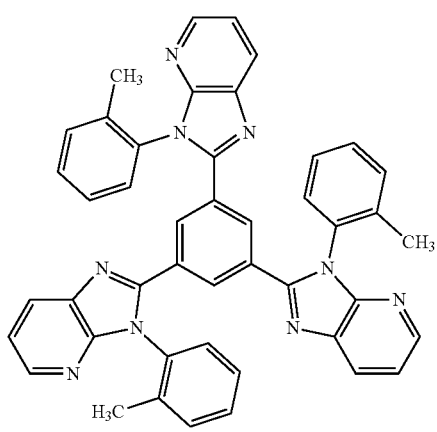 OM-5
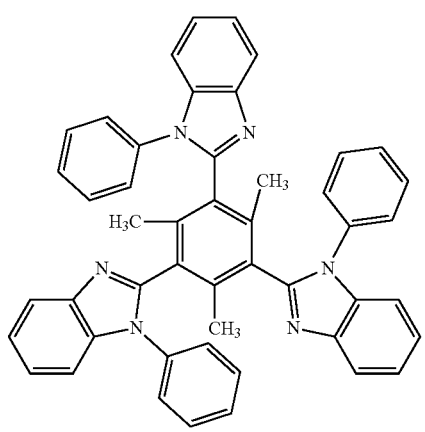 OM-6

-continued
OM-7
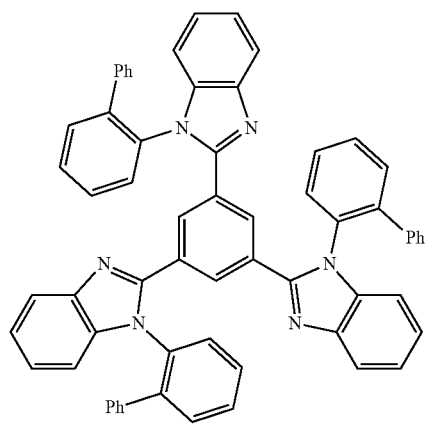
OM-8
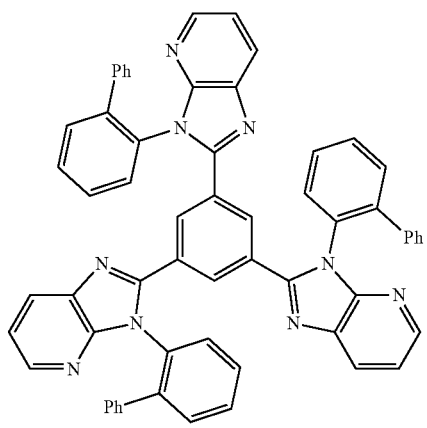
OM-9
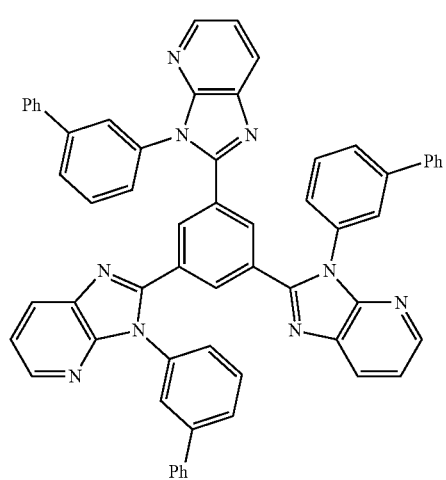
[Chem. 47]
OM-10
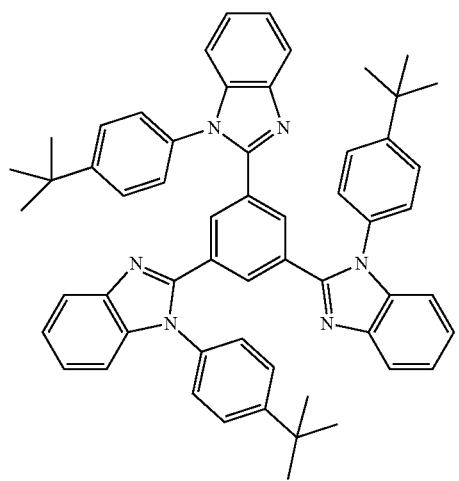
OM-11
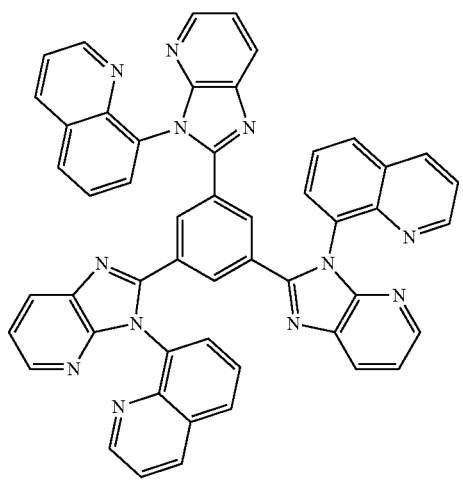

-continued
OM-12
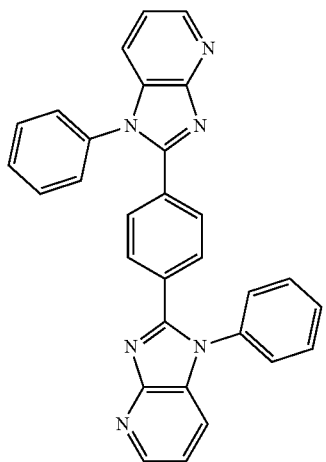
OM-13
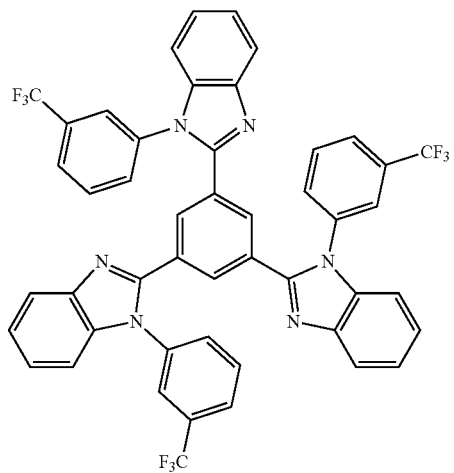
OM-14
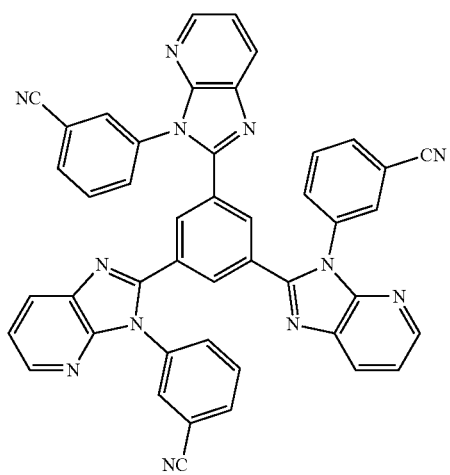
OM-15
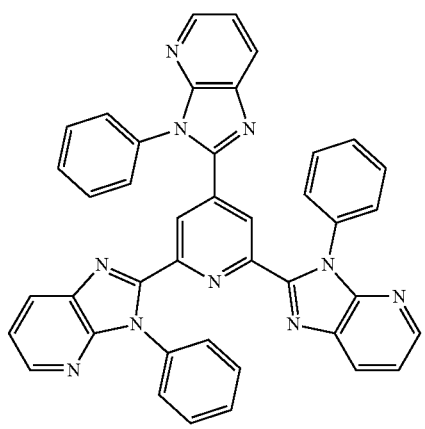
OM-16
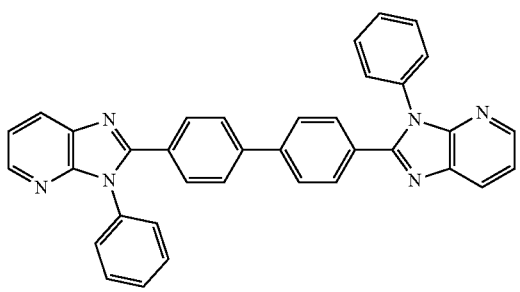
OM-17
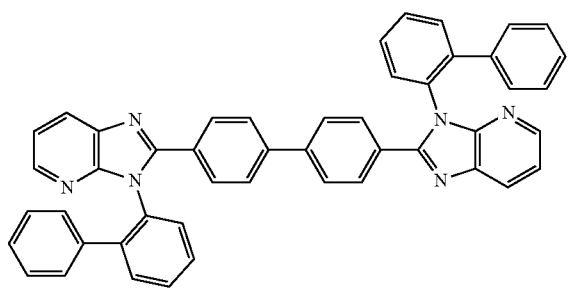
OM-18
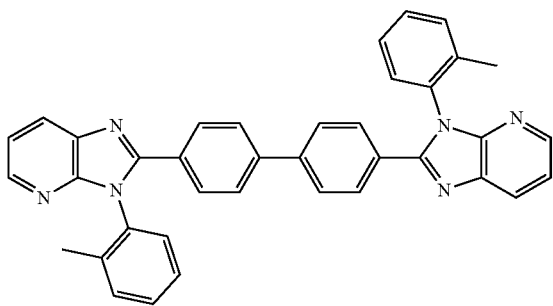
OM-19
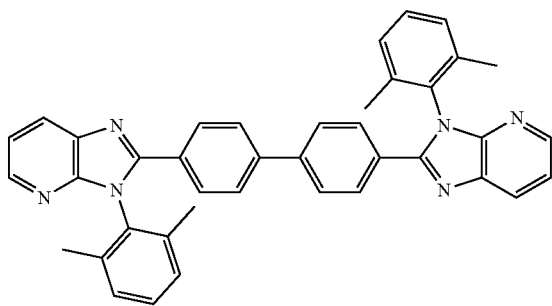

-continued

OM-20

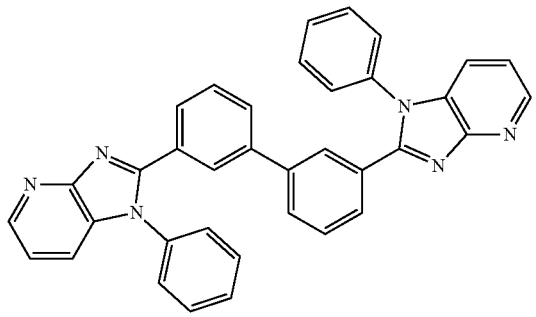

OM-21

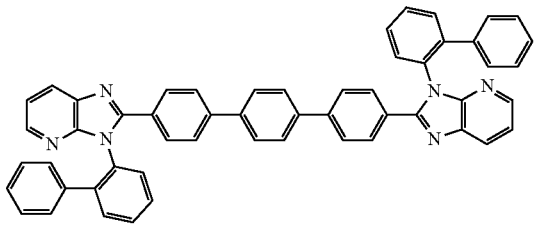

OM-22

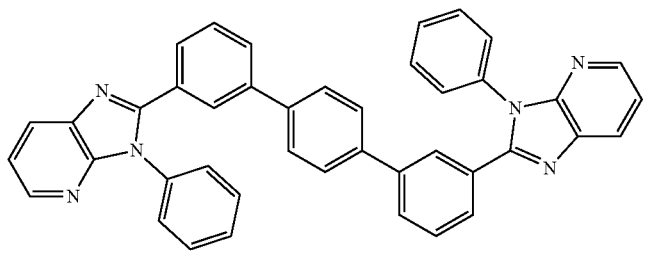

The compound represented by the general formula (O-1) can be synthesized by the method described in JP-A-2001-335776. After the synthesis, purification is preferably carried out by column chromatography, recrystallization, reprecipitation, or the like, and then by sublimation purification. By the sublimation purification, organic impurities can be separated and inorganic salts, residual solvents, moisture, or the like can be removed effectively.

In the organic electroluminescent element of the present invention, the compound represented by the general formula (O-1) is preferably contained in the organic layer between the light emitting layer and the cathode, however, it is more preferably contained in the layer on the cathode side adjacent to the light emitting layer.

The compound represented by the general formula (O-1) is contained in the amount of preferably from 70% by mass to 100% by mass, and more preferably from 85% by mass to 100% by mass, with respect to the total mass of the organic layer added.

The organic electroluminescent element of the present invention preferably includes at least one layer of organic layers between the light emitting layer and the cathode, and it is preferable that the organic layer contain at least one of compounds represented by the following general formula (P), from the viewpoint of efficiency or the driving voltage of an element. Hereinafter, the general formula (P) will be described.

[Chem. 48]

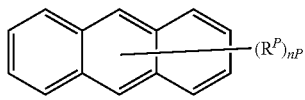

General Formula (P)

(In the general formula (P), $R^P$ represents an alkyl group (preferably having 1 to 8 carbon atoms), an aryl group (preferably having 6 to 30 carbon atoms), or a heteroaryl group (preferably having 4 to 12 carbon atoms), which may have a substituent selected from the Substituent Group A as described above. nP represents an integer of 1 to 10, and in the case where there are a plurality of $R^P$s, these may be the same as or different from each other. At least one of $R^P$s is a substituent represented by the following general formulae (P-1) to (P-3).

[Chem. 49]

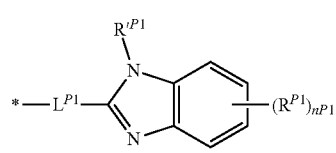

General Formula (P-1)

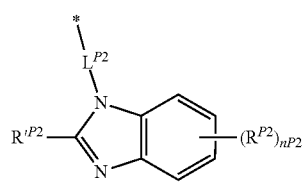

General Formula (P-2)

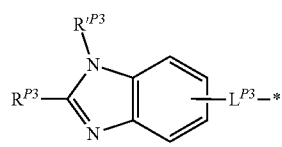

General Formula (P-3)

(In the general formulae (P-1) to (P-3), $R^{P1}$ to $R^{P3}$ and $R^{\prime P1}$ to $R^{\prime P3}$ each represent an alkyl group (preferably having 1 to 8 carbon atoms), an aryl group (preferably having 6 to 30 carbon atoms), or a heteroaryl group (preferably having 4 to 12 carbon atoms), which may have a substituent selected from the Substituent Group A as described above. $n^{P1}$ to $n^{P2}$ each represent an integer of 0 to 4, and in the case where there are a plurality of $R^{P1}$ to $R^{P3}$ and $R^{\prime P1}$ to $R^{\prime P3}$, they may be the same as or different from each other. $L^{P1}$ to $L^{P3}$ represents any one of divalent linking groups consisting of a single bond, an aryl ring, and a heteroaryl ring. * represents a binding position with the anthracene ring of the general formula (P).)

A preferred substituent other than the substituents represented by (P-1) to (P-3) as $R^P$ is an aryl group, more preferred substituent is any one of a phenyl group, a biphenyl group, a terphenyl group, and a naphthyl group, and still more preferred substituent is a naphthyl group.

$R^{P1}$ to $R^{P3}$ and $R'^{P1}$ to $R'^{P3}$ are preferably any one of an aryl group and a heteroaryl group, more preferably an aryl group, still more preferably any one of a phenyl group, a biphenyl group, a terphenyl group, and a naphthyl group, and most preferably a phenyl group.

$L^{P1}$ to $L^{P3}$ are preferably any one of divalent linking groups consisting of a single bond and an aryl ring, more preferably any one of a single bond, phenylene, biphenylene, terphenylene, and naphthylene, and still more preferably any one of a single bond, phenylene, and naphthylene.

Specific examples of the compound represented by the general formula (P) are shown below, but it should not construed that the compound represented by the general formula (P) that can be used in the present invention is limited to the specific examples.

[Chem. 50]

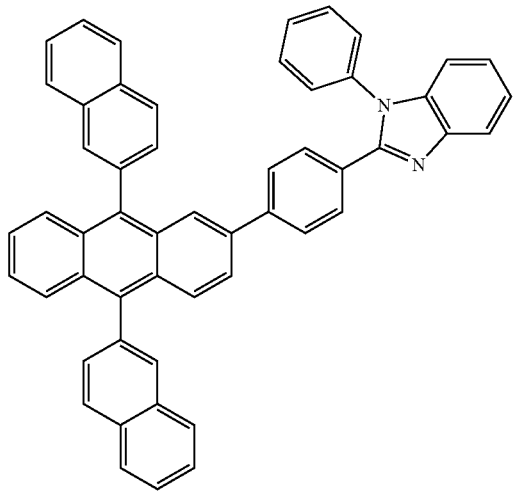

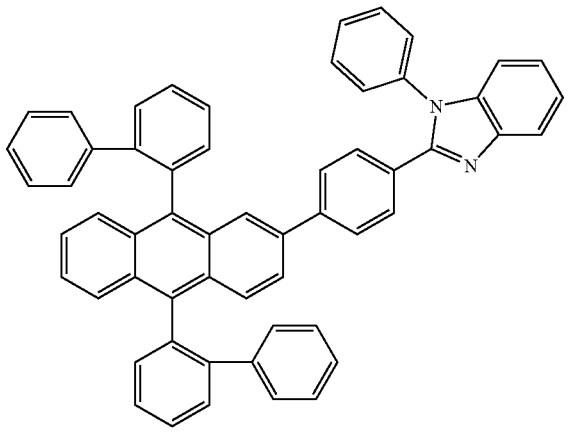

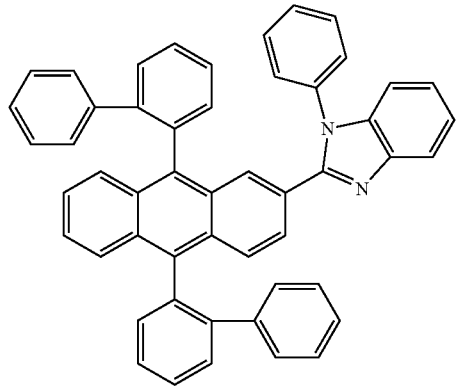

-continued
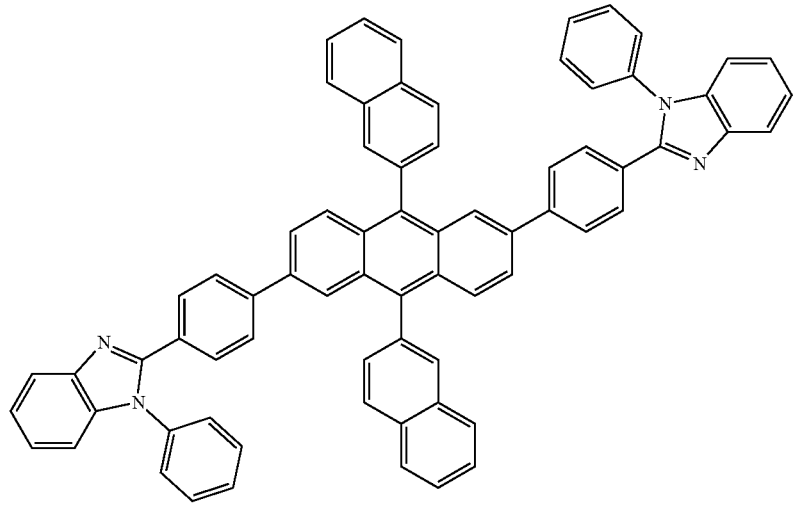
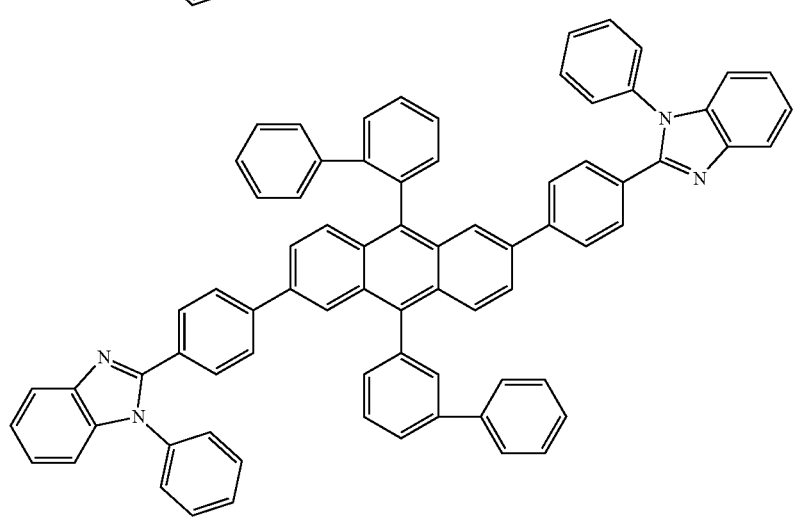
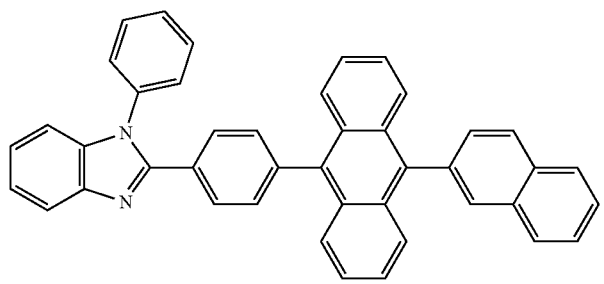
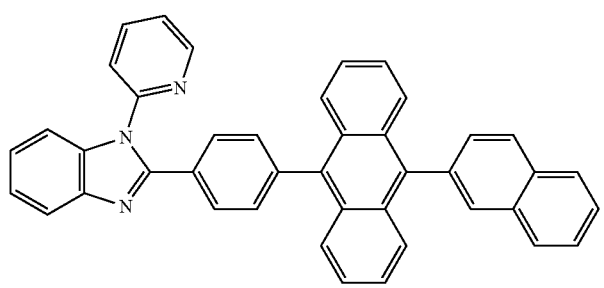

-continued

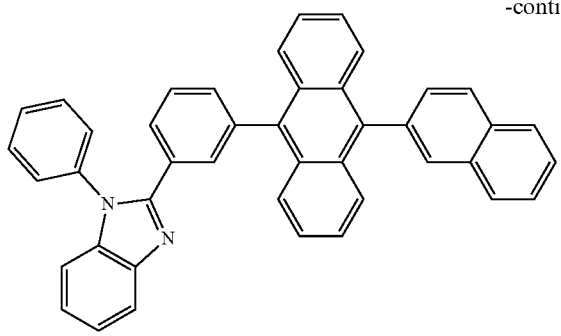

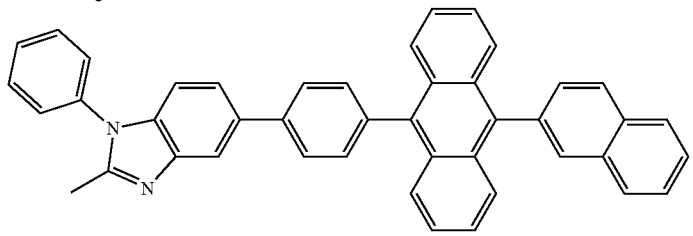

[Chem. 51]

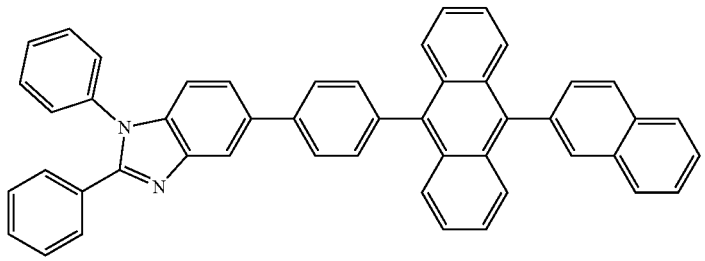

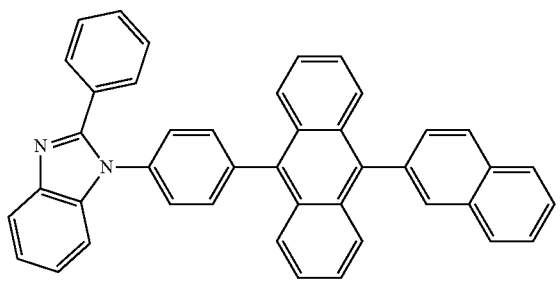
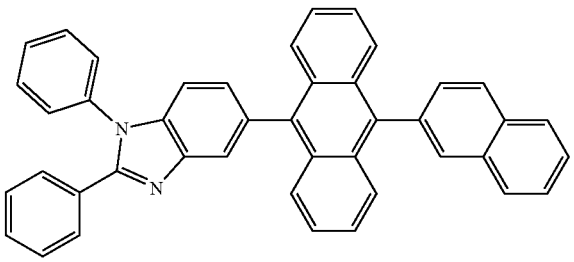

The compound represented by the general formula (P) can be synthesized by the method described in WO 2003/060956 and WO 2004/080975. After the synthesis, purification is preferably carried out by column chromatography, recrystallization, reprecipitation, or the like, and then by sublimation purification. By the sublimation purification, organic impurities can be separated and inorganic salts, residual solvents, moisture, or the like can be removed effectively.

In the organic electroluminescent element of the present invention, the compound represented by the general formula (P) is preferably contained in the organic layer between the light emitting layer and the cathode, and more preferably contained in the layer adjacent to the cathode.

The compound represented by the general formula (P) is contained in the amount of preferably from 70% by mass to 100% by mass, and more preferably from 85% by mass to 100% by mass, with respect to the total mass of the organic layer added.

Preferred examples of the other material used in the electron injecting layer or the electron transporting layer in the organic electroluminescent element of the present invention include silole compounds described in JP-A-09-194487 or the like, phosphineoxide compounds described in JP-A-2006-73581 or the like, nitrogen-containing aromatic 6-membered ring hetero compounds described in JP-A-2005-276801, JP-A-2006-225320, WO 2005/085387, or the like, compounds having nitrogen-containing aromatic 6-membered hetero structures and carbazole structures, described in WO 2003/080760, WO 2005/085387, or the like, and aromatic hydrocarbon compounds described in US2009/0009065, WO 2010/134350, JP-T-2010-535806, or the like (naphthalene compounds, anthracene compounds, triphenylene compounds, phenanthrene compounds, pyrene compounds, fluoranthene compounds, and the like).

<Protective Layer>

In the present invention, the entirety of the organic electroluminescent element may be protected by a protective layer.

For the protective layer, the detailed descriptions in paragraph Nos. [0169] to [0170] of JP-A-2008-270736 can be applied to the present invention. Incidentally, the materials for the protective layer may be either an inorganic material or an organic material.

<Sealing Enclosure>

For the organic electroluminescent element according to the present invention, the entirety of the element may be sealed using a sealing enclosure.

For the sealing enclosure, the detailed description in paragraph No. [0171] of JP-A-2008-270736 can be applied to the present invention.

<Driving Method>

The organic electroluminescent element of the present invention can emit light by applying a direct current (it may contain an alternate current component, if necessary) voltage (typically from 2 volts to 15 volts) or a direct current between the anode and the cathode.

As a driving method of the organic electroluminescent element of the present invention, driving methods described in each of the publications of JP-A-2-148687, JP-A-6-301355, JP-A-5-29080, JP-A-7-134558, JP-A-8-234685, and JP-A-8-241047, Japanese Patent No. 2784615, and U.S. Pat. Nos. 5,828,429 and 6,023,308 can be applied.

The external quantum efficiency of the organic electroluminescent element of the present invention is preferably 5% or more, more preferably 6% or more, and still more preferably 7% or more. As to the numerical value of the external quantum efficiency, a maximum value of the external quantum efficiency obtained when the organic electroluminescent element is driven at 20° C., or a value of the external quantum efficiency in the vicinity of from 300 cd/m$^2$ to 400 cd/m$^2$ obtained when the element is driven at 20° C. can be employed.

The internal quantum efficiency of the organic electroluminescent element of the present invention is preferably 30% or more, more preferably 50% or more, and still more preferably 70% or more. The internal quantum efficiency of the element is calculated by dividing the external quantum efficiency by the light extraction efficiency. The light extraction efficiency in usual organic EL elements is about 20%, but by adjusting the shape of a substrate, the shape of an electrode, the thickness of an organic layer, the thickness of an inorganic layer, the refractive index of an organic layer, the refractive index of an inorganic layer, or the like, it is possible to increase the light extraction efficiency to 20% or more.

<Light Emitting Wavelength>

In the organic electroluminescent element of the present invention, its light emitting wavelength is not limited, but is preferably used for blue or white light emission. Above all, in the organic electroluminescent element of the present invention, the luminescent compound represented by the general formula (1) is preferably used as a light emitting material to emit fluorescent light, and particularly preferably to emit blue light.

<Use of Organic Electroluminescent Element of the Present Invention>

The organic electroluminescent element of the present invention can be suitably used for display elements, displays, backlights, electrophotography, illumination light sources, recording light sources, exposure light sources, readout light sources, signs, billboards, interior decorations, optical communications, and the like, and particularly preferably for devices driven in a region of high-intensity luminescence, such as a light emitting device, an illumination device, and a display device.

[Light Emitting Device]

The light emitting device of the present invention includes the organic electroluminescent element of the present invention.

Next, the light emitting device of the present invention will be described with reference to FIG. 2.

The light emitting device of the present invention is formed by using the organic electroluminescent element.

Figure 2:
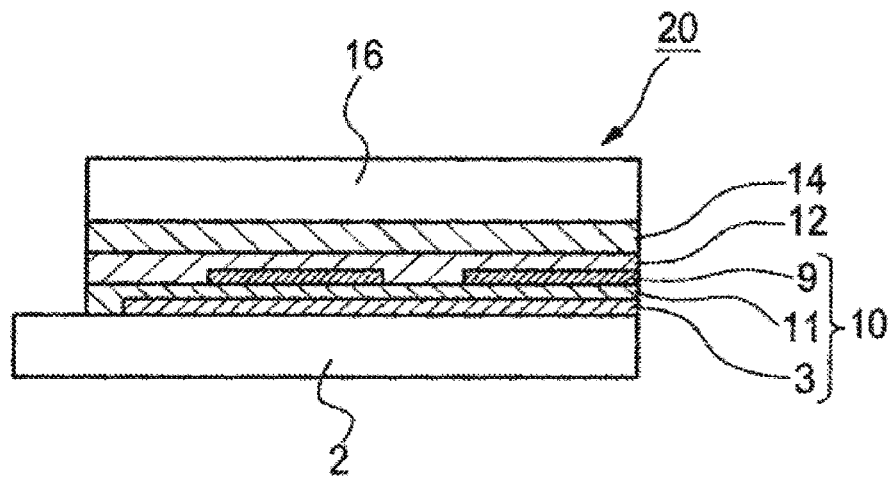
FIG. 2 is a schematic view showing one example of a light emitting device according to the present invention.

FIG. 2 is a cross-sectional view schematically showing one example of the light emitting device of the present invention. The light emitting device 20 in FIG. 2 includes a transparent substrate 2 (supporting substrate), an organic electroluminescent element 10, a sealing enclosure 16, and the like.

The organic electroluminescent element 10 is formed by laminating on the substrate 2 an anode 3 (first electrode), an organic layer 11, and a cathode 9 (second electrode) in this order. In addition, a protective layer 12 is laminated on the cathode 9, and the sealing enclosure 16 is further provided via an adhesive layer 14 on the protective layer 12. Incidentally, a part of each of the electrodes 3 and 9, a diaphragm, an insulating layer, and the like are omitted.

Here, a photocurable adhesive such as an epoxy resin, or a thermosetting adhesive can be used for the adhesive layer 14, and for example, a thermosetting adhesive sheet may also be used.

The light emitting device of the present invention is not particularly limited in its use, and it can be used as not only an illumination device but also a display device of a television set, a personal computer, a mobile phone, electronic paper, or the like.

[Illumination Device]

The illumination device of the present invention includes the organic electroluminescent element of the present invention.

Next, the illumination device of the present invention will be described with reference to FIG. 3.

Figure 3:
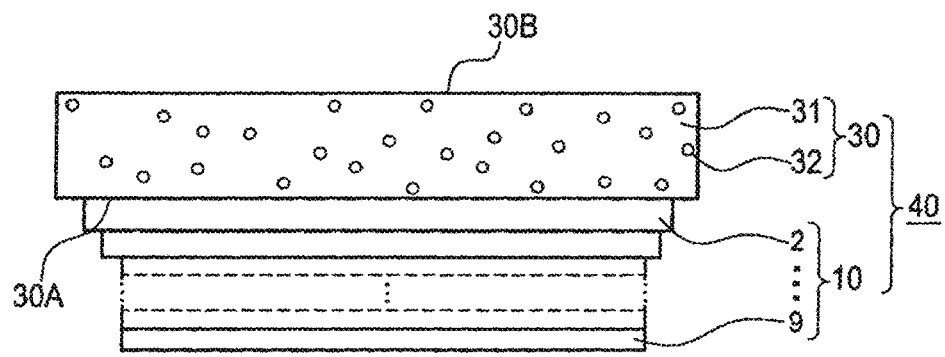
FIG. 3 is a schematic view showing one example of an illumination device according to the present invention.

FIG. 3 is a cross-sectional view schematically showing one example of the illumination device of the present invention. The illumination device 40 of the present invention includes, as shown in FIG. 3, the above-described organic EL element 10 and a light scattering member 30. More specifically, the illumination device 40 is configured such that the substrate 2 of the organic EL element 10 and the light scattering member 30 are in contact with each other.

The light scattering member 30 is not particularly limited as long as it can scatter light, but in FIG. 3, a member obtained by dispersing fine particles 32 in a transparent substrate 31 is used. Suitable examples of the transparent substrate 31 include a glass substrate, and suitable examples of the fine particles 32 include transparent resin fine particles. As the glass substrate and the transparent resin fine particles, a known product can be used for both. In such an illumination device 40, when light emitted from the organic electroluminescent element 10 is incident on the light incident surface 30A of the scattering member 30, the incident light is scattered by the light scattering member 30 and the scattered light is output as illuminating light from the light output surface 30B.

[Display Device]

The display device of the present invention may include the organic electroluminescent element of the present invention.

The display device of the present invention may be used for, for example, a display device of a television set, a personal computer, a mobile phone, electronic paper, or the like.

EXAMPLES

Hereinafter, the characteristic features of the present invention are described in more detail with reference to the following Examples and Comparative Examples. The materials, use amounts, ratios, treatment details, treatment procedures, and the like shown in the following Examples can be appropriately modified so far as the gist of the present invention is not deviated. Accordingly, it should not be construed that the scope of the present invention is limited to the specific examples shown below.

Example 1

1. Synthesis of Luminescent Compound Represented by General Formula (1)

The luminescent compound represented by the general formula (1) (light emitting material for an organic electroluminescent element) can be synthesized by a combination of known reactions. Representative examples of the specific synthesis procedure of the luminescent compound represented by the general formula (1) will be described below.

(Synthesis of Light Emitting Material 1)

[Chem. 52]

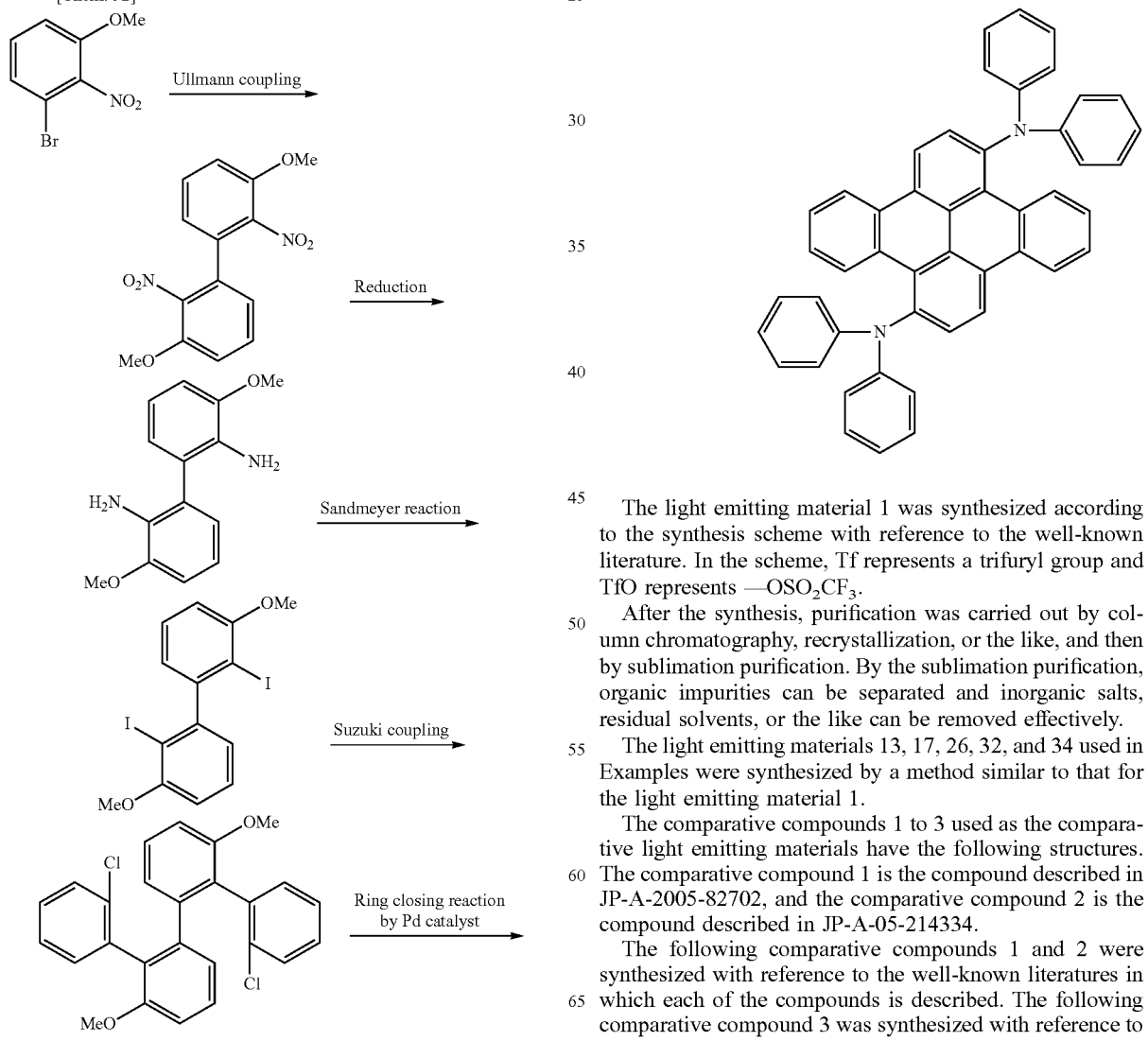

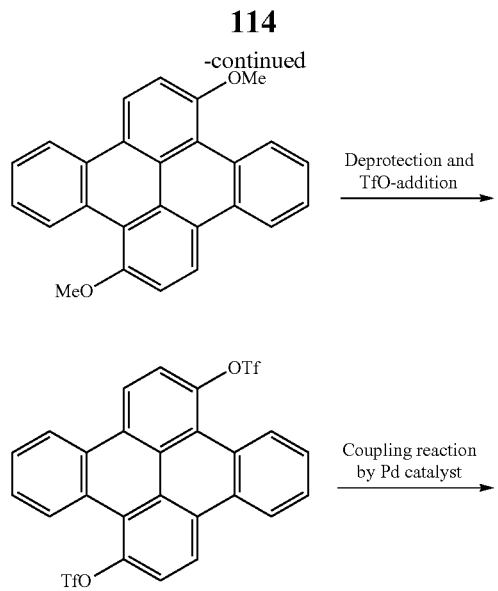

The light emitting material 1 was synthesized according to the synthesis scheme with reference to the well-known literature. In the scheme, Tf represents a trifuryl group and TfO represents —OSO$_2$CF$_3$.

After the synthesis, purification was carried out by column chromatography, recrystallization, or the like, and then by sublimation purification. By the sublimation purification, organic impurities can be separated and inorganic salts, residual solvents, or the like can be removed effectively.

The light emitting materials 13, 17, 26, 32, and 34 used in Examples were synthesized by a method similar to that for the light emitting material 1.

The comparative compounds 1 to 3 used as the comparative light emitting materials have the following structures. The comparative compound 1 is the compound described in JP-A-2005-82702, and the comparative compound 2 is the compound described in JP-A-05-214334.

The following comparative compounds 1 and 2 were synthesized with reference to the well-known literatures in which each of the compounds is described. The following comparative compound 3 was synthesized with reference to JP-A-2004-204238.

[Chem. 53]

Comparative compound 1

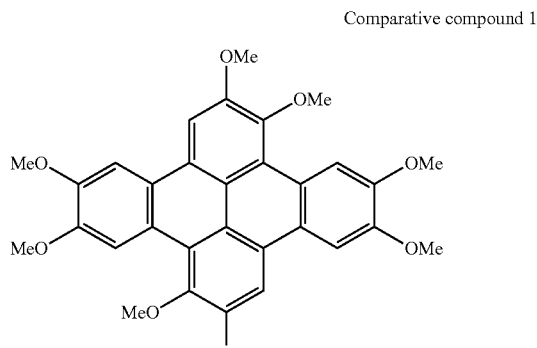

Comparative compound 2

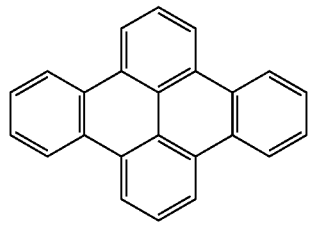

Comparative compound 3

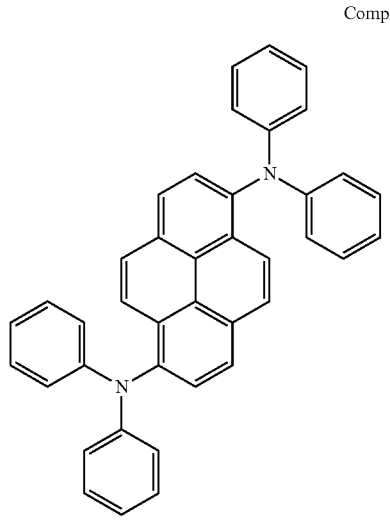

2. Evaluation of Physical Properties of Materials
(a) Evaluation of Chromaticity The following host material H-5 and each of light emitting materials described in Table 1 below were deposited on a 25 mm×25 mm×0.7 mm quartz glass substrate by a vacuum deposition method in a mass ratio (93:7), thereby forming a thin film having a film thickness of 50 nm. The obtained film was irradiated with UV rays of 350 nm to emit light. The luminous spectrum at a time of light emission was measured using a fluorescent spectrophotometer (FP-6300, manufactured by JASCO Corporation) and the chromaticity (x, y) was determined. Based on the y values at that time, the chromaticity was evaluated as the following 3 grades. The results are shown in Table 1 below.

A $0.04 \leq y \leq 0.15$
B $0.03 \leq y < 0.04$, $0.15 < y \leq 0.20$
C $y < 0.03$, $0.20 < y$

[Chem. 54]

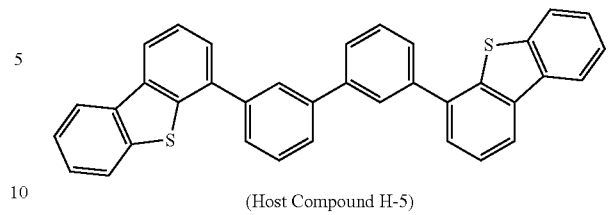

(Host Compound H-5)

TABLE 1

| Light emitting material | Chromaticity | Note |
|---|---|---|
| 1 | A | The present invention |
| 13 | A | The present invention |
| 17 | A | The present invention |
| 26 | B | The present invention |
| 32 | A | The present invention |
| 34 | A | The present invention |
| Comparative compound 1 | B | Comparative Example |
| Comparative compound 2 | C | Comparative Example |
| Comparative compound 3 | C | Comparative Example |

(b) Evaluation of Heat Resistance 10 mg of each of the light-emitting materials described in Table 2 below was vacuum-sealed in a glass tube having an inner diameter of 5 mm and a total length of 50 mm to prepare a sample tube. The obtained sample tube was heated at a sublimation temperature of +50° C., as determined by thermogravimetric analysis, for 24 hours and the purity of the sample before and after heating was determined by HPLC. At this time, the heat resistance was evaluated as the following 2 grades, based on the decomposition amount of the sample. The results are shown in Table 2 below.

A: Decomposition amount>10%
B: Decomposition amount≤10%

TABLE 2

| Light emitting material | Heat resistance | Note |
|---|---|---|
| 1 | A | The present invention |
| 17 | A | The present invention |
| 26 | A | The present invention |
| 32 | A | The present invention |
| 34 | A | The present invention |
| Comparative compound 1 | B | Comparative Example |
| Comparative compound 2 | A | Comparative Example |
| Comparative compound 3 | A | Comparative Example |

From Tables 1 and 2 above, it could be seen that the light emitting material for an organic electroluminescent element of the present invention has good chromaticity and heat resistance.

Meanwhile, it could also be seen that the number of hydrogen atoms or deuterium atoms in $R^1$ to $R^{14}$ of the general formula (1) is 6, and the comparative compound 1 described in JP-A-2005-82702, which has the number below the lower limit of the range in the present invention, has poor heat resistance as a light emitting material for an organic electroluminescent element.

It could be seen that the number of hydrogen atoms or deuterium atoms in $R^1$ to $R^{14}$ of the general formula (1) is 14, and the comparative compound 2 described in JP-A-05-2143334, which has the number above the upper limit of the range in the present invention has poor chromaticity as a light emitting material for an organic electroluminescent element.

It could be seen that the comparative compound 3 having no skeleton of the general formula (1) has poor chromaticity as a light emitting material for an organic electroluminescent element.

<Fabrication and Evaluation of Organic Electroluminescent Elements>

The materials used for the fabrication of organic electroluminescent elements were all subjected to sublimation purification and it was confirmed that the purity (absorption intensity area ratio at 254 nm) was 99.9% or more by using high performance liquid chromatography (TSKgel ODS-100Z, manufactured by Tosoh Corporation).

The structures of the materials other than the light emitting materials used for the fabrication of the organic electroluminescent element in each of Examples and Comparative Examples are shown below.

[Chem. 55]

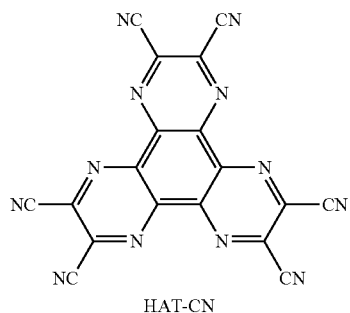
HAT-CN

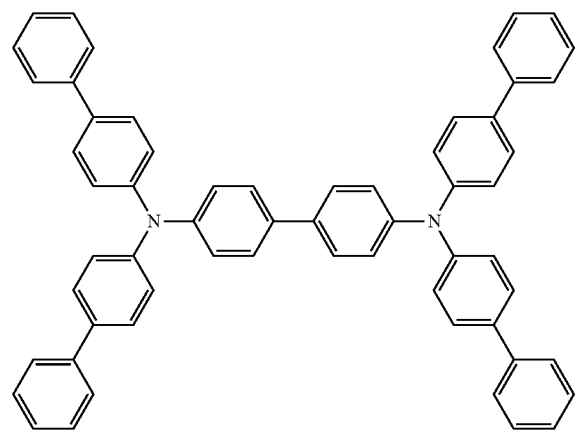
HT-3

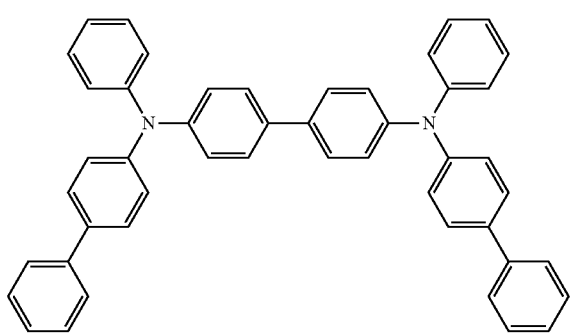
HT-1

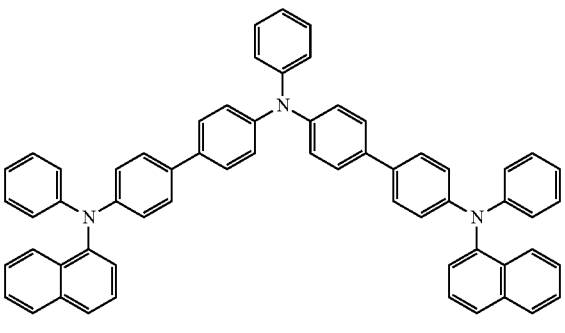
HT-4

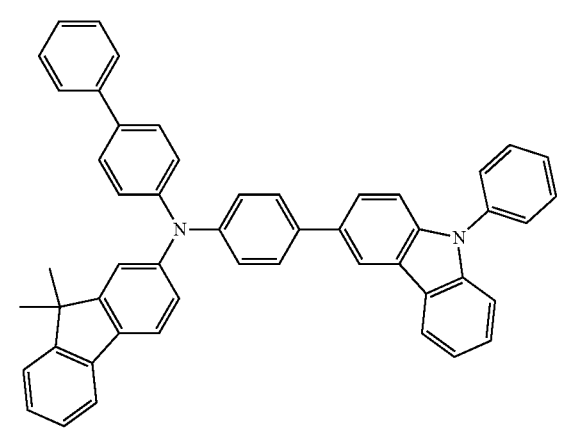
HT-2

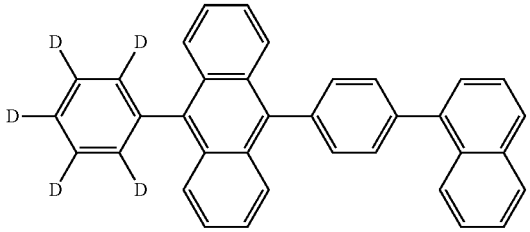
H-1

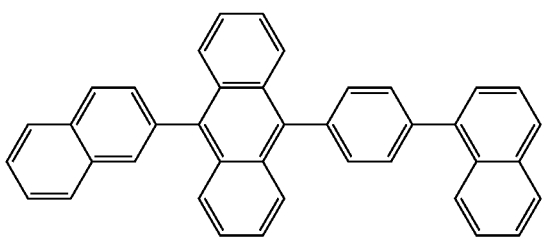
H-2

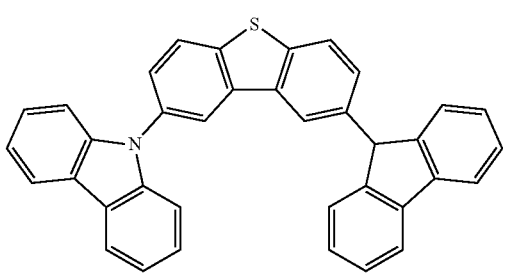
H-3

-continued

H-4

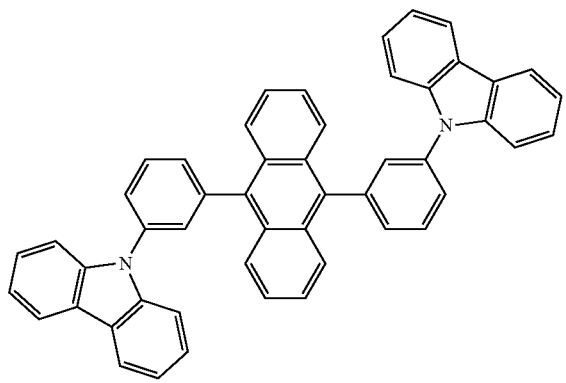

ET-1

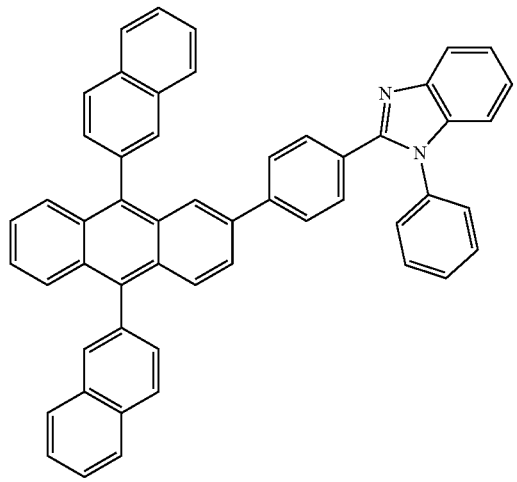

ET-2

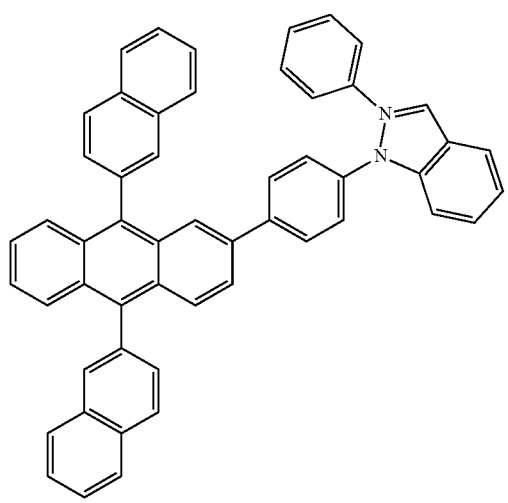

-continued

ET-3

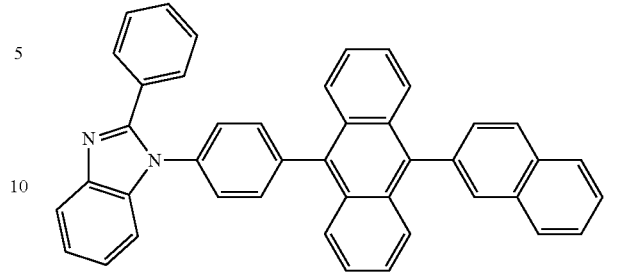

ET-4

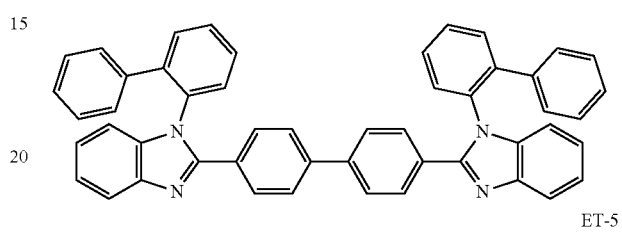

ET-5

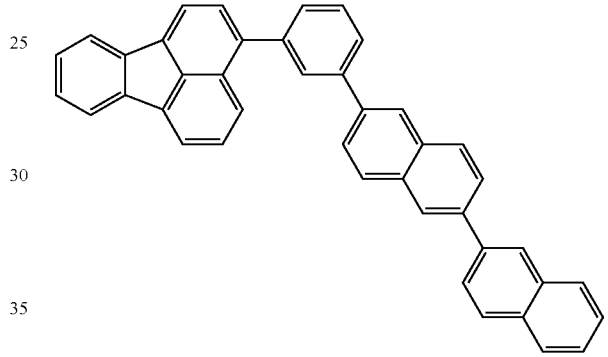

Example 2

A 0.5 mm-thick and 2.5 cm square glass substrate (manufactured by Geomatec Co., Ltd., surface resistance: 10Ω/□) having an ITO film thereon was put in a cleaning container. After ultrasonic cleaning in 2-propanol, the glass substrate was subjected to a UV-ozone treatment for 30 minutes. The following organic compound layers were deposited sequentially on this transparent anode (ITO film) by a vacuum deposition method.

Furthermore, the deposition rates in Examples and Comparative Examples below are 0.1 nm/sec unless otherwise indicated. The deposition rates were measured using a quartz crystal oscillator. Further, the thickness of each of the layers below was measured using the quartz crystal oscillator.

First layer: HAT-CN: Film thickness of 10 nm
Second layer: HT-2: Film thickness of 30 nm
Third layer: H-1 and the light emitting material described in Table 3 (mass ratio=95:5): Film thickness of 30 nm
Fourth layer: ET-1: Film thickness of 30 nm 1 nm of lithium fluoride and 100 nm of metallic aluminum were deposited in this order thereon, thereby forming a cathode. At this time, a patterned mask (mask having a light emitting area of 2 mm×2 mm) was placed on the layer of lithium fluoride, and the metallic aluminum was deposited.

The obtained laminate was put in a glove box purged with a nitrogen gas without bringing it into contact with the atmosphere and then sealed with a sealing can made of glass and an ultraviolet ray-curable adhesive (XNR5516HV, manufactured by Nagase-Chiba, Ltd.), thereby obtaining organic electroluminescent elements 1-1 to 1-5, and comparative organic electroluminescent elements 1-1 to 1-3, each having a light emitting area in a 2 mm×2 mm square. Light emission derived from the light emitting material was observed in each of the elements. For each of the obtained organic electroluminescent elements, the following tests were carried out. The results of the evaluation from the viewpoints of the luminous efficiency (external quantum efficiency) and the chromaticity are shown in Table 3 below.

(a) External Quantum Efficiency

Light was emitted by applying a direct current voltage to each of the elements by using a source measure unit 2400 manufactured by Keithley Instruments Inc., and the luminance was measured using a luminance meter (BM-8 manufactured by Topcon Corporation). The luminous spectrum and the light emitting wavelength were measured using a spectrum analyzer (PMA-11 manufactured by Hamamatsu Photonics K. K.). Based on these values, the external quantum efficiency (η) at a luminance in the vicinity of 1,000 cd/m$^2$ was calculated by using a luminance conversion method, and is expressed as a relative value, taking the value of the organic electroluminescent element 1-1 using the light emitting material 1 as 1.0. Larger numeral values are preferable because larger numeral values indicate better efficiency.

(b) Chromaticity

From the luminous spectrum at a time of light emission by applying a direct current voltage to each of the organic electroluminescent elements to give a luminance of 1000 cd/m$^2$, the chromaticity (x, y) was determined. From the y values at that time, the chromaticity was evaluated as the following 3 grades.

A $0.04 \leq y \leq 0.15$
B $0.03 \leq y < 0.04$, $0.15 < y \leq 0.20$
C $y < 0.03$, $0.20 < y$

TABLE 3

| Element No. | Light emitting material | External quantum efficiency | Chromaticity | Note |
|---|---|---|---|---|
| Element 1-1 | 1 | 1.0 | A | The present invention |
| Element 1-2 | 13 | 0.9 | A | The present invention |
| Element 1-3 | 17 | 0.8 | A | The present invention |
| Element 1-4 | 32 | 0.8 | A | The present invention |
| Element 1-5 | 34 | 1.0 | A | The present invention |
| Comparative element 1-1 | Comparative compound 1 | 0.3 | B | Comparative Example |
| Comparative element 1-2 | Comparative compound 2 | Host material emits light | C | Comparative Example |
| Comparative element 1-3 | Comparative compound 3 | 1.0 | C | Comparative Example |

Example 3

Organic electroluminescent elements 2-1 to 2-5 and comparative elements 2-1 to 2-3 were fabricated in the same manner as in Example 2, except that the layer configurations were changed as follows, and evaluations were carried out in the same manner as in Example 2. The results are shown in Table 4 below. Further, the external quantum efficiency in Table 4 below is expressed as a relative value, taking the value of the organic electroluminescent element 2-1 using the light emitting material 1 as 1.0.

First layer: HT-4: Film thickness of 50 nm
Second layer: HT-3: Film thickness of 45 nm
Third layer: H-2 and the light emitting material described in Table 4 below (mass ratio=95:5): Film thickness of 25 nm
Fourth layer: ET-5: Film thickness of 5 nm
Fifth layer: ET-3: Film thickness of 20 nm

TABLE 4

| Element No. | Light emitting material | external quantum efficiency | Chromaticity | Note |
|---|---|---|---|---|
| Element 2-1 | 1 | 1.0 | A | The present invention |
| Element 2-2 | 13 | 0.9 | A | The present invention |
| Element 2-3 | 17 | 0.8 | A | The present invention |
| Element 2-4 | 32 | 0.8 | A | The present invention |
| Element 2-5 | 34 | 1.0 | A | The present invention |
| Comparative element 2-1 | Comparative compound 1 | 0.3 | B | The present invention |
| Comparative element 2-2 | Comparative compound 2 | Host material emits light | C | Comparative Example |
| Comparative element 2-3 | Comparative compound 3 | 1.0 | C | Comparative Example |

Example 4

Organic electroluminescent elements 3-1 to 3-5 and comparative elements 3-1 to 3-3 were fabricated in the same manner as in Example 2, except that the layer configurations were changed as follows, and evaluations were carried out in the same manner as in Example 2. The results are shown in Table 5 below. Further, the external quantum efficiency in Table 5 below is expressed as a relative value, taking the value of the organic electroluminescent element 3-1 using the light emitting material 1 as 1.0.

First layer: HAT-CN: Film thickness of 10 nm
Second layer: HT-2: Film thickness of 30 nm
Third layer: H-1 and the light emitting material described in Table 5 below (mass ratio=95:5): Film thickness of 30 nm
Fourth layer: ET-4: Film thickness of 30 nm

TABLE 5

| Element No. | Light emitting material | External quantum efficiency | Chromaticity | Note |
|---|---|---|---|---|
| Element 3-1 | 1 | 1.0 | A | The present invention |
| Element 3-2 | 13 | 0.9 | A | The present invention |
| Element 3-3 | 17 | 0.9 | A | The present invention |
| Element 3-4 | 32 | 0.8 | A | The present invention |
| Element 3-5 | 34 | 1.0 | A | The present invention |
| Comparative element 3-1 | Comparative compound 1 | 0.3 | B | The present invention |
| Comparative element 3-2 | Comparative compound 2 | Host material emits light | C | Comparative Example |
| Comparative element 3-3 | Comparative compound 3 | 1.0 | C | Comparative Example |

Example 5

Organic electroluminescent elements 4-1 to 4-6 and comparative elements 3-1 to 3-3 were fabricated in the same manner as in Example 2, except that the layer configurations were changed as follows, and evaluations were carried out in the same manner as in Example 2. The results are shown in Table 6 below. Further, the external quantum efficiency in Table 6 below is expressed as a relative value, taking the value of the organic electroluminescent element 4-1 using the light emitting material 1 as 1.0.

First layer: HAT-CN: Film thickness of 10 nm
Second layer: HT-1: Film thickness of 30 nm
Third layer: H-3 and the light emitting material described in Table 6 (mass ratio=95:5): Film thickness of 30 nm
Fourth layer: ET-4: Film thickness of 30 nm

TABLE 6

| Element No. | Light emitting material | External quantum efficiency | Chromaticity | Note |
|---|---|---|---|---|
| Element 4-1 | 1 | 1.0 | A | The present invention |
| Element 4-2 | 13 | 0.8 | A | The present invention |
| Element 4-3 | 17 | 1.0 | A | The present invention |
| Element 4-4 | 26 | 0.5 | B | The present invention |
| Element 4-5 | 32 | 0.9 | A | The present invention |
| Element 4-6 | 34 | 0.9 | A | The present invention |
| Comparative element 4-1 | Comparative compound 1 | 0.4 | B | Comparative Example |
| Comparative element 4-2 | Comparative compound 2 | 0.3 | C | Comparative Example |
| Comparative element 4-3 | Comparative compound 3 | 0.9 | C | Comparative Example |

Example 6

Organic electroluminescent elements 5-1 to 5-5 and comparative elements 5-1 to 5-3 were fabricated in the same manner as in Example 2, except that the layer configurations were changed as follows, and evaluations were carried out in the same manner as in Example 2. The results are shown in Table 7 below. Further, the external quantum efficiency in Table 7 below is expressed as a relative value, taking the value of the organic electroluminescent element 5-1 using the light emitting material 1 as 1.0.

First layer: HAT-CN: Film thickness of 10 nm
Second layer: HT-2: Film thickness of 30 nm
Third layer: H-4 and the light emitting material described in Table 7 below (mass ratio=95:5): Film thickness of 30 nm
Fourth layer: ET-2: Film thickness of 30 nm

TABLE 7

| Element No. | Light emitting material | External quantum efficiency | Chromaticity | Note |
|---|---|---|---|---|
| Element 5-1 | 1 | 1.0 | A | The present invention |
| Element 5-2 | 13 | 0.9 | A | The present invention |
| Element 5-3 | 17 | 0.9 | A | The present invention |
| Element 5-4 | 32 | 0.8 | A | The present invention |
| Element 5-5 | 34 | 1.0 | A | The present invention |
| Comparative element 5-1 | Comparative compound 1 | 0.3 | B | Comparative Example |
| Comparative element 5-2 | Comparative compound 2 | Host material emits light | C | Comparative Example |
| Comparative element 5-3 | Comparative compound 3 | 1.0 | C | Comparative Example |

Example 7

(Evaluation of Organic Electroluminescent Element (Coating))
—Preparation of Light Emitting Layer-Forming Coating Liquids—

The light emitting material 1 (0.1% by mass) and a host material PH-1 having the following structure (0.9% by mass) were mixed with methyl ethyl ketone (98.99% by mass) to obtain a light emitting layer-forming coating liquid 1.

In the same manner as for the light emitting layer-forming coating liquid 1, except that the light emitting material 1 was changed to a light emitting material 13 and a light emitting material 34, respectively, in the light emitting layer-forming coating liquid 1, light emitting layer-forming coating liquids 2 and 3 were prepared.

In addition, in the same manner as for the light emitting layer-forming coating liquids 1 to 3, except that the host material PH-1 was changed to a host material H-2 in the light emitting layer-forming coating liquids 1 to 3, light emitting layer-forming coating liquids 4 to 6 were prepared, respectively.

[Chem. 56]

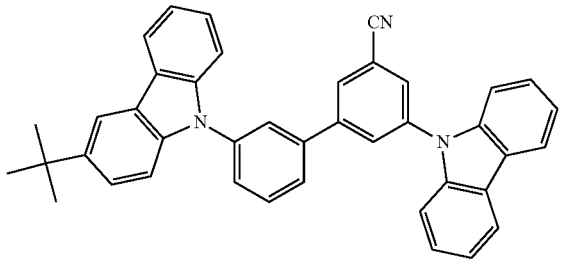

Host material PH-1

Furthermore, for a Comparative Example, in the same manner as for the light emitting layer-forming coating liquid 1, except that the light emitting material 1 was changed to a comparative compound 1 in the light emitting layer-forming coating liquid 1, a comparative light emitting layer-forming coating liquid 1 was prepared.

In addition, for a Comparative Example, in the same manner as for the light emitting layer-forming coating liquid 1, except that the light emitting material 1 was changed to a comparative compound 1 in the light emitting layer-forming coating liquid 4, a comparative light emitting layer-forming coating liquid 2 was prepared.

(Fabrication Procedure for Element)

—Fabrication of Organic Electroluminescent Element 6-1—

ITO was deposited on a 25 mm×25 mm×0.7 mm glass substrate to give a thickness of 150 nm, thereby forming a film, which was taken as a transparent supporting substrate. This transparent supporting substrate was etched and washed.

On this ITO glass substrate, 2 parts by mass of PTPDES-2 represented by the following structural formula (manufactured by Chemipro Kasei Kaisha, Ltd., Tg=205° C.) was dissolved in 98 parts by mass of cyclohexanone for the electronics industry (manufactured by Kanto Chemical Co., Inc.) and spin-coated (2,000 rpm for 20 seconds) to give a thickness of about 40 nm, and then dried at 120° C. for 30 minutes and subjected to an annealing treatment at 160° C. for 10 minutes to form a hole injecting layer.

[Chem. 57]

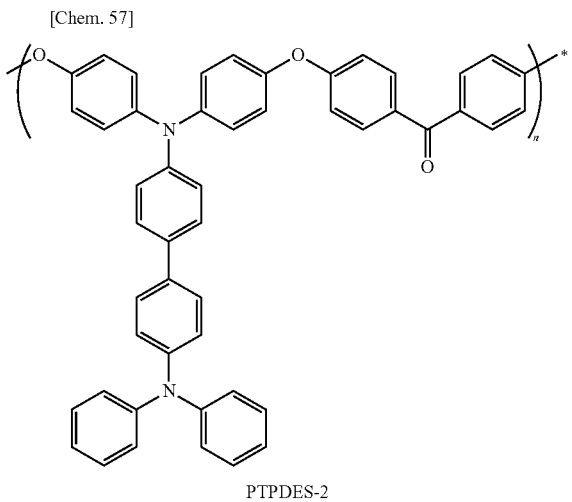

PTPDES-2

The light emitting layer-forming coating liquid 1 was spin-coated on the hole injecting layer (1,300 rpm for 30 seconds) to give a thickness of about 40 nm, thereby obtaining a light emitting layer.

Subsequently, BAlq (bis-(2-methyl-8-quinolinolato)-4-(phenylphenolato)-aluminum (III)) represented by the following structural formula was formed as an electron transporting layer on the light emitting layer to give a thickness of 40 nm by a vacuum deposition method.

[Chem. 58]

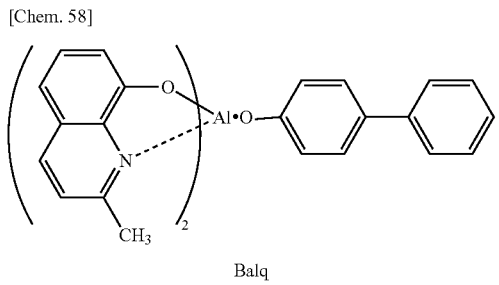

Balq

Lithium fluoride (LiF) was formed as an electron injecting layer on an electron transporting layer to give a thickness of 1 nm by a vacuum deposition method. Metal aluminum was further deposited to 70 nm thereon to from a cathode.

The laminate thus prepared was put into a glove box purged with an argon gas, and then sealed with a sealing can made of stainless steel and an ultraviolet-curable adhesive (XNR5516HV, manufactured by Nagase-Chiba, Ltd.) to fabricate an organic electroluminescent element 6-1.

In the same manner as for the organic electroluminescent element 6-1, except that the light emitting layer-forming coating liquid 1 was changed to light emitting layer-forming coating liquids 2 to 6, respectively, in the organic electroluminescent element 6-1, organic electroluminescent elements 6-2 to 6-6 were prepared, respectively.

Furthermore, for comparison, in the same manner as for the organic electroluminescent element 6-1, except that the light emitting layer-forming coating liquid 1 was changed to comparative light emitting layer-forming coating liquids 1 and 2, respectively, in the organic electroluminescent element 6-1, organic electroluminescent elements 6-7 and 6-8 were prepared, respectively.

For the organic electroluminescent elements 6-1 to 6-6 and the comparative elements 6-7 and 6-8 thus prepared, evaluations were carried out in the same manner as in Example 2. The results are shown in Table 8 below. Further, the external quantum efficiency in Table 8 below is shown as a relative value, taking the value of the organic electroluminescent element 6-1 using the light emitting material 1 as the same host as 1.0.

TABLE 8

| Element No. | Light emitting material | Host material | External quantum efficiency | Chromaticity | Note |
|---|---|---|---|---|---|
| Element 6-1 | 1 | PH-1 | 1.0 | A | The present invention |
| Element 6-2 | 13 | PH-1 | 0.9 | A | The present invention |
| Element 6-3 | 34 | PH-1 | 1.0 | A | The present invention |
| Comparative element 6-7 | Comparative compound 1 | PH-1 | 0.3 | B | Comparative Example |
| Element 6-4 | 1 | H-2 | 1.0 | A | The present invention |
| Element 6-5 | 13 | H-2 | 0.9 | A | The present invention |
| Element 6-6 | 34 | H-2 | 1.0 | A | The present invention |
| Comparative element 6-8 | Comparative compound 1 | H-2 | 0.3 | B | Comparative Example |

From Tables 3 to 8 above, it could be seen that the organic electroluminescent element of the present invention using the luminescent compound of the present invention has high luminous efficiency and excellent chromaticity.

Meanwhile, it could also be seen that the number of hydrogen atoms or deuterium atoms in $R^1$ to $R^{14}$ in the general formula (1) is 6, and each of the comparative elements using the comparative compound 1 described in JP-A-2005-82702, which has a number below the lower limit of the range in the present invention, has poor external quantum efficiency.

It could be seen that the number of hydrogen atoms or deuterium atoms in $R^1$ to $R^{14}$ in the general formula (1) is 14, and each of the comparative elements using the comparative compound 2 described in JP-A-05-2143334, which has a number above the upper limit of the range in the present invention has poor chromaticity.

It could be seen that the comparative element using the comparative compound 3 having no skeleton of the general formula (1) has poor chromaticity.

REFERENCE SIGNS LIST

2: Substrate
3: Anode
4: Hole Injecting Layer
5: Hole Transporting Layer
6: Light Emitting Layer
7: Hole Blocking Layer
8: Electron Transporting Layer
9: Cathode
10: Organic Electroluminescent Element
11: Organic Layer
12: Protective Layer
14: Adhesive Layer
16: Sealing Enclosure
20: Light Emitting Device
30: Light Scattering Member
31: Transparent Substrate
30A: Light Incident Surface
30B: Light Output Surface
32: Fine Particles
40: Illumination Device

The invention claimed is:

1. An organic electroluminescent element comprising:
a substrate;
a pair of electrodes including an anode and a cathode, disposed on the substrate; and
at least one organic layer including a light emitting layer, disposed between the electrodes,
wherein the light emitting layer contains a luminescent compound represented by the following general formula (1):

General Formula (1)

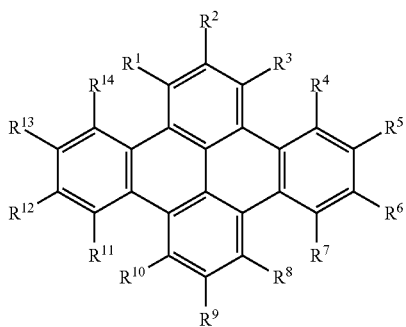

wherein $R^1$ to $R^{14}$ each independently represents a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring;
wherein at least one of $R^1$ to $R^{14}$ is an amino group, wherein the amino group is represented by $NR^{15}R^{16}$,
wherein $R^{15}$ and $R^{16}$ each independently represent an alkyl group, an aryl group, a heteroaryl group, or a hydrogen atom; and
wherein one of $R^{15}$ and $R^{16}$ is bonded to an adjacent $R^1$ to $R^{14}$ to form a ring which may be further substituted.

2. The organic electroluminescent element according to claim 1, wherein the ring formed by the amino group and the adjacent substituent forms a pyrrole skeleton which may be further substituted.

3. The organic electroluminescent element according to claim 1, wherein the luminescent compound represented by the general formula (1) is a luminescent compound represented by the following general formula (2):

General Formula (2)

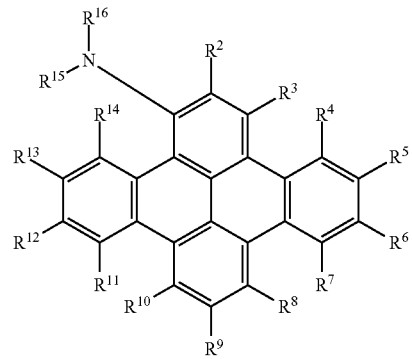

wherein $R^{15}$ and $R^{16}$ each independently represent an alkyl group, an aryl group, a heteroaryl group, or a hydrogen atom; wherein one of $R^{15}$ and $R^{16}$ is bonded to $R^2$ or $R^{14}$ to form a ring which may be further substituted.

4. The organic electroluminescent element according to claim 1, wherein the luminescent compound represented by the general formula (1) is a luminescent compound represented by the following general formula (3);

General Formula (3)

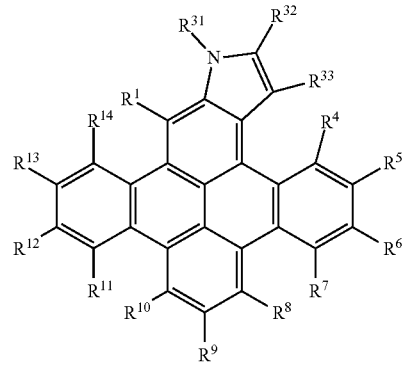

wherein $R^{31}$, $R^{32}$ and $R^{33}$ each independently represent an alkyl group, an aryl group, a heteroaryl group, or a hydrogen atom and at least two of $R^{31}$, $R^{32}$ and $R^{33}$ optionally combine to form an aryl group which may be further substituted.

5. The organic electroluminescent element according to claim 1, wherein the luminescent compound represented by the general formula (1) is a luminescent compound represented by the following general formula (7):

General Formula (7)

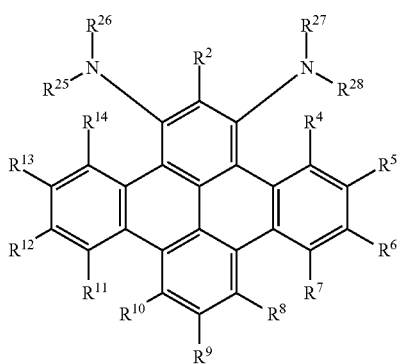

wherein $R^{25}$, $R^{26}$, $R^{27}$, and $R^{28}$ each independently represent an alkyl group, an aryl group, a heteroaryl group, or a hydrogen atom; and $R^{25}$ is bonded to $R^2$ or $R^{14}$ to form a ring which may be further substituted; or $R^{27}$ is bonded to $R^2$ or $R^4$ to form a ring which may be further substituted.

6. The organic electroluminescent element according to claim 1, wherein the light emitting layer contains an anthracene-based host material.

7. The organic electroluminescent element according to claim 1, wherein the light emitting layer is formed by a vacuum deposition process.

8. The organic electroluminescent element according to claim 1, wherein the light emitting layer is formed by a wet process.

9. A light emitting device using the organic electroluminescent element according to claim 1.

10. A display device using the organic electroluminescent element according to claim 1.

11. An illumination device using the organic electroluminescent element according to claim 1.

12. A light emitting material for an organic electroluminescent element, represented by the following general formula (1):

General Formula (1)

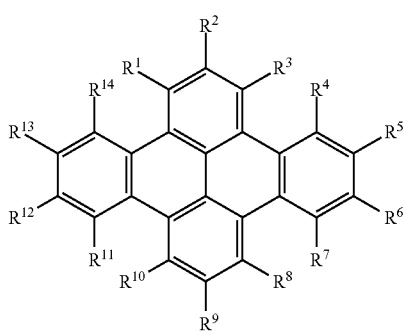

wherein $R^1$ to $R^{14}$ each independently represents a hydrogen atom, a deuterium atom, an alkyl group, an aryl group, a heteroaryl group, a fluorine atom, a cyano group, an amino group, an alkoxy group, an aryloxy group, a thio group, or a silyl group, and these may be bonded to each other to form a ring;

wherein 8 to 12 groups out of $R^1$ to $R^{14}$ each represents a hydrogen atom or a deuterium atom; and wherein at least one of $R^1$ to $R^{14}$ is an amino group, wherein the amino group is represented by $NR^{15}R^{16}$, wherein $R^{15}$ and $R^{16}$ each independently represent an alkyl group, an aryl group, a heteroaryl group, or a hydrogen atom; and wherein one of $R^{15}$ and $R^{16}$ is bonded to an adjacent $R^1$ to $R^{14}$ to form a ring which may be further substituted.

13. The organic electroluminescent element according to claim 1, wherein the ring formed by the amino group and the adjacent substituent forms a carbazole skeleton which may be further substituted.

14. The organic electroluminescent element according to claim 1, wherein the luminescent compound represented by the general formula (1) is a luminescent compound represented by the following general formula (4):

General Formula (4)

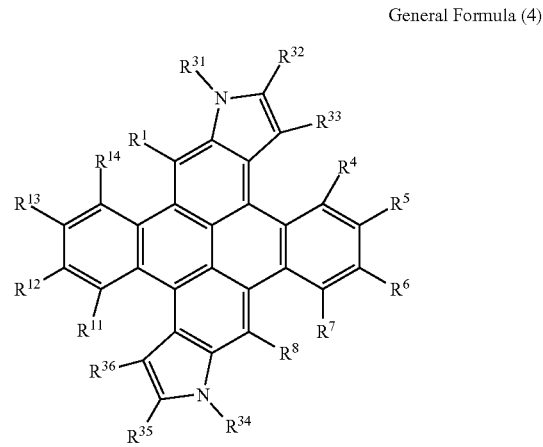

wherein $R^{31}$ to $R^{36}$ each independently represents an alkyl group, an aryl group, a heteroaryl group, or a hydrogen atom; and at least two of $R^{31}$, $R^{32}$ and $R^{33}$ optionally combine to form an aryl group which may be further substituted; and at least two of $R^{34}$, $R^{35}$ and $R^{36}$ optionally combine to form an aryl group which may be further substituted.

15. The organic electroluminescent element according to claim 1, wherein the luminescent compound represented by the general formula (1) is a luminescent compound represented by the following general formula (5):

General Formula (5)

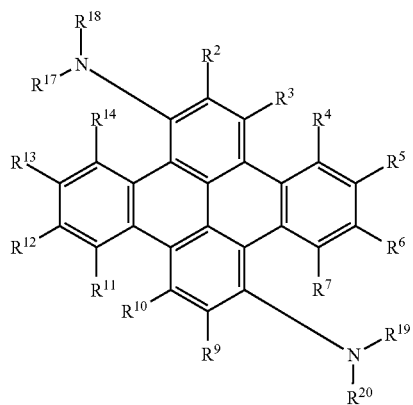

wherein $R^{17}$ to $R^{20}$ each independently represents an alkyl group, an aryl group, a heteroaryl group, or a hydrogen atom; and $R^{17}$ is bonded to $R^2$ or $R^{14}$ to form a ring which may be further substituted; or $R^{19}$ is bonded to $R^7$ or $R^9$ to form a ring which may be further substituted.

16. The organic electroluminescent element according to claim 1, wherein the luminescent compound represented by the general formula (1) is a luminescent compound represented by the following general formula (6):

General Formula (6)

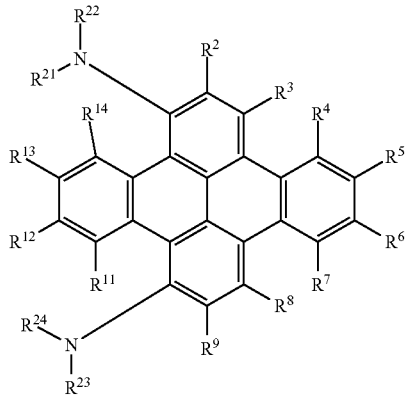

wherein $R^{21}$ to $R^{24}$ each independently represents an alkyl group, an aryl group, a heteroaryl group, or a hydrogen atom; and $R^{21}$ is bonded to $R^2$ or $R^{14}$ to form a ring which may be further substituted; or $R^{23}$ is bonded to $R^9$ or $R^{11}$ to form a ring which may be further substituted.

* * * * *